(12) United States Patent
Kobayashi et al.

(10) Patent No.: US 11,552,119 B2
(45) Date of Patent: Jan. 10, 2023

(54) SOLID-STATE IMAGING DEVICE AND ELECTRONIC EQUIPMENT

(71) Applicant: SONY SEMICONDUCTOR SOLUTIONS CORPORATION, Kanagawa (JP)

(72) Inventors: Yuuki Kobayashi, Kanagawa (JP); Atsushi Horiuchi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 173 days.

(21) Appl. No.: 16/758,039

(22) PCT Filed: Oct. 26, 2018

(86) PCT No.: PCT/JP2018/039812
§ 371 (c)(1),
(2) Date: Apr. 21, 2020

(87) PCT Pub. No.: WO2019/093149
PCT Pub. Date: May 16, 2019

(65) Prior Publication Data
US 2020/0321367 A1    Oct. 8, 2020

(30) Foreign Application Priority Data
Nov. 9, 2017  (JP) .............................. JP2017-216075

(51) Int. Cl.
*H01L 27/146* (2006.01)
(52) U.S. Cl.
CPC .... *H01L 27/1463* (2013.01); *H01L 27/14614* (2013.01); *H01L 27/14623* (2013.01); *H01L 27/14689* (2013.01); *H01L 27/14621* (2013.01)
(58) Field of Classification Search
None
See application file for complete search history.

(56) References Cited

U.S. PATENT DOCUMENTS

2010/0084695 A1* 4/2010 Park ................. H01L 27/14603
                                                          257/292
2014/0054662 A1    2/2014 Yanagita et al.
(Continued)

FOREIGN PATENT DOCUMENTS

CN    103403869 A    11/2013
CN    105405856 A     3/2016
(Continued)

OTHER PUBLICATIONS

International Search Report and Written Opinion of PCT Application No. PCT/JP2018/039812, dated Jan. 15, 2019, 10 pages of ISRWO.

*Primary Examiner* — Ali Naraghi
(74) *Attorney, Agent, or Firm* — Chip Law Group

(57) ABSTRACT

The present technology relates to a solid-state imaging device and electronic equipment to suppress degradation of Dark characteristics. A photoelectric converting unit configured to perform photoelectric conversion, and a PN junction region including a P-type region and an N-type region on a side of a light incident surface of the photoelectric converting unit are included. Further, on a vertical cross-section, the PN junction region is formed at three sides including a side of the light incident surface among four sides enclosing the photoelectric converting unit. Further, a trench which penetrates through a semiconductor substrate in a depth direction and which is formed between the photoelectric converting units each formed at adjacent pixels is included, and the PN junction region is also provided on a side wall of the trench. The present technology can be applied, for example, to a backside irradiation type CMOS image sensor.

15 Claims, 41 Drawing Sheets

(56) References Cited

U.S. PATENT DOCUMENTS

| | | | |
|---|---|---|---|
| 2015/0243700 A1* | 8/2015 | Morooka | H01L 27/14614 257/292 |
| 2016/0056200 A1* | 2/2016 | Lee | H01L 27/14603 257/292 |
| 2016/0112614 A1* | 4/2016 | Masuda | H04N 5/2254 348/374 |
| 2016/0211288 A1 | 7/2016 | Yanagita et al. | |
| 2016/0218138 A1 | 7/2016 | Oishi | |
| 2016/0336372 A1* | 11/2016 | Yanagita | H01L 27/1464 |
| 2017/0170217 A1 | 6/2017 | Yanagita et al. | |
| 2017/0271385 A1 | 9/2017 | Yanagita et al. | |
| 2017/0345853 A1* | 11/2017 | Kato | H04N 5/36961 |

FOREIGN PATENT DOCUMENTS

| | | |
|---|---|---|
| CN | 105826336 A | 8/2016 |
| CN | 107710414 A | 2/2018 |
| JP | 2013-098446 A | 5/2013 |
| JP | 2013-175494 A | 9/2013 |
| JP | 2015-162603 A | 9/2015 |
| JP | 2016-136584 A | 7/2016 |
| KR | 10-2014-0015326 A | 2/2014 |
| KR | 10-2016-0091244 A | 8/2016 |
| TW | 201630173 A | 8/2016 |
| WO | 2012/117931 A1 | 9/2012 |
| WO | 2013/065569 A1 | 5/2013 |
| WO | 2017/187957 A1 | 11/2017 |

\* cited by examiner

FIG. 27
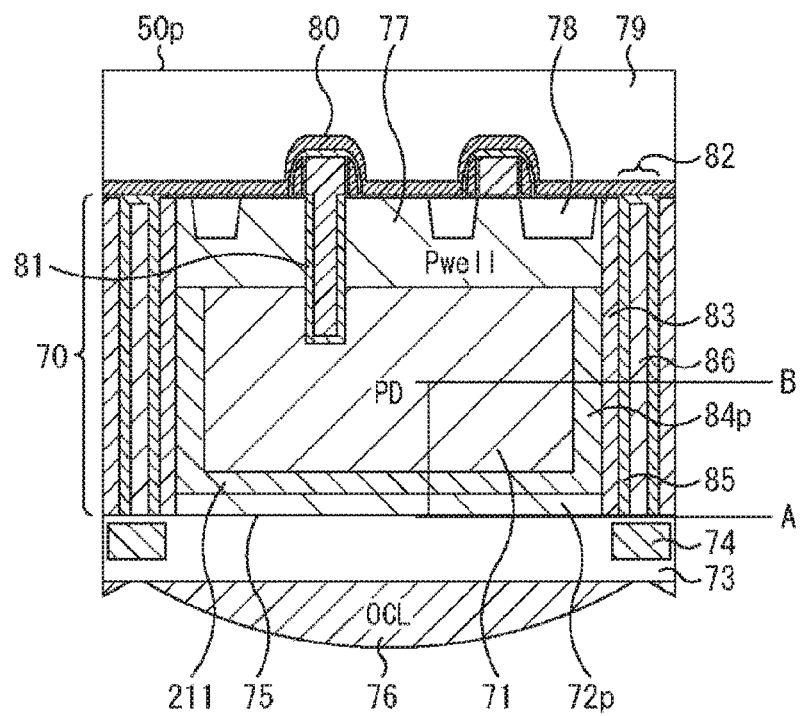
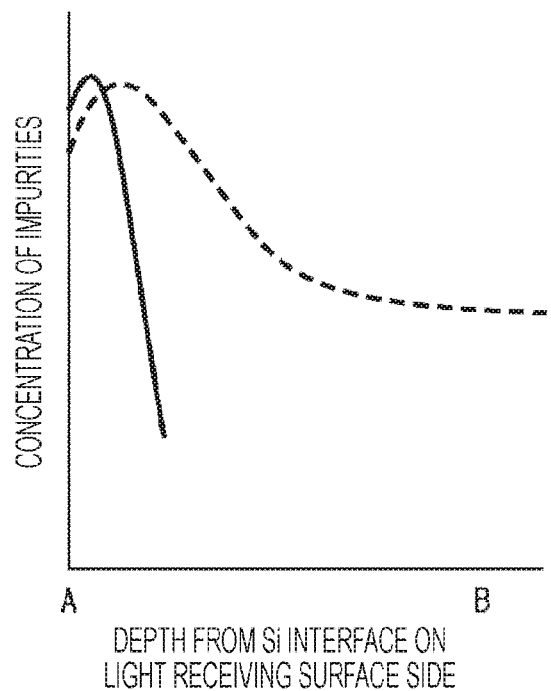

SOLID-STATE IMAGING DEVICE AND ELECTRONIC EQUIPMENT

CROSS REFERENCE TO RELATED APPLICATIONS

This application is a U.S. National Phase of International Patent Application No. PCT/JP2018/039812 filed on Oct. 26, 2018, which claims priority benefit of Japanese Patent Application No. JP 2017-216075 filed in the Japan Patent Office on Nov. 9, 2017. Each of the above-referenced applications is hereby incorporated herein by reference in its entirety.

TECHNICAL FIELD

The present technology relates to a solid-state imaging device and electronic equipment, and, particularly, relates to a solid-state imaging device which improves a saturated charge amount Qs of each pixel by forming a P-type solid-phase diffused layer and an N-type solid-phase diffused layer on a side wall of an inter-pixel light shielding wall which is formed between the respective pixels to form an intense electric field region, so that charges are held, and electronic equipment.

BACKGROUND ART

In related art, for the purpose of improving a saturated charge amount Qs of respective pixels of a solid-state imaging device, a technology of forming a P-type diffused layer and an N-type diffused layer on a side wall of a trench which is formed between the respective pixels to form an intense electric field region, so that charges are held, is known (see, for example, Patent Document 1).

CITATION LIST

Patent Document

Patent Document 1: Japanese Patent Application Laid-Open No. 2015-162603

SUMMARY OF THE INVENTION

Problems to be Solved by the Invention

However, with a structure disclosed in Patent Document 1, there has been a possibility that pinning on a light incident side of a silicon (Si) substrate is weakened, and the generated charges flow into a photodiode, which degrades Dark characteristics, and, for example, may generate white spots or may generate dark currents.

The present technology has been made in view of such circumstances, and is directed to being able to suppress degradation of Dark characteristics.

Solutions to Problems

According to an aspect of the present technology, there is provided a solid-state imaging device including a photoelectric converting unit configured to perform photoelectric conversion, and a PN junction region including a P-type region and an N-type region on a side of a light incident surface of the photoelectric converting unit.

According to an aspect of the present technology, there is provided electronic equipment on which a solid-state imaging device is mounted, in which the solid-state imaging device includes a photoelectric converting unit configured to perform photoelectric conversion, and a PN junction region including a P-type region and an N-type region on a side of a light incident surface of the photoelectric converting unit.

In the solid-state imaging device according to an aspect of the present technology, a photoelectric converting unit configured to perform photoelectric conversion, and a PN junction region including a P-type region and an N-type region on a side of a light incident surface of the photoelectric converting unit are included.

In electronic equipment according to one aspect of the present technology, the solid-state imaging device is mounted.

Effects of the Invention

According to the present technology, it is possible to suppress degradation of Dark characteristics.

Note that in this connection, the effects described here are not necessarily limited, and may be any of the effects described in the present disclosure.

BRIEF DESCRIPTION OF DRAWINGS

FIG. 27 is a view for explaining change in concentration of impurities.

MODE FOR CARRYING OUT THE INVENTION

A best mode for carrying out the present technology (hereinafter, referred to as an embodiment) will be described in detail below with reference to the drawings.

Because the present technology can be applied to an imaging device, description will be provided here using an example where the present technology is applied to an imaging device. Note that, while description will be provided here using an example of an imaging device, application of the present technology is not limited to application to an imaging device, and the present technology can be applied to general electronic equipment using an imaging device as an image capturing unit (photoelectric converting unit), such as an imaging device such as a digital still camera and a video camera, a mobile terminal device such as a mobile phone, which has an imaging function, and a copier using an imaging device as an image reading unit. Note that there is a case where a module-like form mounted on electronic equipment, that is, a camera module is used as an imaging device.

Figure 1:
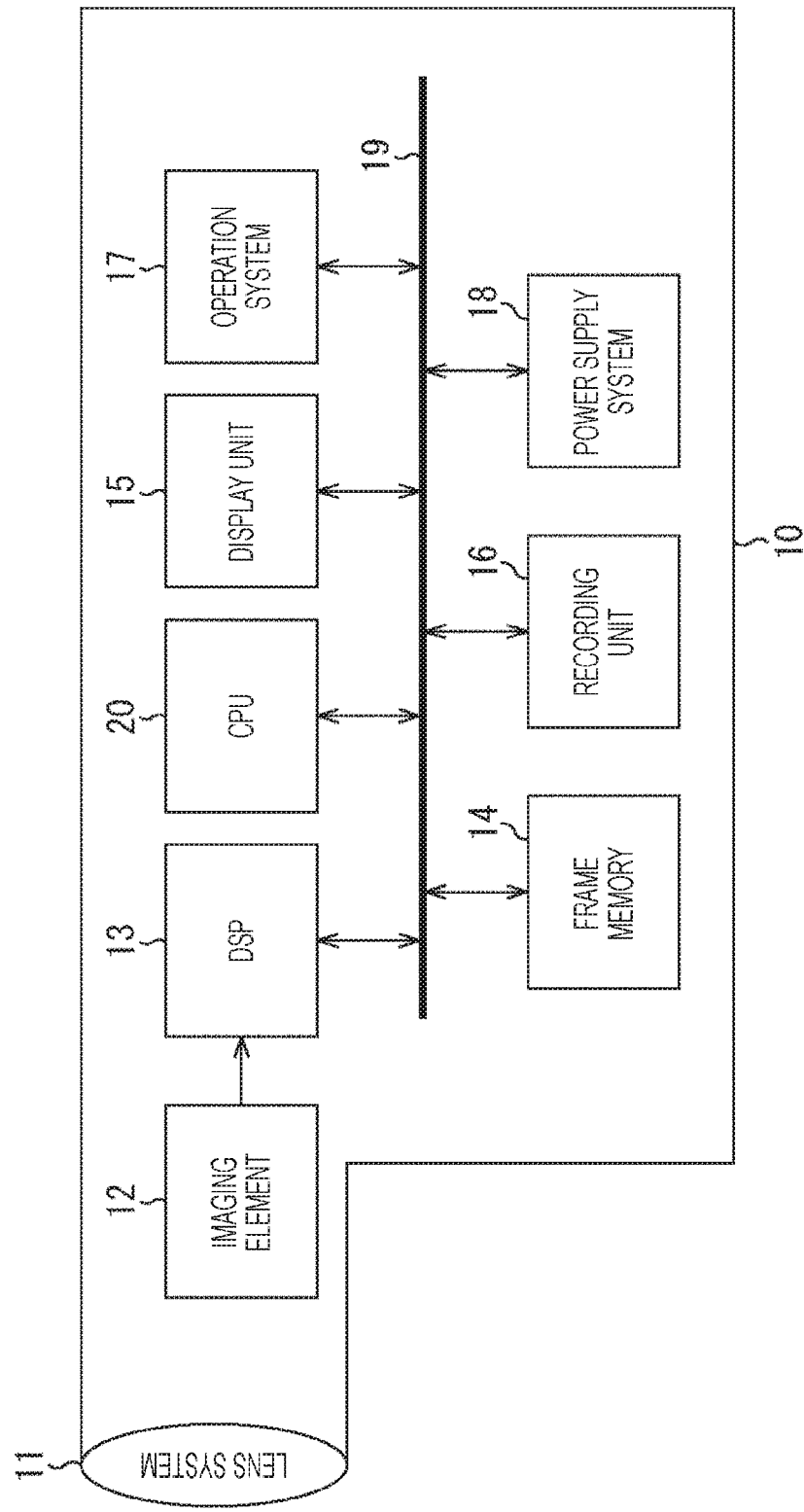
FIG. 1 is a view illustrating a configuration example of an imaging device.

FIG. 1 is a block diagram illustrating a configuration example of an imaging device which is an example of electronic equipment of the present disclosure. As illustrated in FIG. 1, an imaging device 10 includes an optical system including a lens group 11, or the like, an imaging element 12, a DSP circuit 13 which is a camera signal processing unit, a frame memory 14, a display unit 15, a recording unit 16, an operation system 17, a power supply system 18, or the like.

Further, the DSP circuit 13, the frame memory 14, the display unit 15, the recording unit 16, the operation system 17 and the power supply system 18 are connected to each other via a bus line 19. A CPU 20 controls respective units within the imaging device 10.

The lens group 11 captures incident light (image light) from a subject to form an image on an imaging surface of the imaging element 12. The imaging element 12 converts a light amount of the incident light of which image is formed on the imaging surface by the lens group 11 into an electric signal in units of pixel and outputs the electric signal as a pixel signal. As this imaging element 12, an imaging element (image sensor) including pixels which will be described below can be used.

The display unit 15 is formed with a panel-type display unit such as a liquid crystal display unit and an organic electro luminescence (EL) display unit, and displays a moving image or a still image captured at the imaging element 12. The recording unit 16 records the moving image or the still image captured at the imaging element 12 in a recording medium such as a video tape and a digital versatile disk (DVD).

The operation system 17 issues operation commands for various functions provided at the present imaging device under operation by a user. The power supply system 18 supplies various kinds of power supplies which become operation power supplies of the DSP circuit 13, the frame memory 14, the display unit 15, the recording unit 16 and the operation system 17 to these supply targets as appropriate.

<Configuration of Imaging Element>

Figure 2:
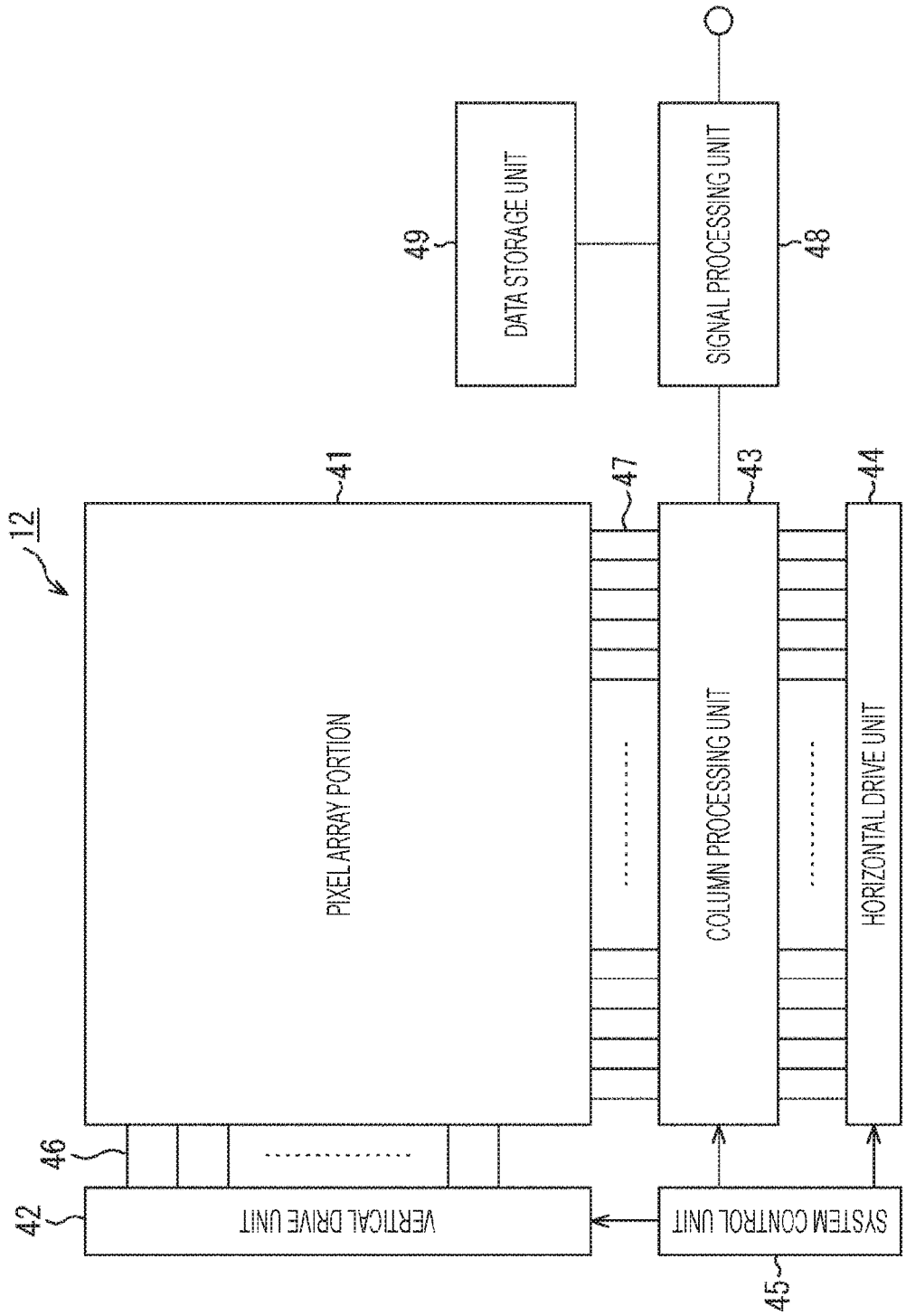
FIG. 2 is a view illustrating a configuration example of an imaging element.

FIG. 2 is a block diagram illustrating a configuration example of the imaging element 12. The imaging element 12 can be a complementary metal oxide semiconductor (CMOS) image sensor.

The imaging element 12 includes a pixel array portion 41, a vertical drive unit 42, a column processing unit 43, a horizontal drive unit 44 and a system control unit 45. The pixel array portion 41, the vertical drive unit 42, the column processing unit 43, the horizontal drive unit 44 and the system control unit 45 are formed on a semiconductor substrate (chip) which is not illustrated.

In the pixel array portion 41, unit pixels (for example, pixels 50 in FIG. 3) having photoelectric conversion elements in which photo-induced charges of a charge amount in accordance with an incident light amount are generated and accumulated inside are arranged in two dimensions in a matrix. Note that, in the following description, there is also a case where the photo-induced charges of the charge amount in accordance with the incident light amount will be simply referred to as "charges", and the unit pixels will be simply referred to as "pixels".

In the pixel array portion 41, further, pixel drive lines 46 are formed along a horizontal direction in the drawing (pixel arrangement direction of pixel rows) for each row of the pixel array in a matrix, and vertical signal lines 47 are formed along a vertical direction in the drawing (pixel arrangement direction of pixel columns) for each column. Respective one ends of the pixel drive lines 46 are connected to output terminals corresponding to the respective rows of the vertical drive unit 42.

The imaging element 12 further includes a signal processing unit 48 and a data storage unit 49. The signal processing unit 48 and the data storage unit 49 may be external signal processing units which are provided at a substrate different from the imaging element 12, for example, a digital signal processor (DSP) or a processing using software, or may be mounted on the same substrate as the imaging element 12.

The vertical drive unit 42 is a pixel drive unit which is constituted with a shift register, an address decoder, or the like, and which drives all pixels of the pixel array portion 41 at the same time or drives the pixels in units of row, or the like. While illustration of a specific configuration of the vertical drive unit 42 will be omitted, the vertical drive unit 42 has a configuration having a read scanning system, and a sweep scanning system or batch sweep and batch transmission.

The read scanning system sequentially selectively scans the unit pixels of the pixel array portion 41 in units of row to read out signals from the unit pixels. In a case of row driving (rolling shutter operation), sweep scanning is performed on a read row on which read scanning is to be performed by the read scanning system, ahead of the read scanning by a period corresponding to shutter speed. Further, in a case of global exposure (global shutter operation), batch sweep is performed ahead of batch transmission by a period corresponding to shutter speed.

By this sweep, unnecessary charges are swept (reset) from the photoelectric conversion elements in unit pixels of the read row. Then, by sweeping (reset) of unnecessary charges, so-called electronic shutter operation is performed. Here, the electronic shutter operation refers to operation of discarding photo-induced charges of the photoelectric conversion elements and starting new exposure (starting accumulation of photo-induced charges).

A signal read out by read operation by the read scanning system corresponds to an amount of light incident after the last read operation or the electronic shutter operation. In a case of row driving, a period from a read timing by the last read operation or a sweep timing by the electronic shutter operation until a read timing of read operation of this time becomes an accumulation period (exposure period) of photo-induced charges at the unit pixels. In a case of global exposure, a period from batch sweep until batch transmission becomes an accumulation period (exposure period).

A pixel signal output from each unit pixel of the pixel row which is selectively scanned by the vertical drive unit 42 is supplied to the column processing unit 43 through each vertical signal line 47. The column processing unit 43 performs predetermined signal processing on the pixel signal output from each unit pixel of the selected row through the vertical signal line 47 for each pixel column of the pixel array portion 41 and temporarily holds the pixel signal subjected to the signal processing.

Specifically, the column processing unit 43 performs at least noise removal processing, for example, correlated double sampling (CDS) processing as the signal processing. Through the correlated double sampling by this column processing unit 43, specific pattern noise specific to pixels, such as reset noise and threshold variation of an amplifier transistor is removed. Note that it is also possible to provide, for example, an analog-digital (AD) conversion function other than the noise removal processing, to the column processing unit 43 and output a signal level using a digital signal.

The horizontal drive unit 44 is constituted with a shift register, an address decoder, or the like, and sequentially selects a unit circuit corresponding to the pixel column of the column processing unit 43. By selective scanning by this horizontal drive unit 44, the pixel signals subjected to the signal processing at the column processing unit 43 are sequentially output to the signal processing unit 48.

The system control unit 45 is constituted with a timing generator, or the like, which generates various kinds of timing signals, and controls drive of the vertical drive unit 42, the column processing unit 43, the horizontal drive unit 44, or the like, on the basis of the various kinds of timing signals generated at the timing generator.

The signal processing unit 48 has at least an addition processing function and performs various kinds of signal processing such as addition processing on the pixel signals output from the column processing unit 43. The data storage unit 49 temporarily stores data necessary for processing for the signal processing at the signal processing unit 48.

<Structure of Unit Pixel>

Next, a specific structure of the unit pixels 50 arranged in a matrix in the pixel array portion 41 will be described. According to the pixels 50 which will be described below, it is possible to reduce a possibility that Dark characteristics degrade, and, for example, white spots or dark currents are generated as a result of pinning on a light incident side of a silicon (Si) substrate (in FIG. 3, an Si substrate 70) being weakened, and the generated charges flowing into a photodiode (in FIG. 3, a PD 71).

Configuration Example of Pixels in First Embodiment

Figure 3:
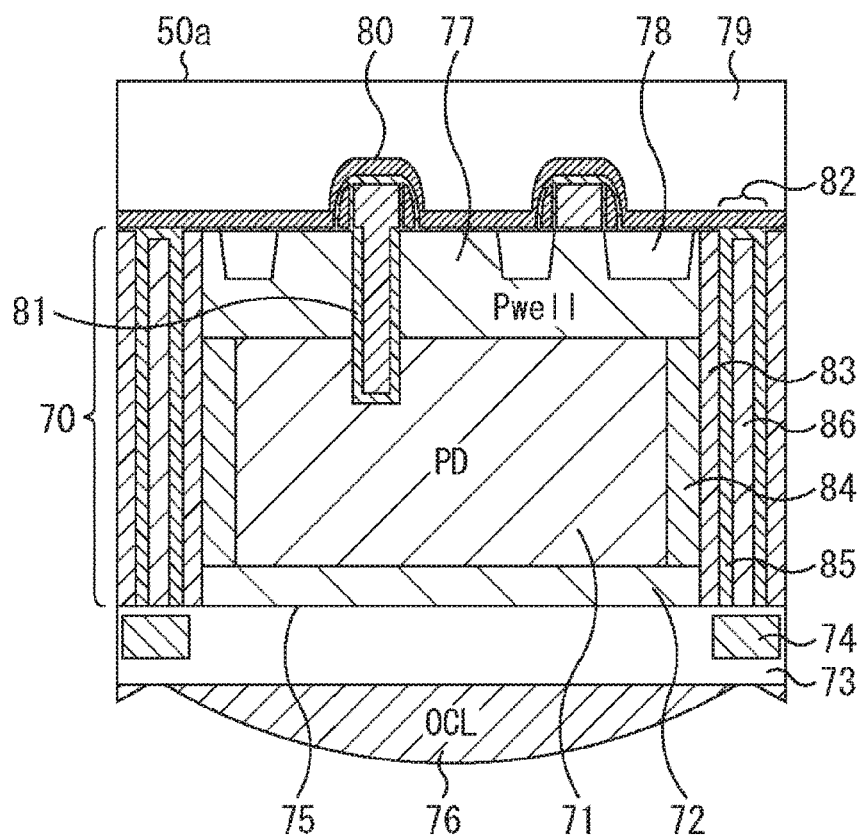
FIG. 3 is a vertical cross-sectional diagram illustrating a first configuration example of a pixel to which the present technology is applied.
Figure 4:
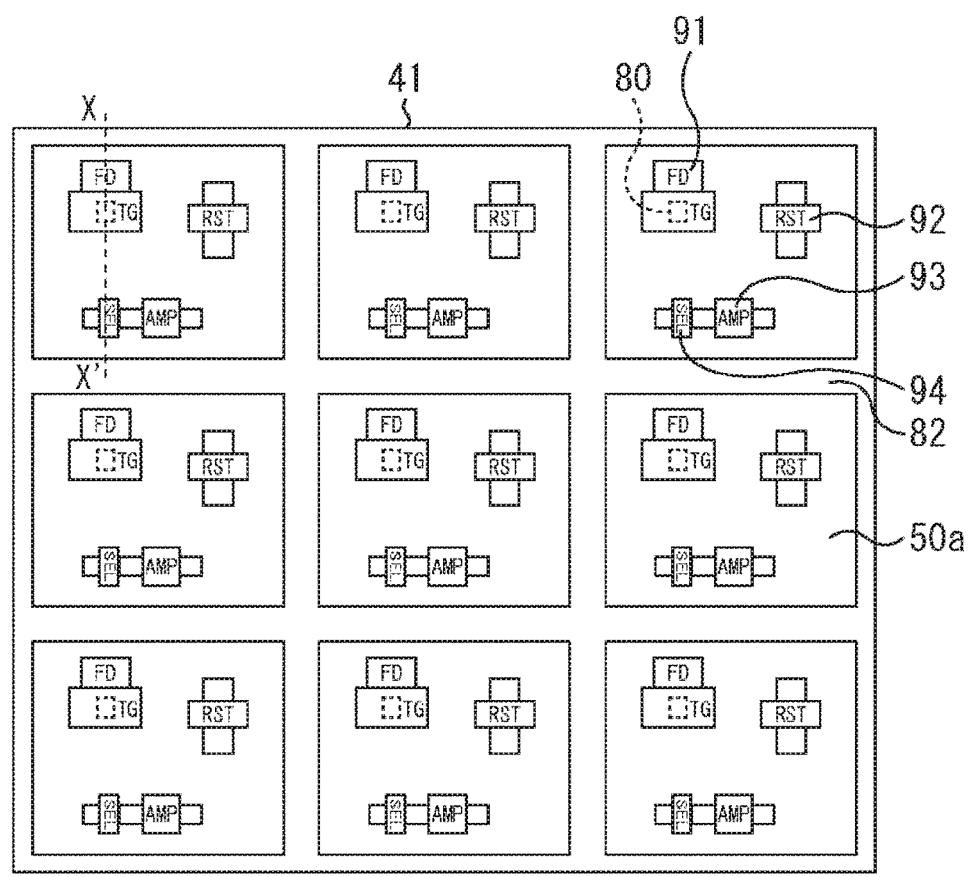
FIG. 4 is a plan view of the pixel to which the present technology is applied, on a surface side in a first embodiment.

FIG. 3 is a vertical cross-sectional diagram of a pixel 50a in a first embodiment of the pixels 50 to which the present technology is applied. FIG. 4 is a plan view of the pixel 50a on a surface side. Note that FIG. 3 corresponds to a position of a line X-X' in FIG. 4.

While description will be provided using an example in a case where the pixel 50 which will be described below is a backside irradiation type pixels, the present technology can be also applied to a surface irradiation type pixel.

The pixel 50 illustrated in FIG. 3 includes a photodiode (PD) 71 which is a photoelectric conversion element of each pixel formed inside the Si substrate 70. On a light incident side (in the drawing, a lower side and a backside) of the PD 71, a P-type region 72 is formed, and in a further lower layer of the P-type region 72, a planarization film 73 is formed. A boundary between this P-type region 72 and the planarization film 73 is set as a backside Si interface 75.

A light shielding film 74 is formed on the planarization film 73. The light shielding film 74 is provided to prevent leakage of light to adjacent pixels, and is formed between adjacent PDs 71. The light shielding film 74 is formed with a metal material such as, for example, tungsten (W).

On the planarization film 73 and on a backside of the Si substrate 70, an on-chip lens (OCL) 76 for collecting the incident light at the PD 71 is formed. The OCL 76 can be formed with an inorganic material, and, for example, SiN, SiO, SiOxNy (where 0<x≤1, and 0<y≤1) can be used.

While not illustrated in FIG. 3, it is also possible to employ a configuration where a transparent plate such as cover glass and a resin adheres on the OCL 76. Further, while not illustrated in FIG. 3, it is also possible to employ a configuration where a color filter layer is formed between the OCL 76 and the planarization film 73. Further, it is also possible to employ a configuration where, in the color filter layer, a plurality of color filters is provided for each pixel, and color of the respective color filters is arranged, for example, in accordance with a Bayer array.

An active region (Pwell) 77 is formed on an opposite side (in the drawing, in an upper part, and on a surface side) of the light incident side of the PD 71. In the active region 77, an element isolation region (hereinafter, referred to as a shallow trench isolation (STI)) 78 which isolates pixel transistors, or the like, is formed.

On the surface side (upper side in the drawing) of the Si substrate 70, and in the active region 77, a wiring layer 79 is formed, and a plurality of transistors is formed on this wiring layer 79. FIG. 3 illustrates an example where a transfer transistor 80 is formed. The transfer transistor (gate) 80 is formed with a vertical transistor. That is, in the transfer transistor (gate) 80, a vertical transistor trench 81 is open, and a transfer gate (TG) 80 for reading out charges from the PD 71 is formed at the opening.

Further, pixel transistors such as an amplifier (AMP) transistor, a select (SEL) transistor and a reset (RST) transistor are formed on the surface side of the Si substrate 70. Arrangement of these transistors will be described with reference to FIG. 4, and operation will be described with reference to a circuit diagram in FIG. 5.

A trench is formed between the pixels 50a. This trench will be described as a deep trench isolation (DTI) 82. This DTI 82 is formed between adjacent pixels 50a in a shape which penetrates the Si substrate 70 in a depth direction (in the drawing, in a vertical direction, and a direction from a surface to a backside). Further, the DTI 82 also functions as a light shielding wall between pixels so that unnecessary light does not leak to the adjacent pixels 50a.

The P-type solid-phase diffused layer 83 and the N-type solid-phase diffused layer 84 are sequentially formed from the DTI 82 side to the PD 71 between the PD 71 and the DTI 82. The P-type solid-phase diffused layer 83 is formed until it contacts the backside Si interface 75 of the Si substrate 70 along the DTI 82. The N-type solid-phase diffused layer 84 is formed until it contacts the P-type region 72 of the Si substrate 70 along the DTI 82.

Note that, while the solid-phase diffused layer indicates a layer where a P-type layer and an N-type layer are formed through impurity doping using a manufacturing method which will be described later, in the present technology, the manufacturing method is not limited to solid-phase diffusion, and a P-type layer and an N-type layer generated using another manufacturing method such as ion implantation may be respectively provided between the DTI 82 and the PD 71. Further, the PD 71 in the embodiment is constituted in the N-type region. Photoelectric conversion is performed in part or all of the N-type region.

While the P-type solid-phase diffused layer 83 is formed until it contacts the backside Si interface 75, the N-type solid-phase diffused layer 84 does not contact the backside Si interface 75, and a gap is provided between the N-type solid-phase diffused layer 84 and the backside Si interface 75.

According to such a configuration, a PN junction region of the P-type solid-phase diffused layer 83 and the N-type solid-phase diffused layer 84 forms an intense electric field region, so that charges generated at the PD 71 are held. According to such a configuration, the P-type solid-phase diffused layer 83 and the N-type solid-phase diffused layer 84 which are formed along the DTI 82 form an intense electric field region, so that charges generated at the PD 71 can be held.

In a case where the N-type solid-phase diffused layer 84 is formed until it contacts the backside Si interface 75 of the Si substrate 70 along the DTI 82, because pinning of charges is weakened at a portion where the backside Si interface 75 of the Si substrate 70 which is a light incident surface side contacts the N-type solid-phase diffused layer 84, there is a possibility that Dark characteristics degrade as a result of the generated charges flowing into the PD 71, and, for example, white spots are generated, or dark currents are generated.

However, in the pixel 50a illustrated in FIG. 3, a configuration is employed where the N-type solid-phase diffused layer 84 does not contact the backside Si interface 75 of the Si substrate 70, and the N-type solid-state diffused layer 84 is formed so as to contact the P-type region 72 of the Si substrate 70 along the DTI 82. With such a configuration, it is possible to prevent pinning of charges from being weakened, so that it is possible to prevent degradation of Dark characteristics as a result of the charges flowing into the PD 71.

Further, in the pixel 50a illustrated in FIG. 3, a side wall film 85 formed with SiO2 is formed on an inner wall of the DTI 82, and a filling material 86 formed with polysilicon is embedded inside the side wall film 85.

The pixel 50a in the first embodiment has a configuration where the P-type region 72 is provided on the backside, and the PD 71 and the N-type solid-phase diffused layer 84 do not exist around the backside Si interface 75. By this means, because pinning is not weakened around the backside Si interface 75, it is possible to prevent degradation of the Dark characteristics as a result of the generated charges flowing into the PD 71.

Note that, concerning the DTI 82, it is also possible to employ SiN in place of SiO2 employed for the side wall film 85. Further, it is also possible to use doping polysilicon in place of polysilicon employed for the filling material 86. In a case where doping polysilicon is filled, or in a case where after polysilicon is filled, N-type impurities or P-type impurities are doped, if negative bias is applied to the portion, because it is possible to strengthen pinning of the side wall of the DTI 82, it is possible to further improve the Dark characteristics.

Figure 5:
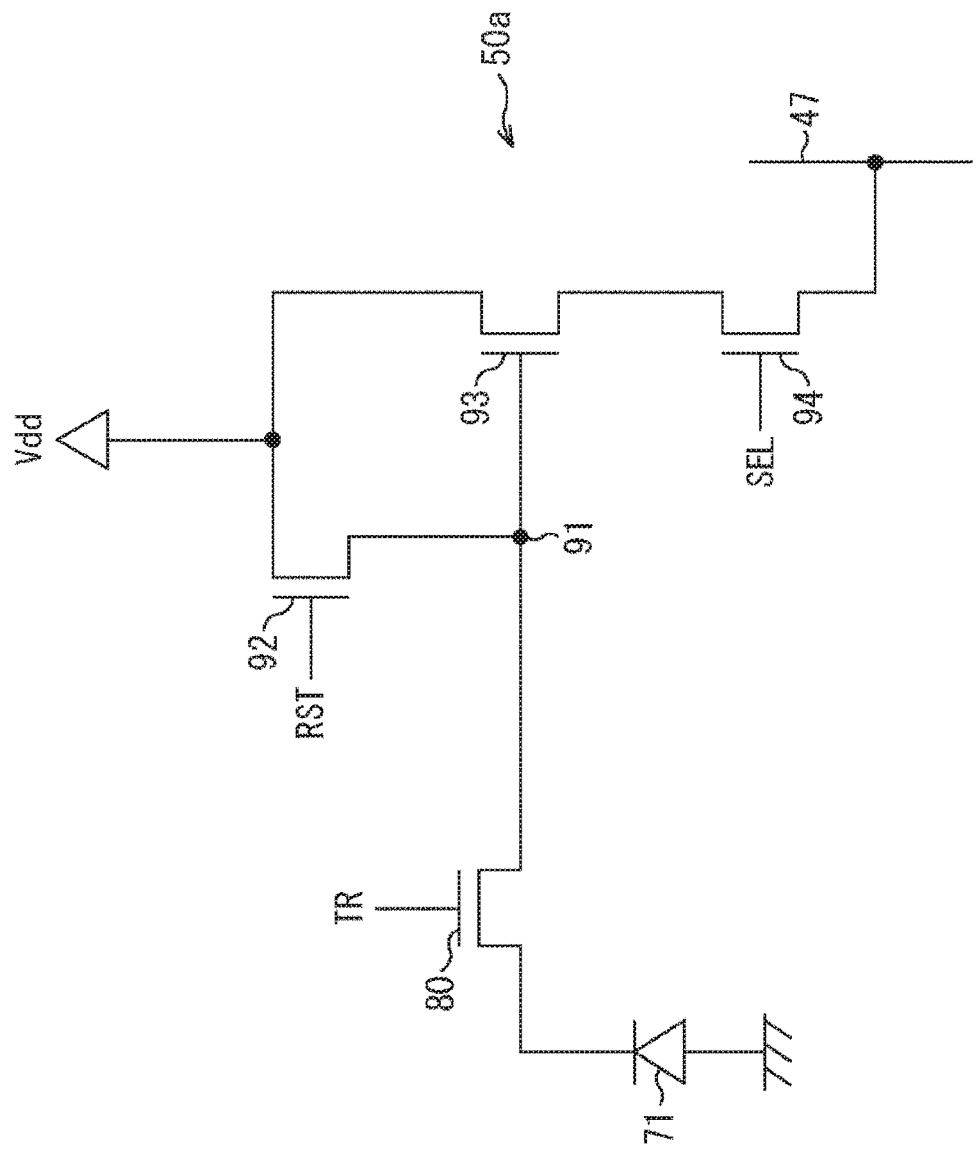
FIG. 5 is a circuit diagram of the pixel.

Arrangement of the transistors formed at the pixel 50a and operation of each transistor will be described with reference to FIG. 4 and FIG. 5. FIG. 4 is a plan view of nine pixels 50a of 3×3 arranged in the pixel array portion 41 (FIG. 2), seen from the surface side (in FIG. 3, an upper side in the drawing), and FIG. 5 is a circuit diagram for explaining connection relationship of the respective transistors illustrated in FIG. 4.

In FIG. 4, one rectangle indicates one pixel 50a. As illustrated in FIG. 4, the DTI 82 is formed so as to enclose the pixel 50a (the PD 71 included in the pixel 50a). Further, the transfer transistor (gate) 80, a floating diffusion (FD) 91, a reset transistor 92, an amplifier transistor 93, and a select transistor 94 are formed on the surface side of the pixel 50a.

The PD 71 generates and accumulates charges (signal charges) in accordance with a received light amount. An anode terminal of the PD 71 is grounded, and a cathode terminal of the PD 71 is connected to the FD 91 via the transfer transistor 80.

When the transfer transistor 80 is powered on by a transfer signal TR, the transfer transistor 80 reads out the charges generated at the PD 71 and transfers the charges to the FD 91.

The FD 91 holds the charges read out from the PD 71. When the reset transistor 92 is powered on by a reset signal RST, the reset transistor 92 resets a potential of the FD 91 as a result of the charges accumulated in the FD 91 being discharged to a drain (constant voltage source Vdd).

The amplifier transistor 93 outputs a pixel signal in accordance with the potential of the FD 91. That is, the amplifier transistor 93 constitutes a negative MOS (not illustrated) as a constant current source connected via a vertical signal line 33, and a source follower circuit, and a pixel signal indicating a level in accordance with the charges accumulated in the FD 91 is output from the amplifier transistor 93 to the column processing unit 43 (FIG. 2) via the select transistor 94 and the vertical signal line 47.

The select transistor 94 is powered on when a pixel 31 is selected by a select signal SEL, and outputs a pixel signal of the pixel 31 to the column processing unit 43 via the vertical signal line 33. The respective signal lines through which the transfer signal TR, the select signal SEL and the reset signal RST are transmitted correspond to the pixel drive lines 46 in FIG. 2.

While the pixel 50a can be constituted as described above, the configuration of the pixel 50a is not limited to this configuration, and it is also possible to employ other configurations.

<Manufacturing method of periphery of DTI 82>

Figure 6:
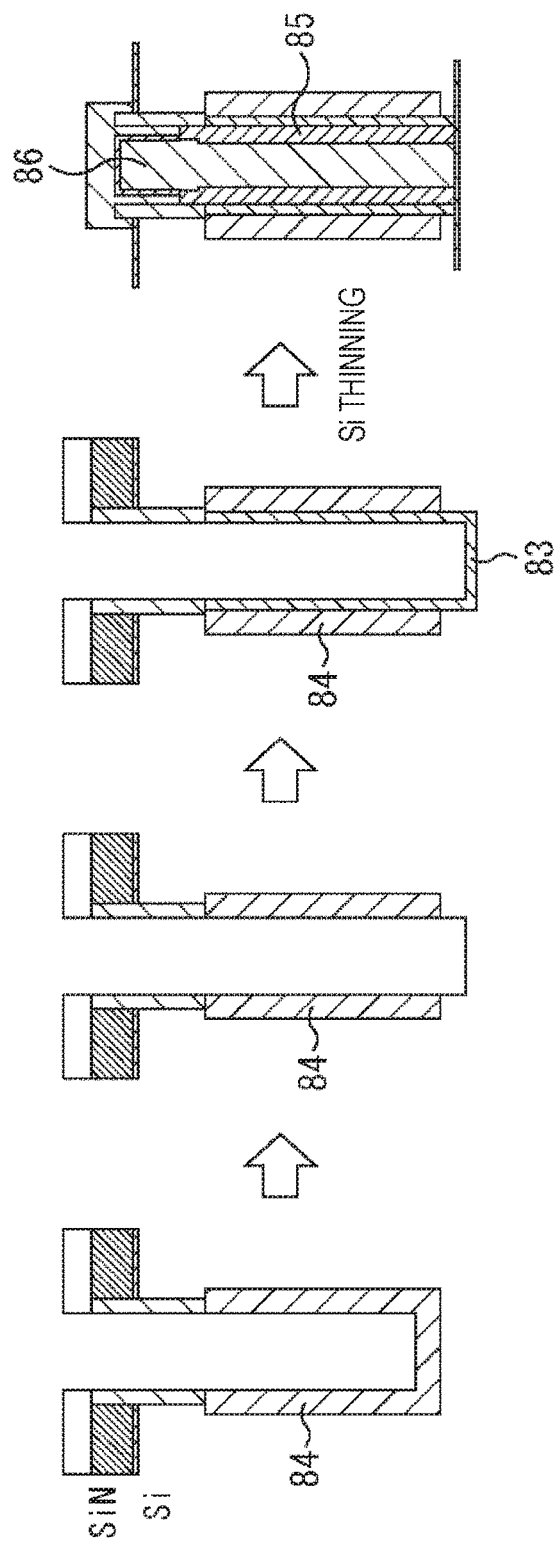
FIGS. 6A, 6B, 6C, and 6D are views for explaining a method for manufacturing a periphery of a DTI 82.

FIGS. 6A and 6B are views for explaining a manufacturing method of a periphery of the DTI 82.

When the DTI 82 is open on the Si substrate 70, as illustrated in FIG. 6A, a portion other than a position where the DTI 82 is to be formed on the Si substrate 70 is covered with a hard mask using SiN and SiO2, and a groove is open through dry etching in a vertical direction to a predetermined depth of the Si substrate 70 at a portion which is not covered with the hard mask.

Then, an SiO2 film including P (phosphorous) which is an N-type impurity is formed on an inner side of the open groove, and heat treatment is performed so that P (phosphorous) is doped (hereinafter, referred to as solid-phase diffused) on the Si substrate 70 side from the SiO2 film.

Then, as illustrated in FIG. 6B, after the SiO2 film including P, formed on the inner side of the open groove is removed, by heat treatment being performed again so that P (phosphorous) is diffused to inside of the Si substrate 70, the N-type solid-phase diffused layer 84 which is self-aligned in a current groove shape is formed. Thereafter, the groove extends in a depth direction by a bottom portion of the groove being etched through dry etching.

Then, as illustrated in FIG. 6C, after an SiO2 film including B (boron) which is a P-type impurity is formed on an inner side of the extending groove, by heat treatment being performed so that B (boron) being solid-phase diffused on the Si substrate 70 side from the SiO2 film, the P-type solid-phase diffused layer 83 which is self-aligned in an extending groove shape is formed.

Thereafter, the SiO2 film including B (Boron), formed on an inner wall of the groove is removed.

Then, as illustrated in FIG. 6D, the side wall film 85 formed with SiO2 is formed on the inner wall of the open groove, and the groove is filled with polysilicon to form the DTI 82. Thereafter, pixel transistors and wirings are formed. Thereafter, the Si substrate 70 is made thinner from the backside. When the Si substrate 70 is made thinner, the bottom portion of the DTI 82 including the P-type solid-phase diffused layer 83 is also made thinner at the same time. The Si substrate 70 and the bottom portion of the DTI 82 are made thinner to a depth which does not reach the N-type solid-phase diffused layer 84.

Through the above-described process, an intense electric field region including the N-type solid-phase diffused layer 84 which does not contact the backside Si interface 75 and the P-type solid-phase diffused layer 83 which contacts the backside Si interface 75 can be formed adjacent to the PD 71.

Second Embodiment

Figure 7:
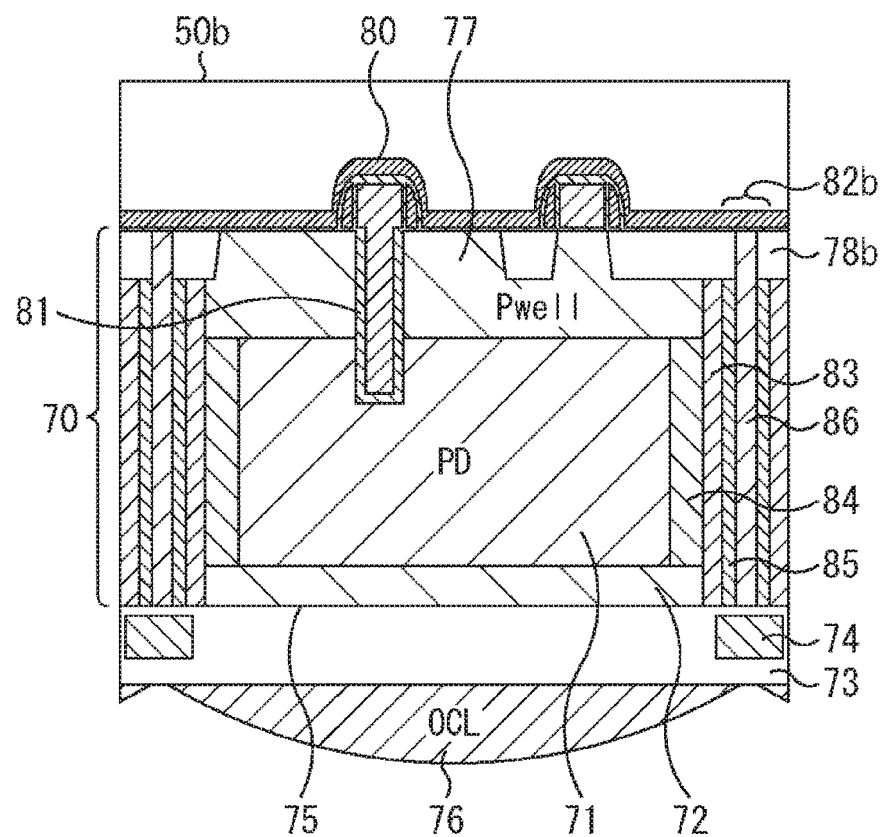
FIG. 7 is a vertical cross-sectional diagram illustrating a second configuration example of the pixel to which the present technology is applied.

FIG. 7 is a vertical cross-sectional diagram of a pixel 50b in a second embodiment to which the present technology is applied.

The second embodiment is different from the first embodiment in that the DTI 82 is formed at an STI 78, and, because other configurations are similar to those in the first embodiment, the same reference numerals will be assigned to similar portions, and description will be omitted as appropriate. Also in the following description of the pixel 50, the same reference numerals will be assigned to portions which are the same as portions of the pixel 50b in the first embodiment, and description thereof will be omitted as appropriate.

In the pixel 50b illustrated in FIG. 7, an STI 78b which is formed in the active region 77 is formed to a portion where a DTI 82b is to be formed (formed to an end portion of the pixel 50b). Then, the DTI 82b is formed at a lower portion of the STI 78b.

In other words, the STI 78b is formed at a portion where the DTI 82b is formed, and the STI 78b and the DTI 82b are formed so that the STI 78b contacts the DTI 82b.

According to such formation, it is possible to make the pixel 50b smaller than in a case where the STI 78b and the DTI 82b are formed at different positions (for example, the pixel 50a in the first embodiment (FIG. 3)).

Further, also with the pixel 50b in the second embodiment, it is possible to obtain effects similar to those obtained with the pixel 50a in the first embodiment, that is, effects of being able to prevent degradation of the Dark characteristics.

Third Embodiment

Figure 8:
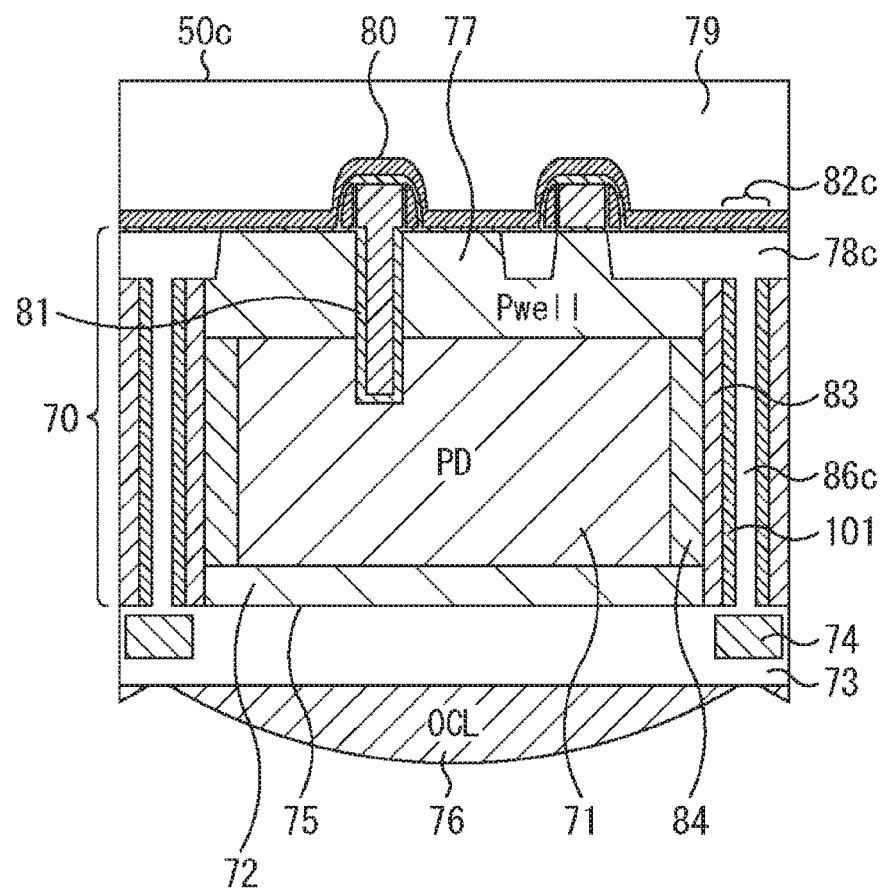
FIG. 8 is a vertical cross-sectional diagram illustrating a third configuration example of the pixel to which the present technology is applied.

FIG. 8 is a vertical cross-sectional diagram of a pixel 50c in a third embodiment to which the present technology is applied.

A third embodiment is different from the pixel 50a and the pixel 50b in the first and the second embodiments in that a film 101 having a negative fixed charge is formed on a side wall of a DTI 82c, and the inner side of the film 101 is filled with SiO2 as a filler 86c.

While, in the pixel 50a in the first embodiment, the side wall film 85 of SiO2 is formed on the side wall of the DTI 82, and a portion is filled with polysilicon, in the pixel 50c in the third embodiment, the film 101 having a negative fixed charge is formed on the side wall of the DTI 82c, and the inner side of the film 101 is filled with SiO2.

The film 101 having a negative fixed charge, formed on the side wall of the DTI 82c can be formed with, for example, a hafnium oxide (HfO2) film, an aluminum oxide (Al2O3) film, a zirconium oxide (ZrO2) film, a tantalum oxide (Ta2O5) film or a titanium oxide (TiO2) film. Because the above-described types of films have a record of use in a gate insulating film, or the like, of an insulating gate type field effect transistor, and its film formation method has been established, it is possible to easily form a film.

While examples of the film formation method can include, for example, a chemical vapor deposition method, a sputtering method, an atomic layer deposition method, or the like, the atomic layer deposition method is preferable, because it is possible to form an SiO2 layer of approximately 1 nm at the same time while reducing an interface state during film formation.

Further, other than the above-described materials, examples of the material can include lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), erbium oxide (Er2O3), thulium oxide (Tm2O3), ytterbium oxide (Yb2O3), lutetium oxide (Lu2O3), yttrium oxide (Y2O3), or the like.

Further, the above-described film 101 having a negative fixed charge can be formed with a hafnium nitride film, an aluminum nitride film, a hafnium oxynitride film or an aluminum oxynitride film.

To the above-described film 101 having a negative fixed charge, silicon (Si) or nitride (N) may be added within a range which does not impair insulation properties. Concentration of them is determined as appropriate within a range which does not impair insulation properties of the film. However, to prevent image defects such as white spots, it is preferable that the above-described additives such as silicon and nitride are added on a surface of the above-described film 101 having a negative fixed charge, that is, a surface opposite to the above-described PD 71 side. In this manner, by silicon (Si) or nitride (N) being added, it is possible to improve heat resistance of the film and capability of blocking ion implantation during a process.

In the third embodiment, it is possible to strengthen pinning of the trench side wall of the DTI 82. Therefore, for example, when the pixel 50c in the third embodiment is compared with the pixel 50a in the first embodiment, according to the pixel 50c, it is possible to reliably prevent degradation of the Dark characteristics.

To form the DTI 82 in the third embodiment, it is only necessary to remove the filler 86 (polysilicon) and the side wall film 85 (SiO2) inside the groove through photoresist and wet etching after the backside is polished until the polysilicon as the filler 86 is exposed from the state illustrated in FIG. 6D, and form the film 101 and fill the groove with SiO2.

Note that it is also possible to fill inside of the groove with W (tungsten), or the like, in place of the SiO2 as the filling material. In this case, because light transmission at the DTI 82 with respect to incident light from an oblique direction is suppressed, it is possible to improve color mixture.

Fourth Embodiment

Figure 9:
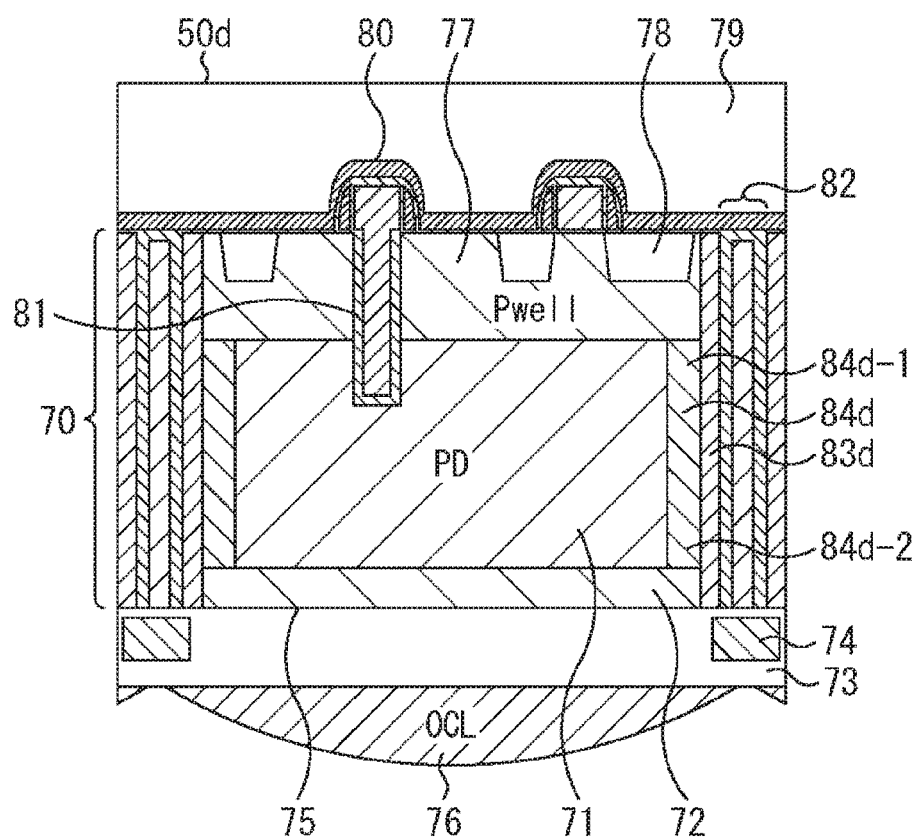
FIG. 9 is a vertical cross-sectional diagram illustrating a fourth configuration example of the pixel to which the present technology is applied.

FIG. 9 is a vertical cross-sectional diagram of a pixel 50d in a fourth embodiment to which the present technology is applied.

A fourth embodiment is different from the pixel 50a in the first embodiment in that a N-type solid-phase diffused layer 84d formed along the DTI 82 has a concentration gradient in the depth direction of the Si substrate 70, and other configurations are similar to those of the pixel 50a in the first embodiment.

While the concentration of the N-type impurities of the N-type solid-phase diffused layer 84 of the pixel 50a in the first embodiment is constant regardless of the depth direction, the concentration of the N-type impurities of the N-type solid-phase diffused layer 84d of the pixel 50d in the fourth embodiment is different depending on the depth direction.

That is, the N-type impurities of an N-type solid-phase diffused layer 84d-1 which is closer to the surface side of the N-type solid-phase diffused layer 84d of the pixel 50d are formed to have higher concentration, while the N-type impurities of an N-type solid-phase diffused layer 84d-2 which is closer to the backside are formed to have lower concentration.

In the pixel 50d in the fourth embodiment, as well as effects similar to those of the pixel 50a in the first embodiment can be obtained, it is also possible to obtain a new effect that charges can be easily read out as a result of a potential on the backside becoming shallow by a concentration gradient being provided to the N-type solid-phase diffused layer 84d.

To provide a concentration gradient at the N-type solid-phase diffused layer 84d, for example, because an etching damage occurs on a side wall of a groove when the groove of the DTI 82 is open, it is possible to utilize a difference in a solid-phase diffused doping amount by an amount of the damage.

Note that, instead of providing a concentration gradient at the N-type solid-phase diffused layer 84d, it is also possible to make the concentration of P-type impurities of a P-type solid-phase diffused layer 83d which is closer to the surface side lower, so that the concentration of the P-type impurities of the P-type solid-phase diffused layer 83d which is closer to the backside becomes higher. Also in this case, it is possible to obtain effects similar to those obtained in a case where the concentration gradient is provided at the N-type solid-phase diffused layer 84d.

Further, it is also possible to provide respective concentration gradients at both the N-type solid-phase diffused layer 84d and the P-type solid-phase diffused layer 83d.

Fifth Embodiment

Figure 10:
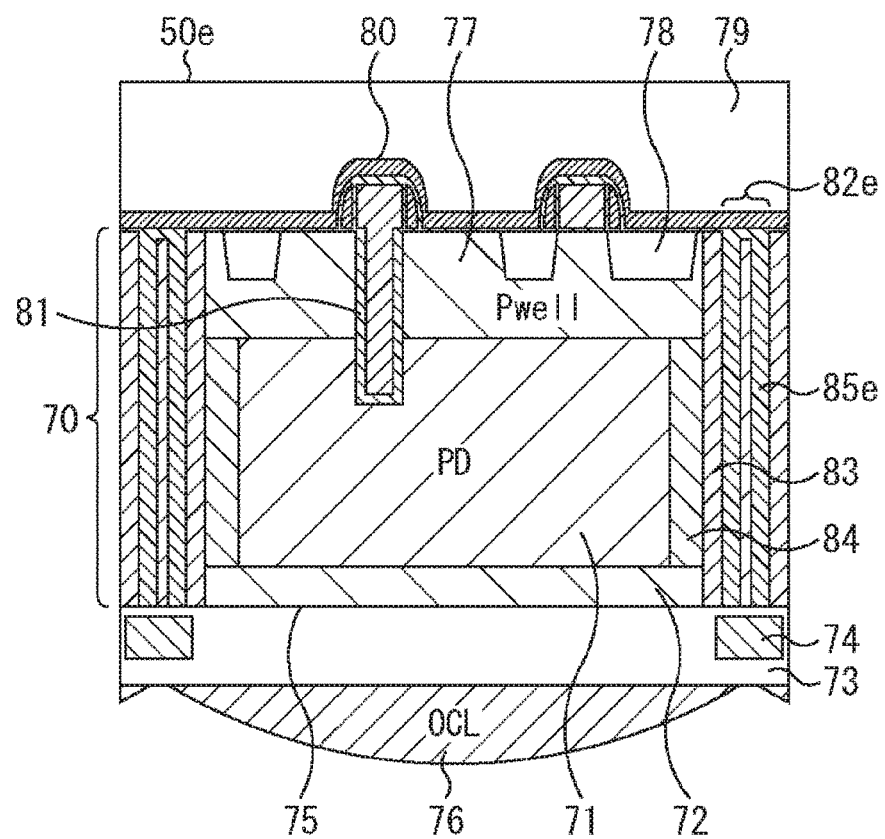
FIG. 10 is a vertical cross-sectional diagram illustrating a fifth configuration example of the pixel to which the present technology is applied.

FIG. 10 is a vertical cross-sectional diagram of a pixel 50e in a fifth embodiment to which the present technology is applied.

The pixel 50e in the fifth embodiment is different from that in the first embodiment in that a side wall film 85e formed with SiO2, formed on an inner wall of a DTI 82e is formed thicker than the side wall film 85 of the pixel 50e in the first embodiment, and other configurations are similar to those in the first embodiment.

Because an optical refraction index of SiO2 is lower than that of Si, while incident light which is incident on the Si substrate 70 is reflected in accordance with the Snell's law, and transmission of light to the adjacent pixel 50 is suppressed, if a film thickness of the side wall film 85 is thin, the Snell's law does not completely hold, and there is a possibility that transmitted light increases.

Because the side wall film 85e of the pixel 50e in the fifth embodiment is formed to have a thick film thickness, it is possible to reduce deviation from the Snell's law, so that it is possible to reduce transmission to the adjacent pixel 50e as a result of reflection of the incident light at the side wall film 85e increasing. Therefore, with the pixel 50e in the fifth embodiment, as well as effects similar to those of the pixel 50a in the first embodiment can be obtained, it is also possible to obtain an effect that color mixture to the adjacent pixel 50e due to oblique incident light can be suppressed.

Sixth Embodiment

Figure 11:
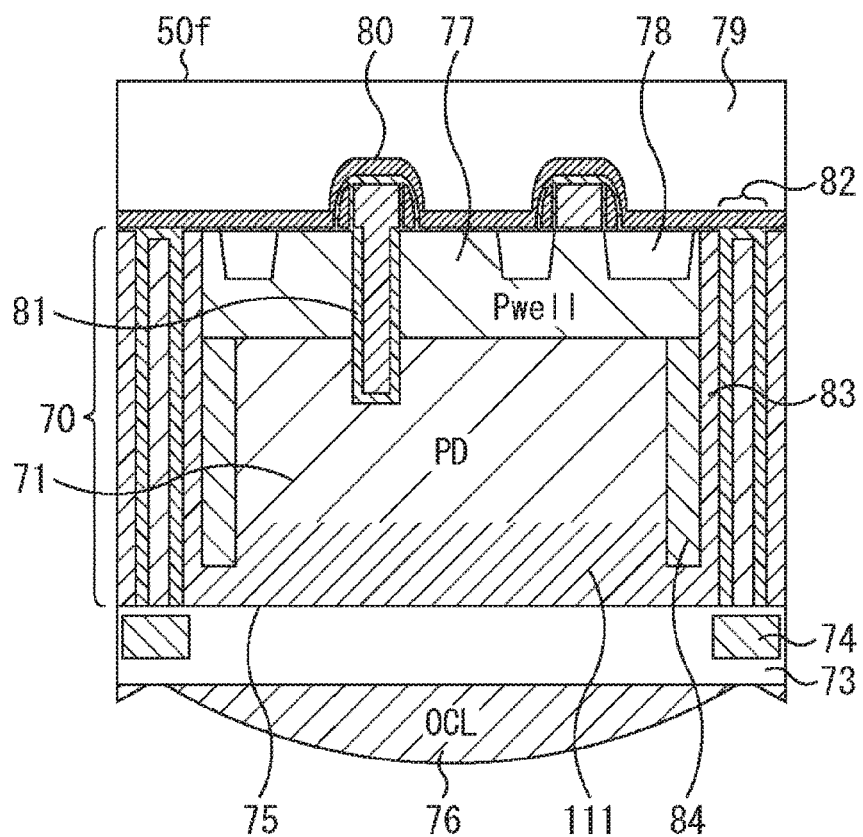
FIG. 11 is a vertical cross-sectional diagram illustrating a sixth configuration example of the pixel to which the present technology is applied.

FIG. 11 is a vertical cross-sectional diagram of a pixel 50f in a sixth embodiment to which the present technology is applied.

The pixel 50f in the sixth embodiment is different from the pixel 50a in the first embodiment in that a concentration gradient is provided so that the concentration of the P-type impurities at the Si substrate 70 becomes higher on the backside than on the surface side by the P-type impurities being doped in a region 111 between the PD 71 and the backside Si interface 75, and other configurations are similar to those of the pixel 50a in the first embodiment.

Referring to FIG. 3 again, there is no concentration gradient at the Si substrate 70 in the pixel 50a in the first embodiment, and the P-type region 72 is formed between the PD 71 and the backside Si interface 75. In the pixel 50f in the sixth embodiment, a concentration gradient is provided at the Si substrate 70. This concentration gradient is set so that the concentration of the P-type impurities becomes higher on the backside (P-type region 111 side) than on the surface side.

According to the pixel 50f in the sixth embodiment having such a concentration gradient, as well as effects similar to those of the pixel 50a in the first embodiment can be obtained, it is also possible to obtain an effect that charges can be read out more easily than in the pixel 50a in the first embodiment.

Seventh Embodiment

Figure 12:
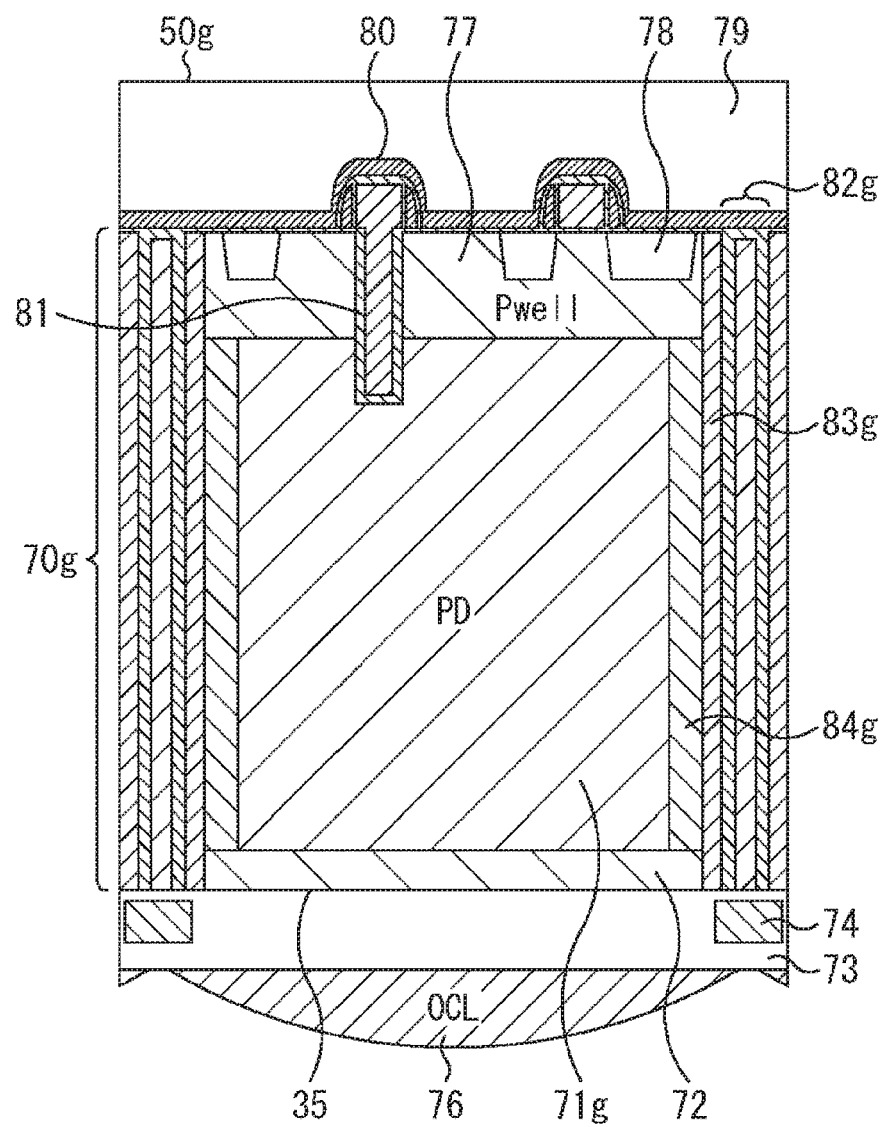
FIG. 12 is a vertical cross-sectional diagram illustrating a seventh configuration example of the pixel to which the present technology is applied.

FIG. 12 is a vertical cross-sectional diagram of a pixel 50g in a seventh embodiment to which the present technology is applied.

The pixel 50g in the seventh embodiment is different from the pixel 50a in that a thickness of the Si substrate 70 is thicker than that in the pixel 50a in the first embodiment, and the DTI 82, or the like, is formed more deeply in accordance with the thickness of the Si substrate 70 becomes thicker.

In the pixel 50g in the seventh embodiment, a Si substrate 70g is formed to have a thick thickness. In accordance with the thickness of the Si substrate 70g being thicker, an area (volume) of a PD 71g increases, and a DTI 82g is formed more deeply. Further, in accordance with the DTI 82g being formed more deeply, a P-type solid-phase diffused layer 83g and an N-type solid-phase diffused layer 84g are also formed more deeply (widely).

As a result of the P-type solid-phase diffused layer 83g and the N-type solid-phase diffused layer 84g being wider, an area of a PN junction region including the P-type solid-phase diffused layer 83g and the N-type solid-phase diffused layer 84g becomes wider. Therefore, with the pixel 50g in the seventh embodiment, as well as effects similar to those of the pixel 50g in the first embodiment can be obtained, it is also possible to further increase a saturated charge amount Qs compared to the pixel 50a in the first embodiment.

Eighth Embodiment

Figure 13:
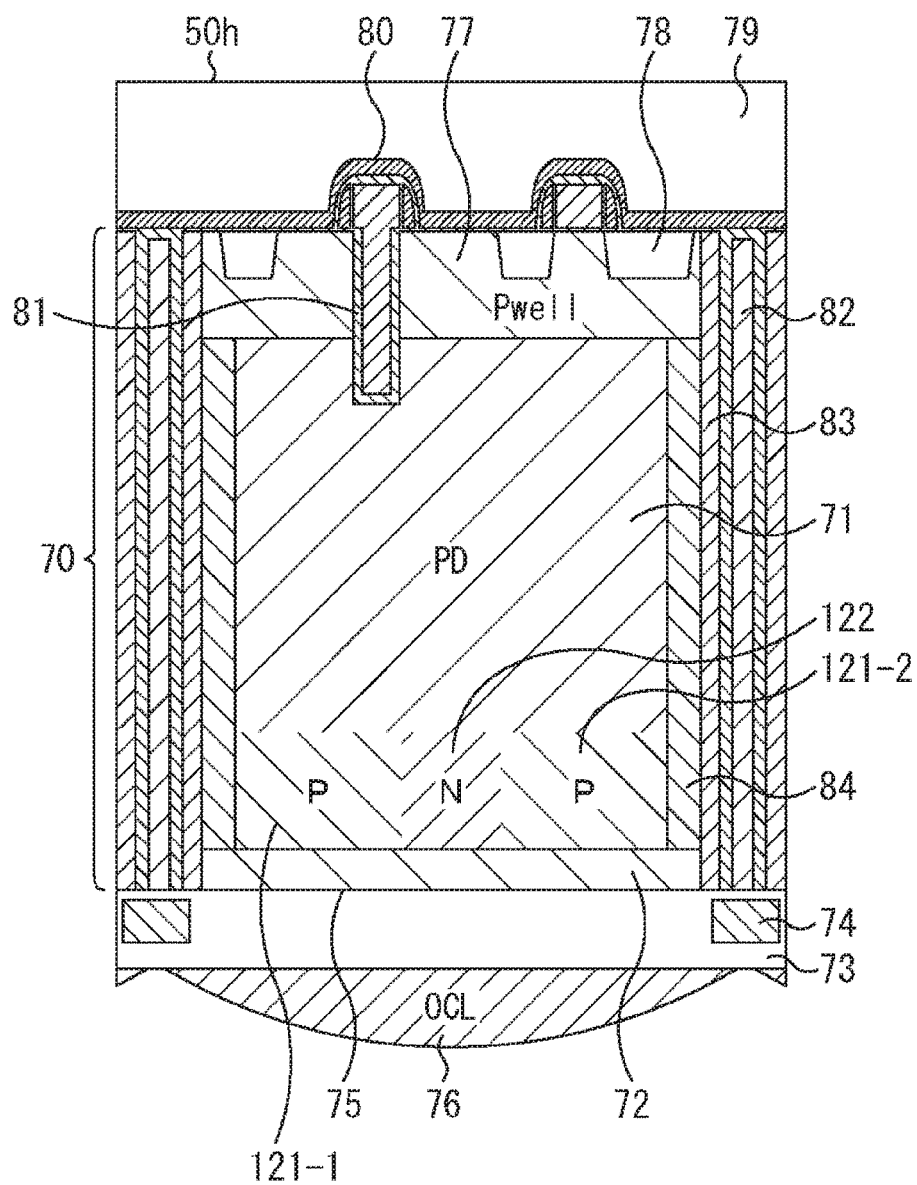
FIG. 13 is a vertical cross-sectional diagram illustrating an eighth configuration example of the pixel to which the present technology is applied.

FIG. 13 is a vertical cross-sectional diagram of a pixel 50h in an eighth embodiment to which the present technology is applied.

The pixel 50h in the eighth embodiment is a pixel obtained by extending a length of a Si substrate 70g in a depth direction in a similar manner to the pixel 50g in the seventh embodiment illustrated in FIG. 12.

Further, in a pixel 50r, a P-type region 121-1, an N-type region 122 and a P-type region 121-2 are formed through ion implantation on the backside of the PD 71. Because an intense electric field is generated at a PN junction formed with the P-type region 121-1, the N-type region 122 and the P-type region 121-2, it is possible to hold charges.

Therefore, with the pixel 50h in the eighth embodiment, as well as effects similar to those of the pixel 50g in the seventh embodiment can be obtained, it is also possible to further increase the saturated charge amount Qs.

Ninth Embodiment

Figure 14:
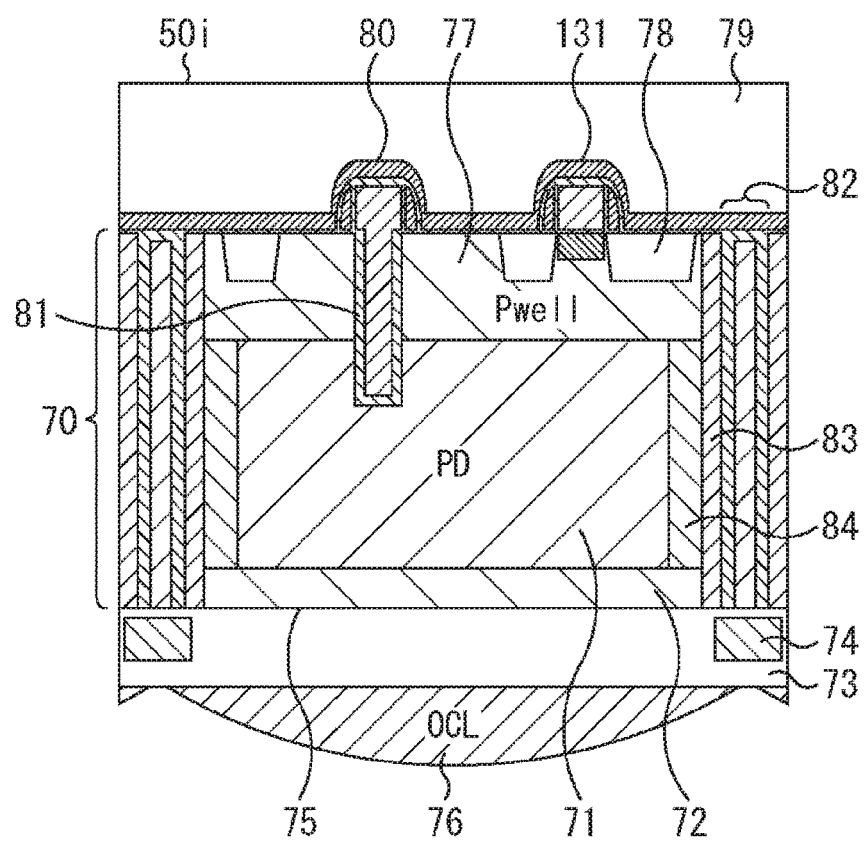
FIG. 14 is a vertical cross-sectional diagram illustrating a ninth configuration example of the pixel to which the present technology is applied.

FIG. 14 is a vertical cross-sectional diagram of a pixel 50i in a ninth embodiment to which the present technology is applied.

The pixel 50i in the ninth embodiment is different from the pixel 50a in the first embodiment in that a MOS capacitor 131 and a pixel transistor (not illustrated) are formed on the surface side of the Si substrate 70, and other configurations are similar to those of the pixel 50a in the first embodiment.

Normally, even if the saturated charge amount Qs of the PD 71 is increased, output is limited with an amplitude limit of a vertical signal line VSL (vertical signal line 47 illustrated in FIG. 2) if conversion efficiency is not lowered, so that it is difficult to sufficiently utilize the increased saturated charge amount Qs.

To lower the conversion efficiency of the PD 71, it is necessary to add capacity to the FD 91 (FIG. 4). Therefore, the pixel 50i in the ninth embodiment has a configuration where the MOS capacitor 131 is added as capacity to be added to the FD 91 (not illustrated in FIG. 11).

With the pixel 50i in the ninth embodiment, as well as effects similar to those of the pixel 50a in the first embodiment can be obtained, it is possible to lower conversion efficiency of the PD 71 by adding the MOS capacitor 131 to the FD 91, and it is possible to employ a configuration where the increased saturated charge amount Qs can be sufficiently utilized.

Tenth Embodiment

Figure 15:
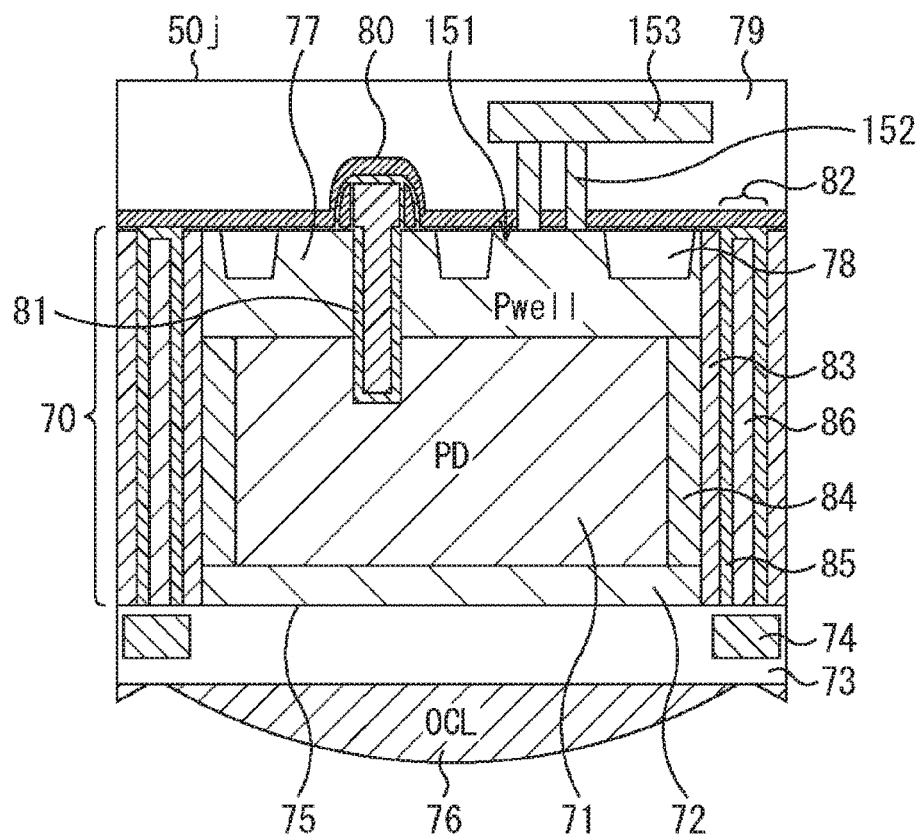
FIG. 15 is a vertical cross-sectional diagram illustrating a tenth configuration example of the pixel to which the present technology is applied.

FIG. 15 is a vertical cross-sectional diagram of a pixel 50*j* in a tenth embodiment to which the present technology is applied.

The pixel 50*j* in the tenth embodiment is different from the pixel 50*a* in the first embodiment in that two contacts 152 are formed at a well contact portion 151 formed in the active region 77, and the contacts 152 are connected to a Cu wiring 153, and other configurations are similar to those of the pixel 50*a* in the first embodiment.

In this manner, it is also possible to employ a configuration where the well contact portion 151 is provided. Note that, while, in FIG. 15, an example has been described where two contacts 152 are formed, two or more contacts 152 may be formed at the well contact portion 151.

According to the pixel 50*j* in the tenth embodiment, as well as effects similar to those of the pixel 50*a* in the first embodiment can be obtained, it is also possible to improve a major defect yield ratio.

Eleventh Embodiment

Figure 16B:
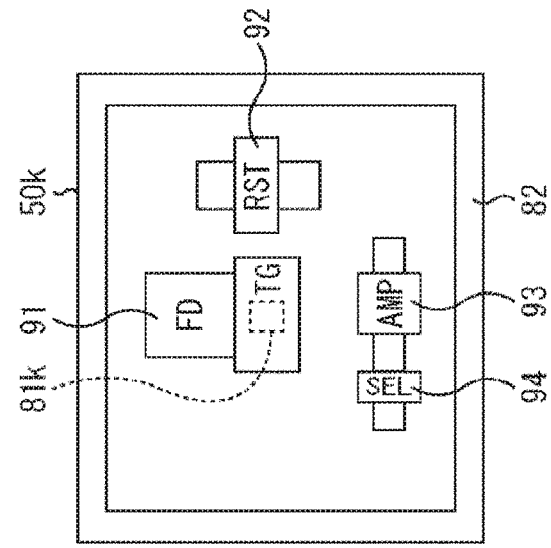
FIGS. 16A and 16B are vertical cross-sectional diagrams and plan views illustrating an eleventh configuration example of the pixel to which the present technology is applied.
Figure 16A:
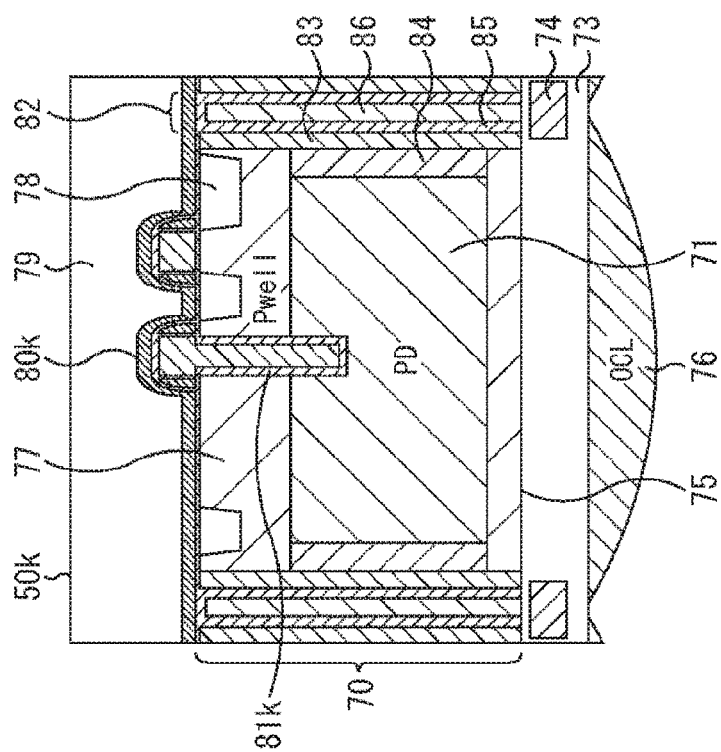

FIGS. 16A and 16B are vertical cross-sectional diagrams of a pixel 50*k* in an eleventh embodiment to which the present technology is applied.

The pixel 50*k* in the eleventh embodiment is different from the pixel 50*a* in the first embodiment in that a vertical transistor trench 81*k* is open at the center of the pixel 50*k*, and a transfer transistor (gate) 80*k* is formed, and other configurations are similar to those of the pixel 50*a* in the first embodiment.

The pixel 50*k* illustrated in FIGS. 16A and 16B are formed in a state where the transfer transistor (gate) 80*k* is located at equal distances from respective outer peripheries of the PD 71. Therefore, according to the pixel 50*k* in the eleventh embodiment, as well as effects similar to those of the pixel 50*a* in the first embodiment can be obtained, because the transfer transistor (gate) exists at equal distances from the respective outer peripheries of the PD 71, it is possible to improve transfer of charges.

Twelfth Embodiment

Figures 17A, 17B:
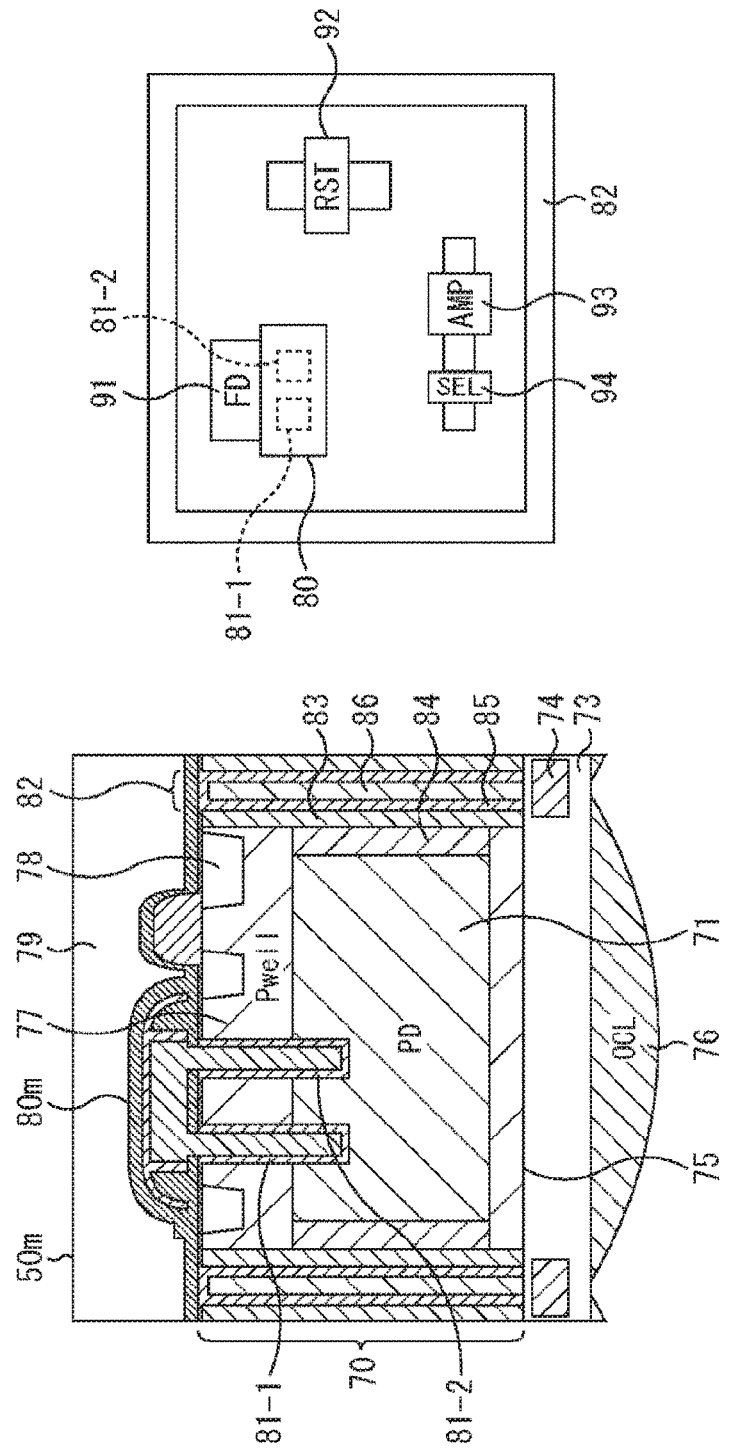
FIGS. 17A and 17B are vertical cross-sectional diagrams and plan views illustrating a twelfth configuration example of the pixel to which the present technology is applied.

FIGS. 17A and 17B are vertical cross-sectional diagrams of a pixel 50*m* in a twelfth embodiment to which the present technology is applied.

The pixel 50*m* in the twelfth embodiment is different from the pixel 50*a* in the first embodiment in that a transfer transistor 80*m* is formed with two vertical transistor trenches 81-1 and 81-2, and other points in the configuration are similar.

While the pixel 50*a* (FIG. 3) in the first embodiment has a configuration where the transfer transistor 80 includes one vertical transistor trench 81, in the pixel 50*m* in the twelfth embodiment, the transfer transistor 80*m* is formed with two vertical transistor trenches 81-1 and 81-2.

In this manner, as a result of a configuration where two vertical transistor trenches 81-1 and 81-2 are provided being employed, followability of a potential in a region between the two vertical transistor trenches 81-1 and 81-2 is improved when a potential of the transfer transistor 80*k* is changed. Therefore, it is possible to increase a modulation factor. As a result, it is possible to improve charge transfer efficiency.

Further, effects similar to those of the pixel 50*a* in the first embodiment can be also obtained.

Note that, while description has been described here using an example where the transfer transistor 80*k* includes two vertical transistor trenches 81-1 and 81-2, two or more vertical transistor trenches 81 may be formed in each pixel region.

Further, while an example has been described where the two vertical transistor trenches 81-1 and 81-2 are formed to have the same size (length and diameter), in a case where a plurality of vertical transistor trenches 81 is formed, vertical transistor trenches 81 having different sizes may be formed. For example, it is also possible to form one of the two vertical transistor trenches 81-1 and 81-2 longer than the other, or form one of the two vertical transistor trenches 81-1 and 81-2 to have a greater diameter.

Thirteenth Embodiment

Figure 18:
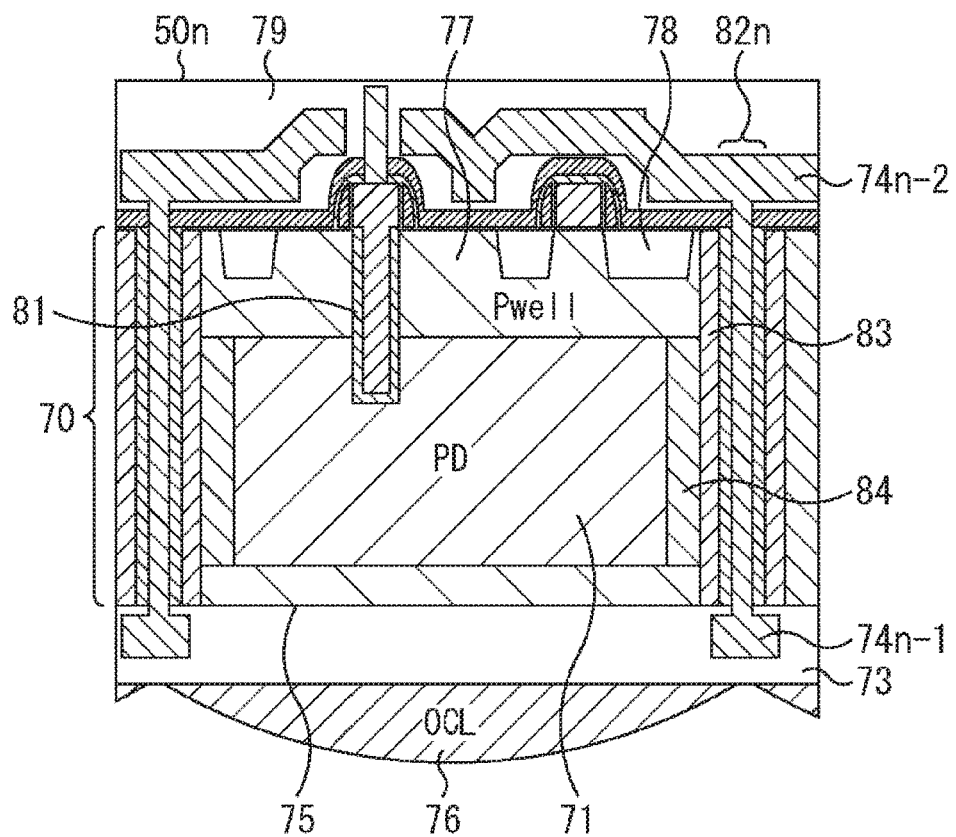
FIG. 18 is a vertical cross-sectional diagram illustrating a thirteenth configuration example of the pixel to which the present technology is applied.

FIG. 18 is a vertical cross-sectional diagram of a pixel 50*n* in a thirteenth embodiment to which the present technology is applied.

The pixel 50*n* in the thirteenth embodiment is different from the pixel 50*a* in the first embodiment in a configuration of the light shielding film 74, and other configurations are similar.

In the pixel 50*n* in the thirteenth embodiment, a light shielding film 74*n*-1 and a light shielding film 74*n*-2 are respectively formed on an upper side and a lower side of the DTI 82*n*. While, in the pixel 50*a* (FIG. 3) in the first embodiment, the light shielding film 74 which covers the backside is formed on the backside (lower part in the drawing) of the DTI 82, in the pixel 50*n* (FIG. 18), inside of the DTI 82*n* is filled with a metal material (for example, tungsten) which is the same as that of the light shielding film 74, and the surface side (upper part in the drawing) of the Si substrate 70 is also covered.

That is, a configuration is employed where a portion other than the backside (other than a light incident surface) of each pixel region is enclosed with a metal material. However, in a case where the pixel 50*n* has a configuration where a portion other than the backside of the pixel 50*n* is enclosed with the metal material, an opening portion is provided as appropriate at a necessary portion, for example, a portion of the light shielding film 74*n*-2, at which the transfer transistor 80*n* is located is open, and a terminal for external connection is formed.

Note that a metal material other than tungsten (W) may be used as the light shielding film 74, or the like.

According to the pixel 50*n* in the thirteenth embodiment, because it is possible to prevent incident light from leaking to the adjacent pixel 50*n*, it is possible to suppress color mixture.

Further, it is possible to employ a configuration where light which is incident from the backside and reaches the surface side without being subjected to photoelectric conversion is reflected by the metal material (light shielding film 74*n*-2) and is incident on the PD 71 again. Therefore, with the pixel 50*n* in the thirteenth embodiment, as well as effects similar to those of the pixel 50*a* in the first embodiment can be obtained, it is also possible to further improve sensitivity of the PD 71.

Fourteenth Embodiment

Figure 19:
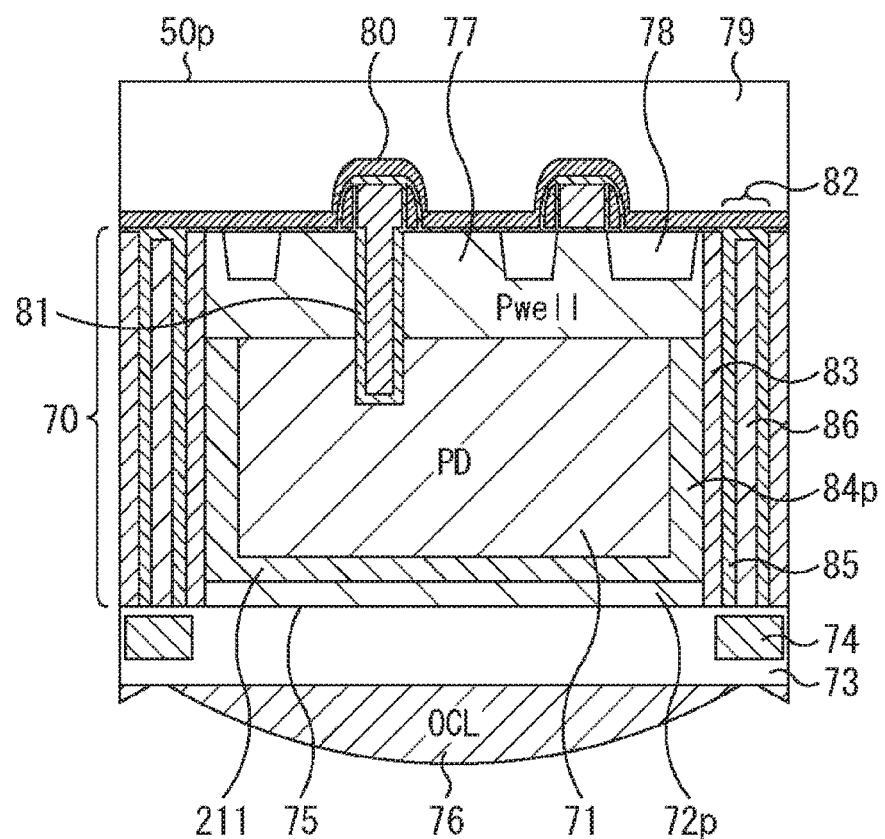
FIG. 19 is a vertical cross-sectional diagram illustrating a fourteenth configuration example of the pixel to which the present technology is applied.

FIG. 19 is a vertical cross-sectional diagram of a pixel 50p in a fourteenth embodiment to which the present technology is applied.

In the above-described first to thirteenth embodiments, description has been provided using an example where the P-type solid-phase diffused layer 83 and the N-type solid-phase diffused layer 84 (for example, FIG. 3) are formed along the DTI 82 formed on the side wall of the PD 71.

In other words, in the first to the thirteenth embodiments, description has been provided using an example of a configuration where a PN junction region of the P-type solid-phase diffused layer 83 and the N-type solid-phase diffused layer 84 is formed on the side wall of the PD 71, so that an intense electric field region is generated, and charges generated at the PD 71 are held.

Further, it is also possible to employ a configuration where a PN junction region is formed also on the backside, and the charges generated at the PD 71 are further held. The pixel 50p in the fourteenth embodiment illustrated in FIG. 19 is different from the pixel 50a in the first embodiment in that, compared to the pixel 50a in the first embodiment, a PN junction region is formed also on the backside which is the light incident side, and other configurations are similar.

In the pixel 50p illustrated in FIG. 19, a P-type region 72p is formed on the backside Si interface 75 (on the PD 71 side). Further, an N-type region 211 is formed on the P-type region 72p (on the PD 71 side). By these P-type region 72p and N-type region 211, it is also possible to employ a configuration where a PN junction region is formed also on the light incident surface side, and an intense electric field region is generated.

In a case where a PN junction region is formed also on the backside in this manner, as illustrated in the pixel 50p in FIG. 19, it is possible to employ a configuration where three sides among four sides enclosing the PD 71 are enclosed with the PN junction region when seen in a vertical cross-section of the pixel 50p.

In a case where a configuration is employed where three sides among four sides enclosing the PD 71 are enclosed with the PN junction region when seen in a vertical cross-section of the pixel 50p, as illustrated in FIG. 19, it is also possible to continuously form the N-type solid-phase diffused layer 84p and the N-type region 211 by making the concentration of the N-type solid-phase diffused layer 84p formed on the side wall the same as the concentration of the N-type region 211. Further, the N-type region 211 and the P-type region 72p can be made a solid-phase diffused layer.

Further, in a case where the N-type solid-phase diffused layer 84p and the N-type region 211 are continuously formed by making the concentration of the N-type solid-phase diffused layer 84p the same as the concentration of the N-type region 211, it is possible to form the N-type solid-phase diffused layer 84p and the N-type region 211 at the same timing upon formation (upon manufacturing). For example, as will be described later, it is possible to form the N-type solid-phase diffused layer 84p and the N-type region 211 at the same timing using a manufacturing method using solid-phase diffusion.

Alternatively, it is also possible to make the concentration of the N-type solid-phase diffused layer 84p different from the concentration of the N-type region 211. For example, the N-type solid-phase diffused layer 84p may be formed to have lower concentration than the concentration of the N-type region 211. In a case where the concentration of the N-type solid-phase diffused layer 84p is made different from the concentration of the N-type region 211, it is possible to manufacture the N-type solid-phase diffused layer 84p and the N-type region 211 in different manufacturing processes.

According to a configuration where three sides among four sides enclosing the PD 71 are enclosed with the PN junction region in this manner, in the pixel 50p in the fourteenth embodiment, an intense electric field region wider than that of the pixel 50a in the first embodiment is generated, so that it is possible to hold more charges generated at the PD 71.

Fifteenth Embodiment

Figure 20:
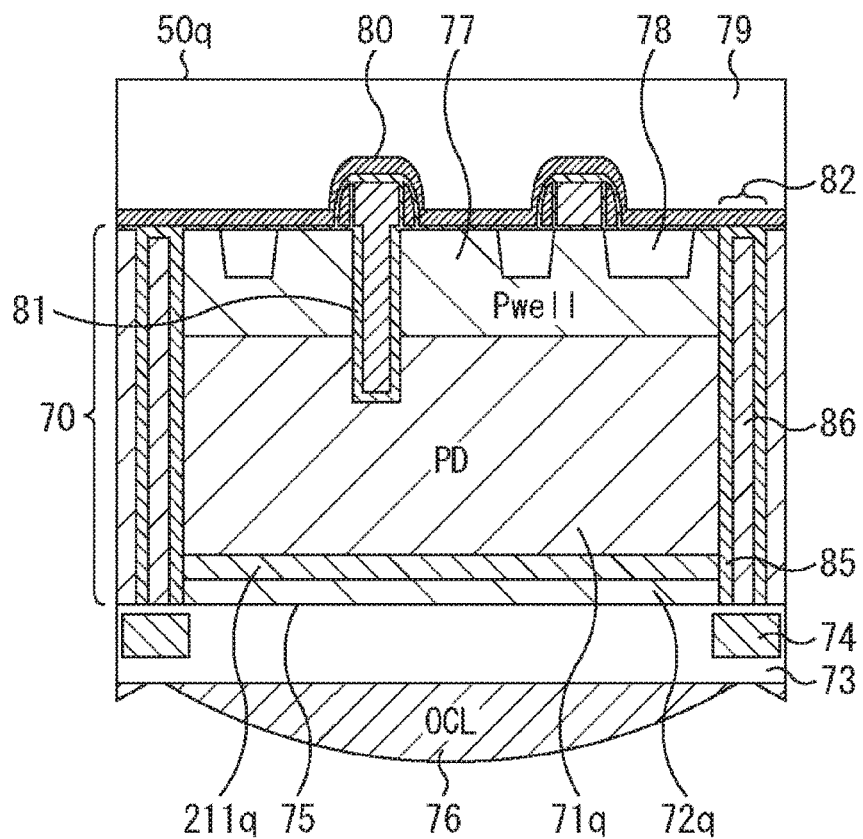
FIG. 20 is a vertical cross-sectional diagram illustrating a fifteenth configuration example of the pixel to which the present technology is applied.

FIG. 20 is a vertical cross-sectional diagram of a pixel 50q in a fifteenth embodiment to which the present technology is applied.

While an example has been described where the above-described pixel 50p in the fourteenth embodiment illustrated in FIG. 19 has a configuration where three sides among four sides enclosing the PD 71 are enclosed with the PN junction region in a vertical cross-section, as in the pixel 50q in the fifteenth embodiment illustrated in FIG. 20, it is also possible to employ a configuration where a PN junction region is formed at only one side on the backside among the four sides enclosing the PD 71.

In the pixel 50q illustrated in FIG. 20, a P-type region 72q and an N-type region 211q are formed on the backside Si interface 75 (PD 71 side), and a PN junction region is formed only on the backside. Also in a case of such formation, because an intense electric field region is generated on the backside of the PD 71, it is possible to employ a configuration where the charges generated at the PD 71 are held.

If a PN junction region is formed at at least one side among the four sides enclosing the PD 71 in a vertical cross-section of the pixel 50 as illustrated in the fourteenth and fifteenth embodiments, because an intense electric field region is generated at the PN junction region, it is possible to employ a configuration where the charges generated at the PD 71 are held.

Sixteenth Embodiment

Figure 21:
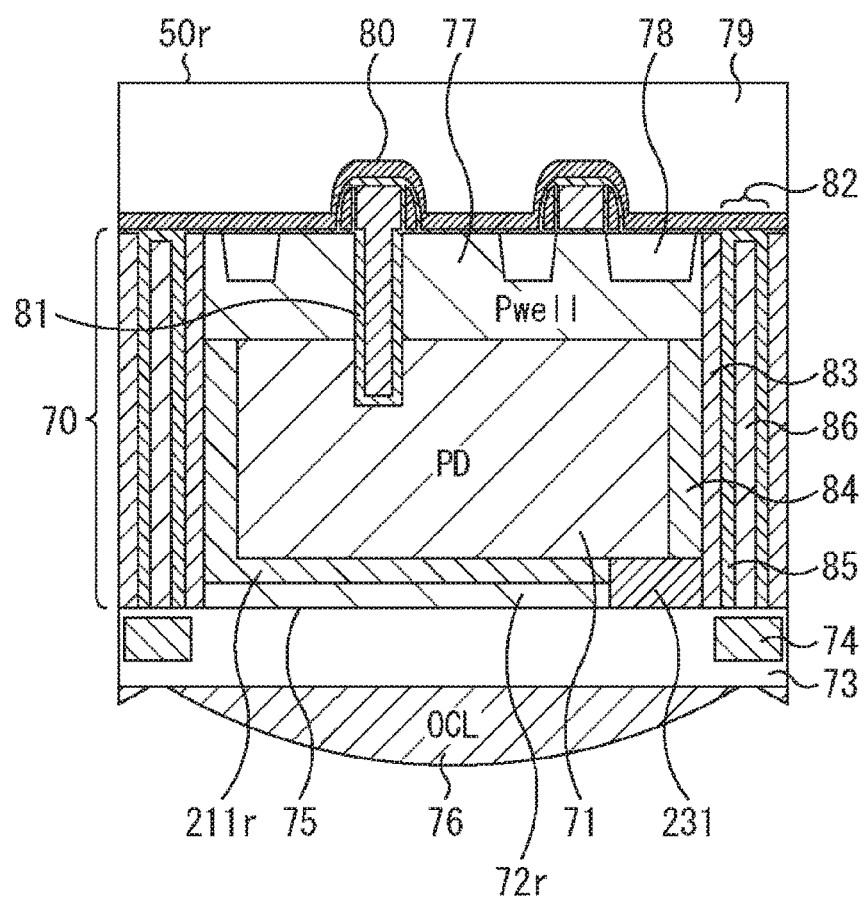
FIG. 21 is a vertical cross-sectional diagram illustrating a sixteenth configuration example of the pixel to which the present technology is applied.

FIG. 21 is a vertical cross-sectional diagram of a pixel 50r in a sixteenth embodiment to which the present technology is applied.

While the pixel 50r in the sixteenth embodiment illustrated in FIG. 21 has a configuration similar to that of the pixel 50p illustrated in FIG. 19, the pixel 50r is different from the pixel 50p in that the PN junction region formed on the backside is not formed to the DTI 82, but breaks.

Referring to FIG. 21, while a P-type region 72r and an N-type region 211r formed on the backside of the pixel 50r are formed so as to contact the DTI 82 in a left part of the drawing, the P-type region 72r and the N-type region 211r are formed so as not to contact the DTI 82 in a right part of the drawing, and a separation prevention region 231 is formed between the P-type region 72r and the N-type region 211r, and the DTI 82.

This separation prevention region 231 is a region provided so that the Si substrate 70 is not separated upon manufacturing of the pixel 50r in a case where the P-type region 72r and the N-type region 211r are formed using a manufacturing method which will be described later.

Figure 22A:
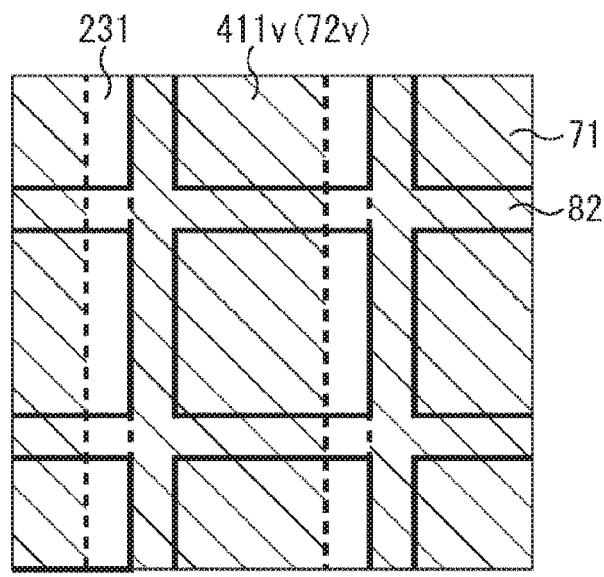
FIGS. 22A and 22B are views for explaining a shape of a separation prevention region.
Figure 22B:
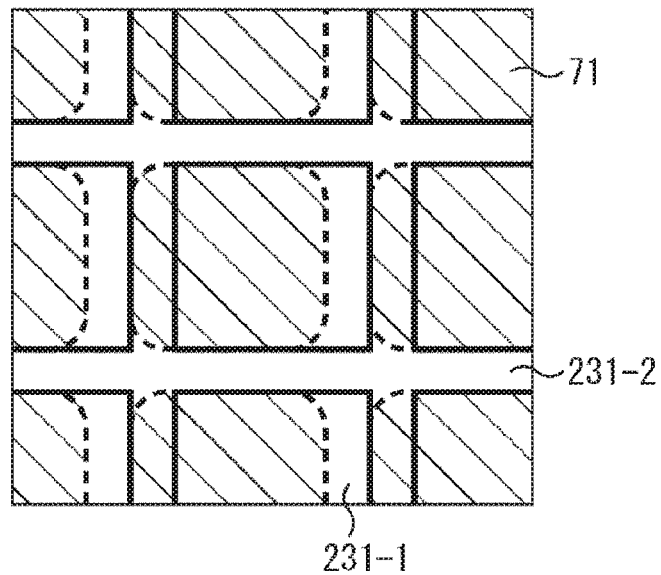

When the pixel 50r is seen from the surface or the backside, the separation prevention region 231 is formed at a position (region) as illustrated in FIGS. 22A and 22B.

Referring to FIG. 22A, the DTI 82 is formed so as to enclose the PD 71. This point is similar to other embodiments. The PN junction region and the separation prevention region 231 including the P-type region 72r and the N-type region 211r are formed so as to be alternately arranged.

Alternatively, as illustrated in FIG. 22B, the separation prevention region 231 may be formed such that a separation prevention region 231-1 is formed in a vertical direction in the drawing, and a separation prevention region 231-2 is formed in a horizontal direction.

In other words, the separation prevention region 231 may be formed in a cross shape. In this case, the PN junction region including the P-type region 72r and the N-type region 211r is formed so as to be enclosed with the separation prevention region 231.

In this manner, the separation prevention region 231 is a region formed on the backside of the PD 71. In other words, the PN junction region including the P-type region 72r and the N-type region 211r is formed so as to cover the backside of the PD 71 except part of the backside, and the part which is not covered is made the separation prevention region 231. Further, in other words, the PN junction region is discontinuously formed on the backside of the PD 71.

Such a separation prevention region 231 is formed using a manufacturing method which will be described below when the PN junction region including the P-type region 72r and the N-type region 211r is formed.

Figure 23:
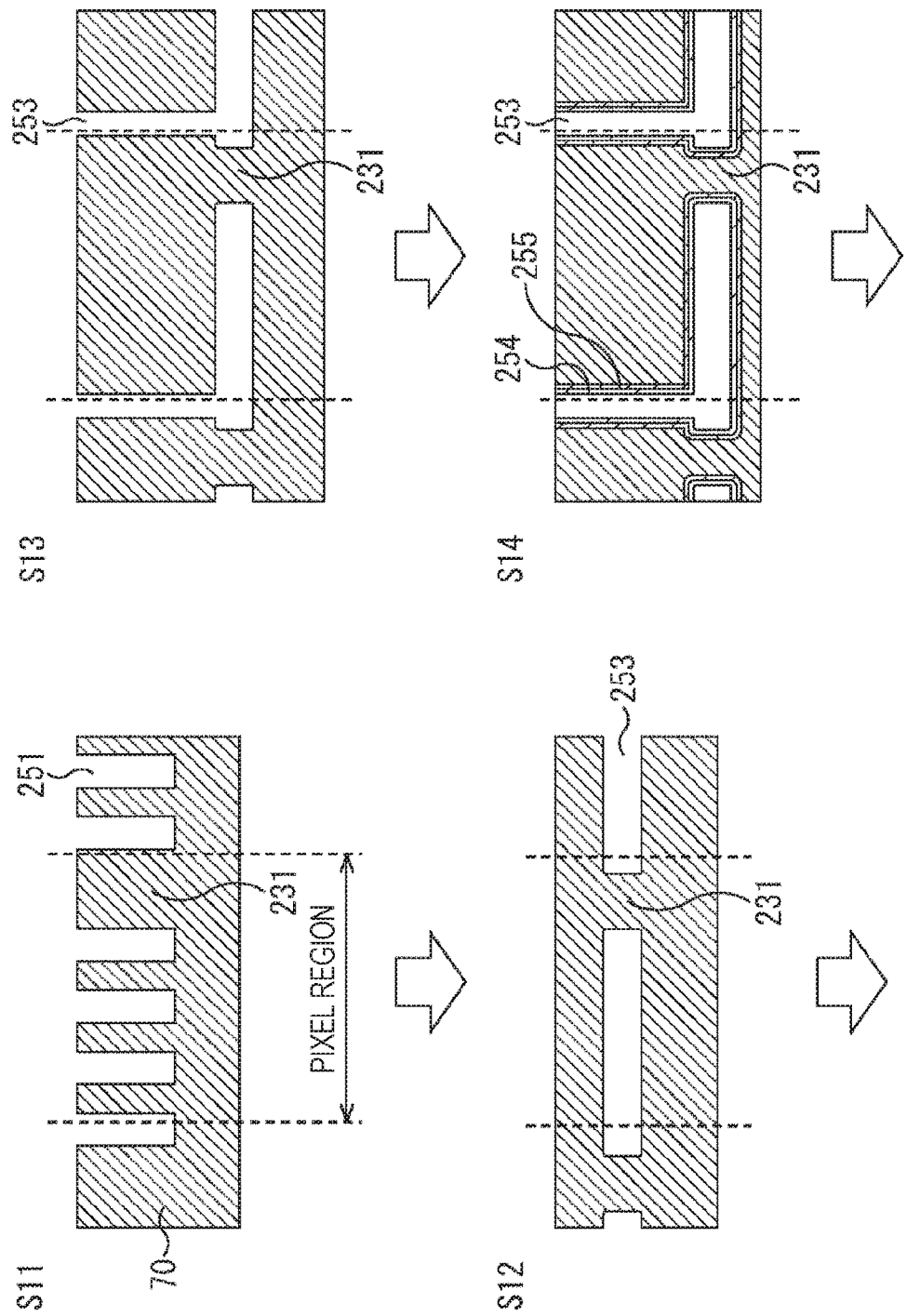
FIG. 23 is a review for explaining a process relating to formation of an N-type region.
Figure 24:
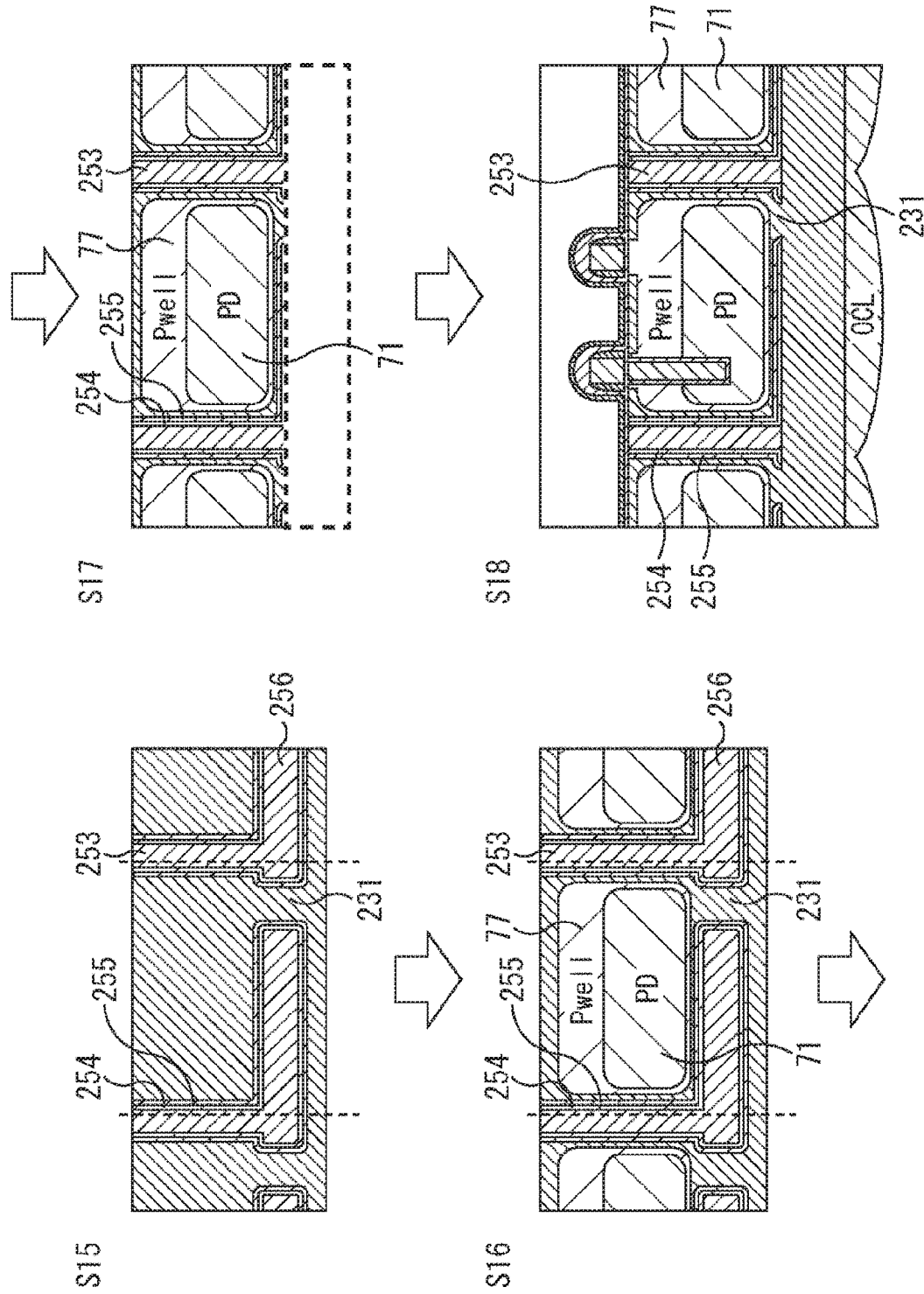
FIG. 24 is a view for explaining the process relating to formation of the N-type region.

FIG. 23 and FIG. 24 are views for explaining a process relating to manufacturing of the pixel 50r illustrated in FIG. 21, particularly, manufacturing of the PN junction region including the P-type region 72r and the N-type region 211r.

The PN junction region c including the P-type region 72r and the N-type region 211r of the pixel 50r can be formed using a silicon on nothing (SON) technology.

In step S11, a plurality of trenches 251 which is vertical to the surface of the Si substrate 70 is formed at predetermined intervals. While a plurality of trenches 251 is formed within a region which becomes the pixel 50r, the trench 251 is not formed in a region which becomes the separation prevention region 231.

In part of the step S11 in FIG. 23, the trench 251 is not formed in a right portion of a portion which is described as a pixel region, and this portion becomes the separation prevention region 231 through the subsequent process. Therefore, a reference numeral is also assigned to the portion in step S11 in FIG. 23 to clearly indicate a portion which becomes the separation prevention region 231.

In step S12, annealing treatment is performed on the Si substrate 70 on which the trench 251 is formed, using an H2 gas for approximately ten minutes under an environment of approximately 1100° C. (this temperature and period are an example, and not limitative). By this means, as illustrated in step S12 in FIG. 23, a cavity portion 252 in a horizontal direction is formed on the Si substrate 70. Note that a tip of the cavity portion 252 has a slightly rounded shape.

In step S13, a trench 253 which leads to the cavity portion 252 is open on the surface of the Si substrate 70.

In step S14, a P-type region 254 and an N-type region 255 are formed on the respective side surfaces of the cavity portion 252 and the trench 253 by impurity diffusion (solid-phase diffusion) being executed.

The P-type region 254 formed around the trench 253 in step S14 becomes the P-type solid-phase diffused layer 83 of the pixel 50r illustrated in FIG. 21, and the N-type region 255 becomes the N-type solid-phase diffused layer 84. Further, the P-type region 254 formed around the cavity portion 252 in step S14 becomes the P-type region 72r of the pixel 50r, and the N-type region 255 becomes the N-type region 211r.

Further, in a case where the P-type region 254 and the N-type region 255 are formed by solid-phase diffusion treatment being performed on a portion of the cavity portion 252 and the trench 253 in this manner, the P-type solid-phase diffused layer 83, the N-type solid-phase diffused layer 84, the P-type region 72r and the N-type region 211r are formed at the same timing.

Therefore, because the P-type solid-phase diffused layer 83 and the P-type region 72r are formed in the same step, concentration becomes substantially the same level. Further, in a similar manner, the P-type solid-phase diffused layer 83 and the P-type region 72r are formed as a continuous P-type region.

Further, in a similar manner, because the N-type solid-phase diffused layer 84 and the N-type region 211r are formed in the same process, concentration becomes substantially the same level. Further, the N-type solid-phase diffused layer 84 and the N-type region 211r are formed as a continuous N-type region.

In step S15 (FIG. 24), the cavity portion 252 is filled with a filler 256 from the trench 253. As the filler 256, polysilicon can be used. Further, the filler 256 used for filling in step S15 corresponds to the filler 86 (FIG. 21) used for filling inside of the DTI 82.

By filling with the filler 256 in this manner and by forming the separation prevention region 231 between the cavity portions 252 (leaving the Si substrate 70 instead of making a cavity portion), it is possible to improve mechanical strength of the Si substrate 70, so that it is possible to prevent occurrence of deformation and damage of the Si substrate 70 upon processing.

In a case where the separation prevention region 231 is not formed, in other words, the adjacent cavity portions 252 are connected, while there is a possibility that the pixel portion (PD 71) is lifted-off, and there is a possibility that the cavity portion 431 is separated into an upper portion and a lower portion, by providing the separation prevention region 231, it is possible to prevent occurrence of such a situation.

In step S16, an N-type semiconductor region which becomes the PD 71 is formed by N+ ions being injected to the Si substrate 70, and a P-type semiconductor region which becomes a Pwell region 77 is formed by P+ ions being injected.

In step S17, the backside of the Si substrate 70 is polished and planarized through chemical mechanical polishing (CMP). Polishing is performed to an extent until the P-type region 254 on an upper side (the PD 71 side) of the cavity portion 431 is exposed.

In step S18, the OCL 76, or the like, is laminated on the backside, a transistor is formed on the surface side, and the wiring layer 79 is laminated.

The pixel 50r is manufactured in this manner. In a case where a cavity is formed on the Si substrate 70 and the PN junction region is formed through an SON process, the pixel 50r at which the separation prevention region 231 is provided is formed.

Referring to the pixel 50r illustrated in FIG. 21 again, the separation prevention region 231 is provided in a lower right part in the drawing. This separation prevention region 231 is provided at a position separate from the vertical transistor trench 81 in the example illustrated in FIG. 21 in positional relationship with the vertical transistor trench 81. That is, in the example illustrated in FIG. 21, the vertical transistor trench 81 is formed in an upper left part in the drawing, and the separation prevention region 231 is provided in a lower right part in the drawing.

Further, while not illustrated, the separation prevention region 231 may be provided at a position closer to the vertical transistor trench 81 in the positional relationship with the vertical transistor trench 81. For example, as illustrated in FIG. 21, in a case where the vertical transistor trench 81 is formed in an upper left part in the drawing, the separation prevention region 231 may be provided in a lower left part in the drawing.

Figure 25:
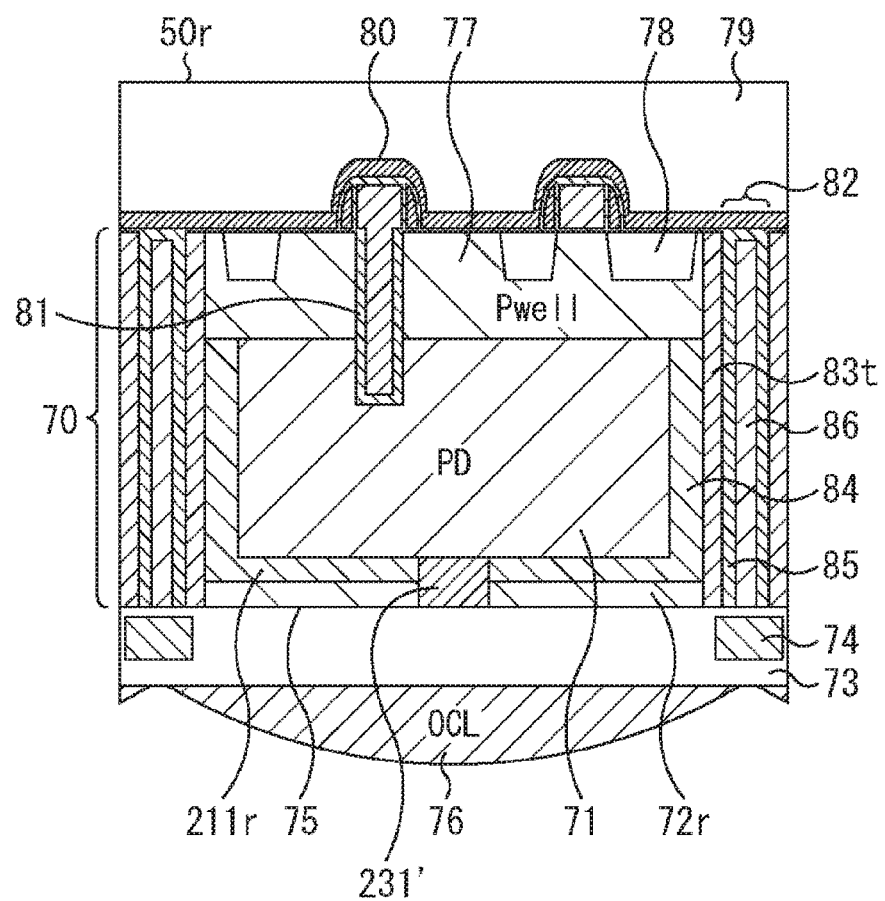
FIG. 25 is a view for explaining another position where the separation prevention region is constituted.

Further, the separation prevention region 231 may be formed near the center as illustrated in FIG. 25 instead of being formed on a side surface side of the pixel 50r. In the pixel 50r illustrated in FIG. 25, a separation prevention region 231' is formed at the center of the pixel 50r.

Seventeenth Embodiment

Figure 26:
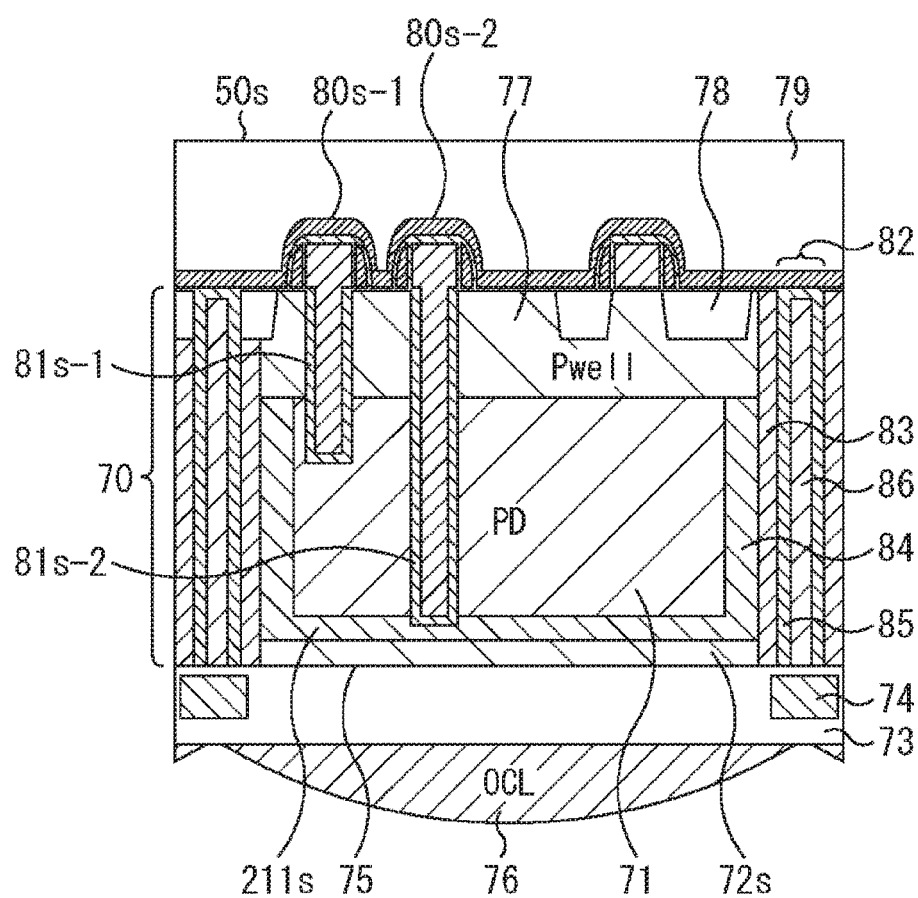
FIG. 26 is a vertical cross-sectional diagram illustrating a seventeenth configuration example of the pixel to which the present technology is applied.

FIG. 26 is a vertical cross-sectional diagram of a pixel 50s in a seventeenth embodiment to which the present technology is applied.

As described with reference to FIG. 19 to FIG. 25, in a case where the PN junction region is formed also on the backside of the pixel 50 so that an intense electric field region is generated also on the backside, it is considered that a charge amount held on the backside increases. Therefore, a configuration for efficiently and more reliably transferring charges held on the backside will be illustrated in FIG. 26.

The pixel 50s illustrated in FIG. 26 is different from the pixel 50p in the fourteenth embodiment illustrated in FIG. 19 in that two transfer transistor gates 80 (vertical transistor trenches 81) are provided, and other portions have similar configurations.

In the pixel 50s, two vertical transistor trenches 81s-1 and 81s-2 are formed.

The vertical transistor trench 81s-2 among the two vertical transistor trenches 81s is formed at a position closer to the center of the pixel 50s than the vertical transistor trench 81s-1. Further, the vertical transistor trench 81s-2 among the two vertical transistor trenches 81s is formed to be longer than the vertical transistor trench 81s-1.

In this manner, the vertical transistor trench 81s located closer to the center of the pixel 50s can be formed to be longer than the vertical transistor trench 81s located farther from the center.

Alternatively, while not illustrated, the vertical transistor trench 81s located closer to the center of the pixel 50s may be formed to be shorter than the vertical transistor trench 81s located farther from the center.

Further, the vertical transistor trench 81s formed to be longer (in FIG. 26, the vertical transistor trench 81s-2) may be formed so as to contact the PN junction region (an N-type region 211s and a P-type region 72s) formed on the backside, or so as to reach inside of the PN junction region. Of course, the present technology can be also applied in a case where the vertical transistor trench 81s-2 does not contact the PN junction region (N-type region 211s) formed on the backside.

The vertical transistor trench 81s formed to be longer (in FIG. 26, the vertical transistor trench 81s-2) is formed to be at least longer (deeper) than equal to or greater than ½ of a thickness of the PD 71. In other words, the vertical transistor trench 81s which is formed to be longer is formed to reach, at least a position exceeding a central position of the PD 71.

By forming the vertical transistor trenches 81s having different lengths in this manner, it is possible to optimize each transfer of charges at a shallow portion and a deep portion of the PD 71.

While, in the example illustrated in FIG. 26, a case has been described where the two vertical transistor trenches 81s are provided, it is also possible to provide two or more (a plurality of) vertical transistor trenches 81s. In a case where a plurality of vertical transistor trenches 81s is provided, at least one vertical transistor trench 81s among the plurality of vertical transistor trenches 81s may be formed so as to contact the PN junction region formed on the backside. Further, a position where the vertical transistor trench 81s is formed may be a position closer to the DTI 82 side than to the central portion as illustrated in FIG. 26 or may be a central portion.

<Concentration of PN Junction Region on Backside>

Concentration of the PN junction region in a case where the PN junction region is provided on the backside in the pixels 50p to 50s described as the fourteenth to the seventeenth embodiments will be described. FIG. 27 is a view for explaining change in the respective concentration of the P-type impurities and the N-type impurities of the PN junction region.

An upper part of FIG. 27 illustrates the pixel 50p illustrated in FIG. 19. The backside Si interface 75 of the pixel 50p is set as a position A, and a position near a central portion of the PD 71 is set as a position B. Change in concentration of impurities from the position A to the position B is illustrated in a lower part of FIG. 27.

In a graph of the change of concentration illustrated in the lower part of FIG. 27, a horizontal axis indicates a depth from an Si interface (position A) on a light receiving surface side, and a vertical axis indicates concentration of impurities. Further, a graph indicated with a solid line indicates concentration of P-type impurities and a graph indicated with a dotted line indicates concentration of N-type impurities.

The concentration of P-type impurities is the highest near the position A, that is, near the center of the P-type region 72p, and becomes rapidly lower as the position is closer (deeper) to the center (position B) of the PD 71.

That is, the concentration of P-type impurities is the highest near the center of the P-type region 72p, and becomes rapidly lower when the position is away from a position near the center of the P-type region 72p. The P-type region 72p is formed to have higher concentration than the concentration of the P-type impurities of a Pwell region 77.

Further, concentration in a region where the concentration of the P-type impurities is the highest, that is, in this case, the concentration of the central portion of the P-type region 72p can be, for example, of the order of 1e16 cm-3 to 1e17 cm-3.

Meanwhile, the concentration of the N-type impurities is the highest at a position a little away from the position A, that is, near the center of the N-type region 211, and becomes gradually lower as the position is closer (deeper) to the center (position B) of the PD 71.

That is, the concentration of the N-type impurities is the highest near the center of the N-type region 211, becomes gradually lower when the position is away from a portion near the center of the N-type region 211, and is maintained at fixed concentration until the central portion of the PD 71. The N-type region 211 is formed to have concentration equal to the concentration of the N-type impurities of the PD 71 or concentration higher than the concentration of the N-type impurities of the PD 71.

Further, the concentration in a region where the concentration of the N-type impurities is the highest, that is, in this case, the concentration at the central portion of the N-type region 211 can be, for example, of the order of 1e15 cm-3 to 1e17 cm-3.

Change in the concentration of N-type impurities becomes the change as illustrated in the graph in FIG. 27 also in a case where the position becomes closer to a portion near the center of the PD 71 from the N-type solid-phase diffused layer 84. That is, the concentration of N-type impurities changes such that the concentration is the highest near the center of the N-type solid-phase diffused layer 84, becomes gradually lower when the position is away from a portion near the center of the N-type solid-phase diffused layer 84, and is maintained at fixed concentration until the central portion of the PD 71.

In this manner, the N-type solid-phase diffused layer 84 and the N-type region 211 having high concentration of N-type impurities are provided on the side surface and the backside of the PD 71. Further, in a region adjacent to the N-type solid-phase diffused layer 84 and the N-type region 211 having high concentration of N-type impurities, the P-type solid-phase diffused layer 83 and the P-type region 72p having high concentration of P-type impurities are provided. Therefore, the side surface and the backside of the PD 71 can constitute the pixel 50 where PN junction is precipitous.

According to such a configuration, as described above, it is possible to employ a configuration where an intense electric field region is generated on the side surface and the backside of the PD 71, so that it is possible to employ a configuration where the charges generated at the PD 71 can be held more easily.

Eighteenth Embodiment

Figure 28:
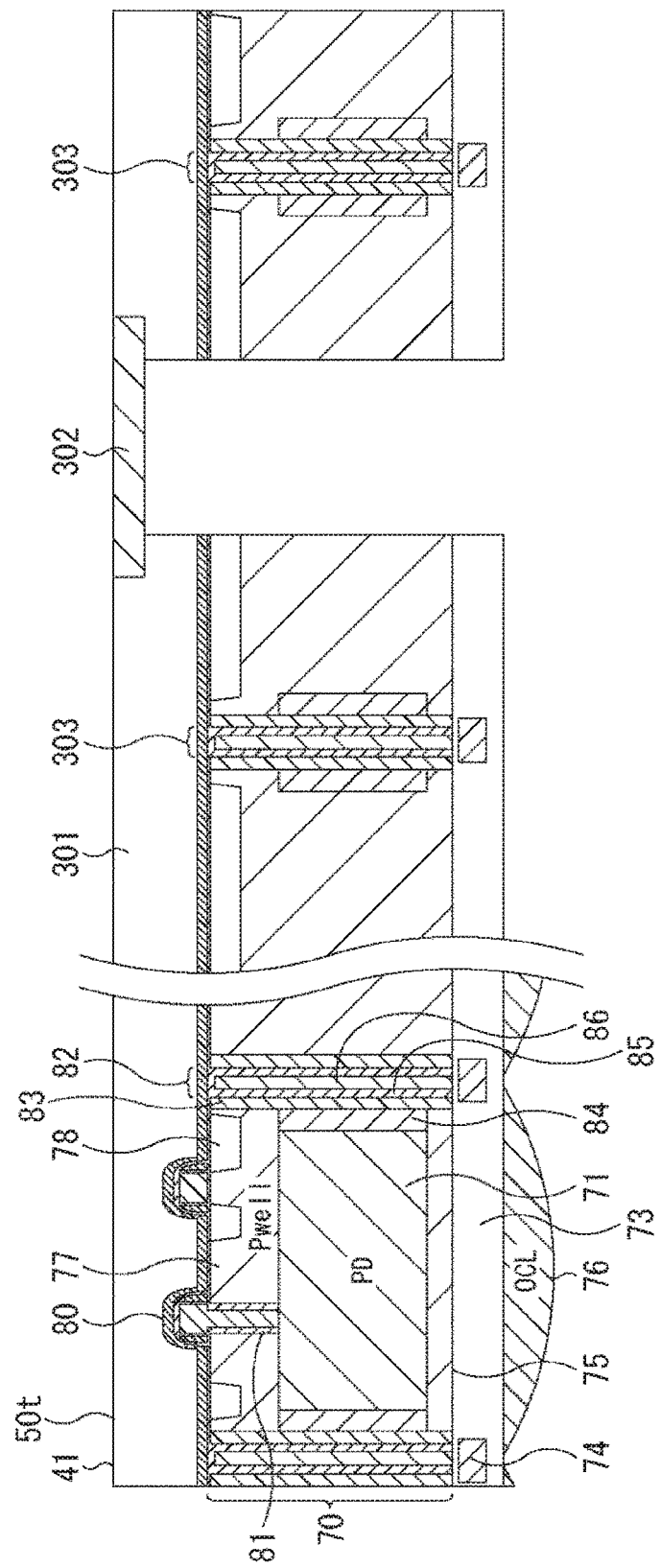
FIG. 28 is a vertical cross-sectional diagram illustrating an eighteenth configuration example of the pixel to which the present technology is applied.

FIG. 28 is a vertical cross-sectional diagram of a pixel 50t in an eighteenth embodiment to which the present technology is applied. Further, FIG. 29 is a plan view of the pixel 50t including an AL pad take-out portion included in the eighteenth embodiment.

As the eighteenth embodiment, a configuration including an AL pad which connects the pixel 50 and other semiconductor substrates, or the like, will be described. While FIG. 28 illustrates an example where an AL pad is provided at the pixel 50a in the first embodiment illustrated in FIG. 3, it is also possible to employ a configuration where an AL pad is provided at any pixel 50 among the pixels 50b to 50s in the second to the seventeenth embodiments, by combining the eighteenth embodiment.

Figure 29:
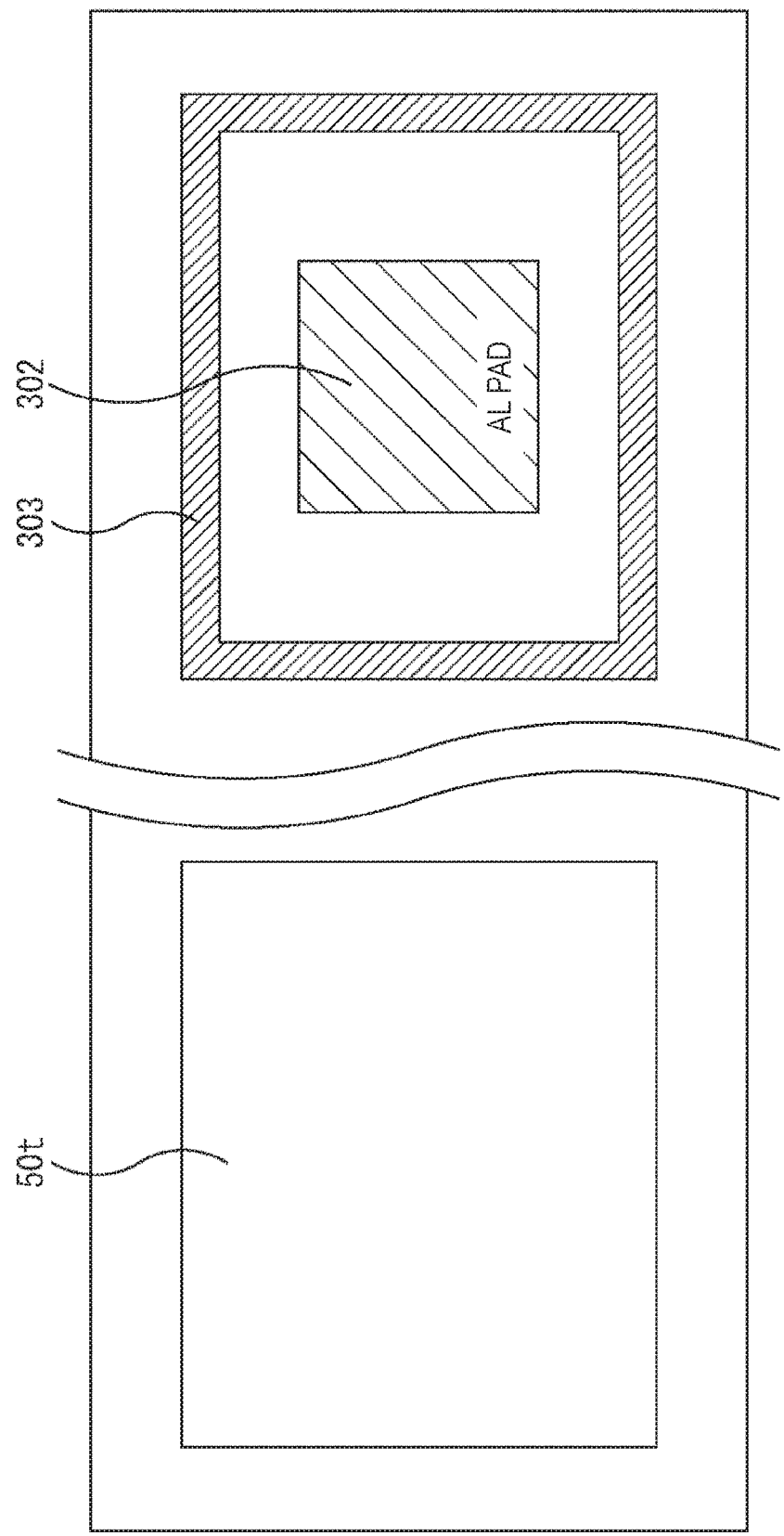
FIG. 29 is a plan view corresponding to the ninth configuration example illustrated in FIG. 13.

As illustrated in FIG. 28 and FIG. 29, the pixel array portion 41 (FIG. 2) is formed in a left part of the drawing, and an AL pad take-out portion 301 is provided in a right part of the drawing. At the AL pad take-out portion 301, an AL pad 302 which becomes a connection terminal between the pixel 50t and other semiconductor substrates, or the like, is formed on the surface of the substrate (upper part in the drawing).

As illustrated in FIG. 28, a solid-phase diffused trench 303 which is formed in a similar manner to the DTI 82 in the first embodiment, is formed around each AL pad 302 at the AL pad take-out portion 301. By this means, it is possible to electrically insulate each AL pad 302 from the pixel array portion 41 and other peripheral circuit portions (not illustrated).

Note that the solid-phase diffused trench 303 formed at the AL pad take-out portion 301 can be utilized as, for example, a mark in photoresist. Further, by this means, it is possible to use the solid-phase diffused trench 303 as an alignment mark in the subsequent process.

Nineteenth Embodiment

Figure 30:
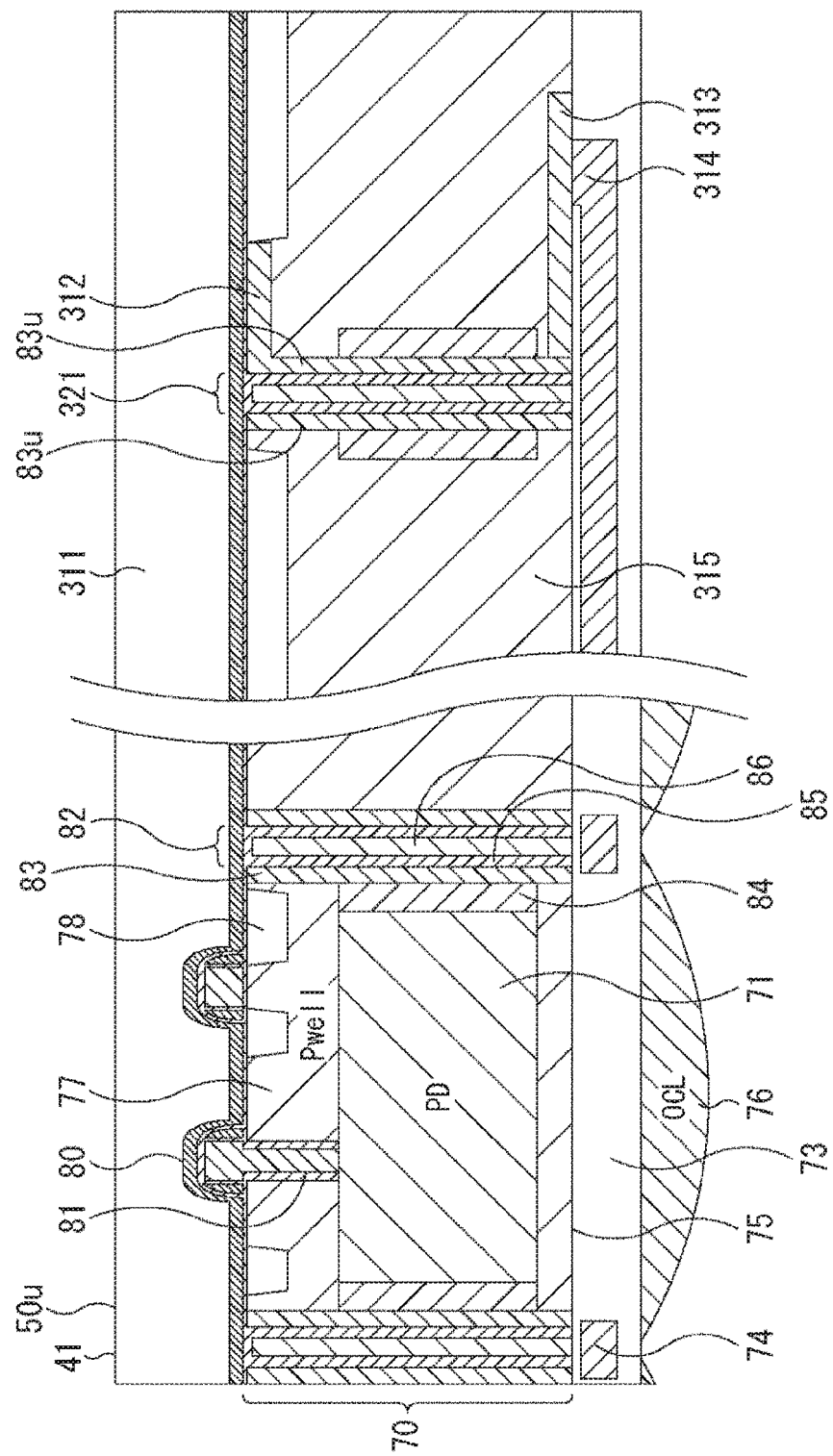
FIG. 30 is a vertical cross-sectional diagram illustrating a nineteenth configuration example of the pixel to which the present technology is applied.

FIG. 30 is a vertical cross-sectional diagram of a pixel 50u in a nineteenth embodiment to which the present technology is applied.

As the nineteenth embodiment, a configuration including the pixel 50 and a peripheral circuit portion, or the like, will be described. While FIG. 30 illustrates an example where a peripheral circuit is provided at the pixel 50a in the first embodiment illustrated in FIG. 3, it is also possible to employ a configuration where a peripheral circuit is provided at any pixel 50 among the pixels 50b to 50s in the second to the seventeenth embodiments, by combining the nineteenth embodiment.

As illustrated in FIG. 30, the pixel array portion 41 (FIG. 2) is formed in a left part of the drawing, and a peripheral circuit portion 311 is formed in a right part of the drawing. At the peripheral circuit portion 311, a solid-phase diffused trench 321 which is formed in a similar manner to the DTI 82 in the first embodiment, is formed.

A surface side (upper part in the drawing) of a P-type solid-phase diffused layer 83u formed along the solid-phase diffused trench 321 is electrically connected to a P+ diffused layer 312 formed on the surface of the Si substrate 70. Further, a backside (lower part in the drawing) of the P-type solid-phase diffused layer 83u is electrically connected to a Pwell region 313 formed near the backside Si interface 75 or a hole layer 315 formed with a pinning film near the backside interface of the Si substrate 70.

The Pwell region 313 is connected to the light shielding film 74 formed with a metal material such as W (tungsten) via the backside contact 314. By this means, the surface side and the backside of the Si substrate 70 are electrically connected, so that the potential is fixed at a potential of the light shielding film 74.

In the nineteenth embodiment, because the P-type solid-phase diffused layer 83u can also play a role of a Pwell region which has been required to connect the surface side and the backside of the Si substrate 70 in related art, it is possible to reduce a step for forming a Pwell region.

Twentieth Embodiment

Figure 31:
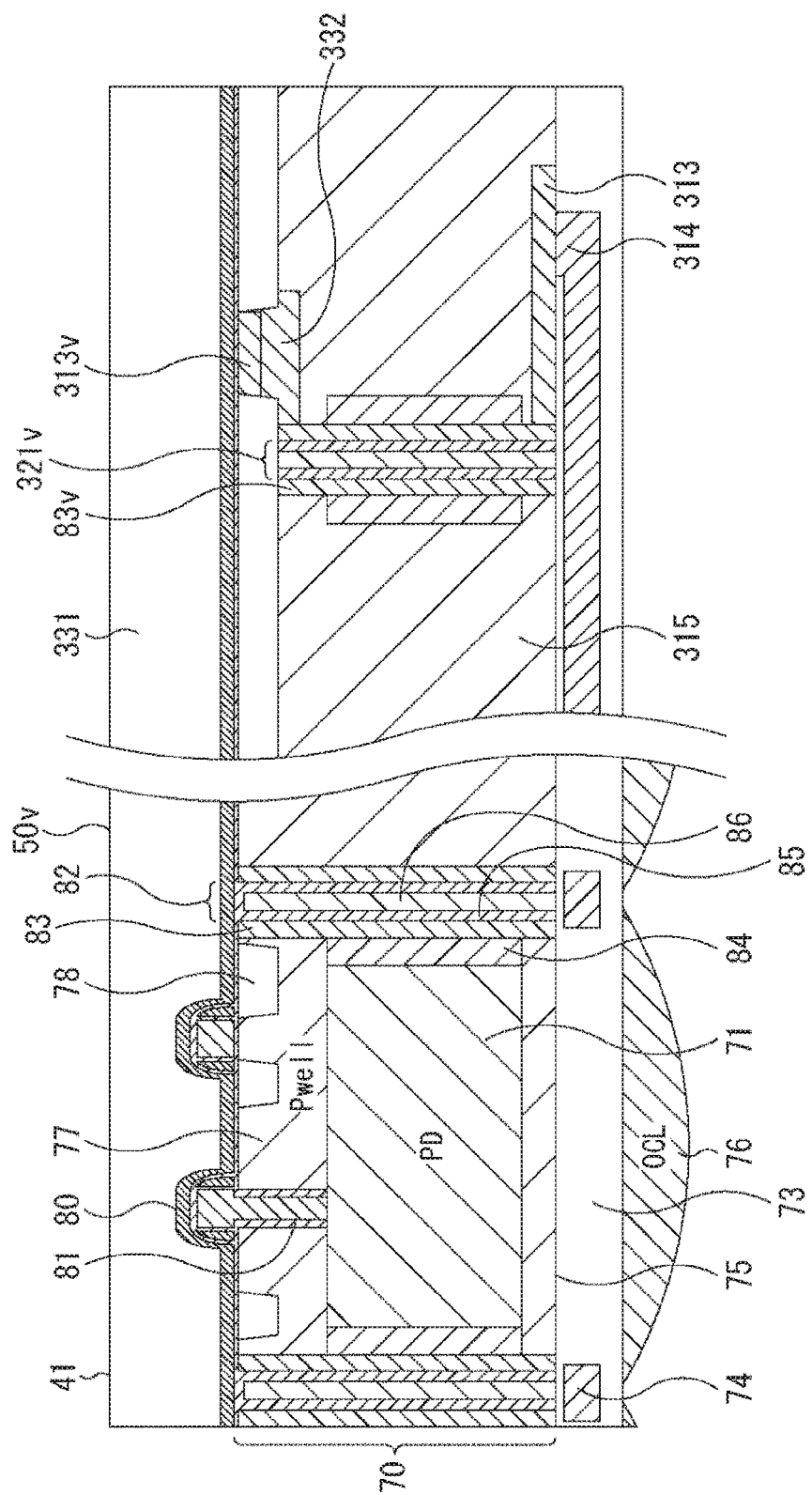
FIG. 31 is a vertical cross-sectional diagram illustrating a twentieth configuration example of the pixel to which the present technology is applied.

FIG. 31 is a vertical cross-sectional diagram of a pixel 50v in a twentieth embodiment to which the present technology is applied.

As the twentieth embodiment, same as the nineteenth embodiment, a configuration including the pixel 50 and a peripheral circuit portion, or the like, will be described. While FIG. 31 illustrates an example where a peripheral circuit is provided at the pixel 50a in the first embodiment illustrated in FIG. 3, it is also possible to employ a configuration where a peripheral circuit is provided at any pixel 50 among the pixels 50b to 50s in the second to the seventeenth embodiments, by combining the twentieth embodiment.

In the pixel 50v in the twentieth embodiment, as in the pixel 50t in the nineteenth embodiment, as illustrated in FIG. 31, the pixel array portion 41 is formed in a left part of the drawing, and the peripheral circuit portion 331 is provided in a right part of the drawing. At the peripheral circuit portion 331, a solid-phase diffused trench 321v formed in a similar manner to the DTI 82 in the first embodiment is formed.

At the peripheral circuit portion 331, a solid-phase diffused trench 321v formed in a similar manner to the DTI 82 in the first embodiment is formed. A surface side (upper side in the drawing) of the P-type solid-phase diffused layer 83v formed along the solid-phase diffused trench 321v is electrically connected to a P+ diffused layer 312v formed on the surface of the Si substrate 70 via the Pwell region 332. The pixel 50v is different from the pixel 50u illustrated in FIG. 30 in this point.

Further, a backside (lower side in the drawing) of the P-type solid-phase diffused layer 83v is electrically connected to a Pwell region 313 formed near the backside Si interface 75 or a hole layer 315. The Pwell region 313 is connected to the light shielding film 74 formed with a metal material such as W via the backside contact 314. By this means, the surface side and the backside of the Si substrate 70 are electrically connected, so that the potential is fixed at a potential of the light shielding film 74.

In the eleventh embodiment, because the P-type solid-phase diffused layer 83v can also play a role of a Pwell region which has been required to connect the surface side and the backside of the Si substrate 70 in related art, it is possible to reduce a step for forming a Pwell region.

Twenty First Embodiment

Figure 32:
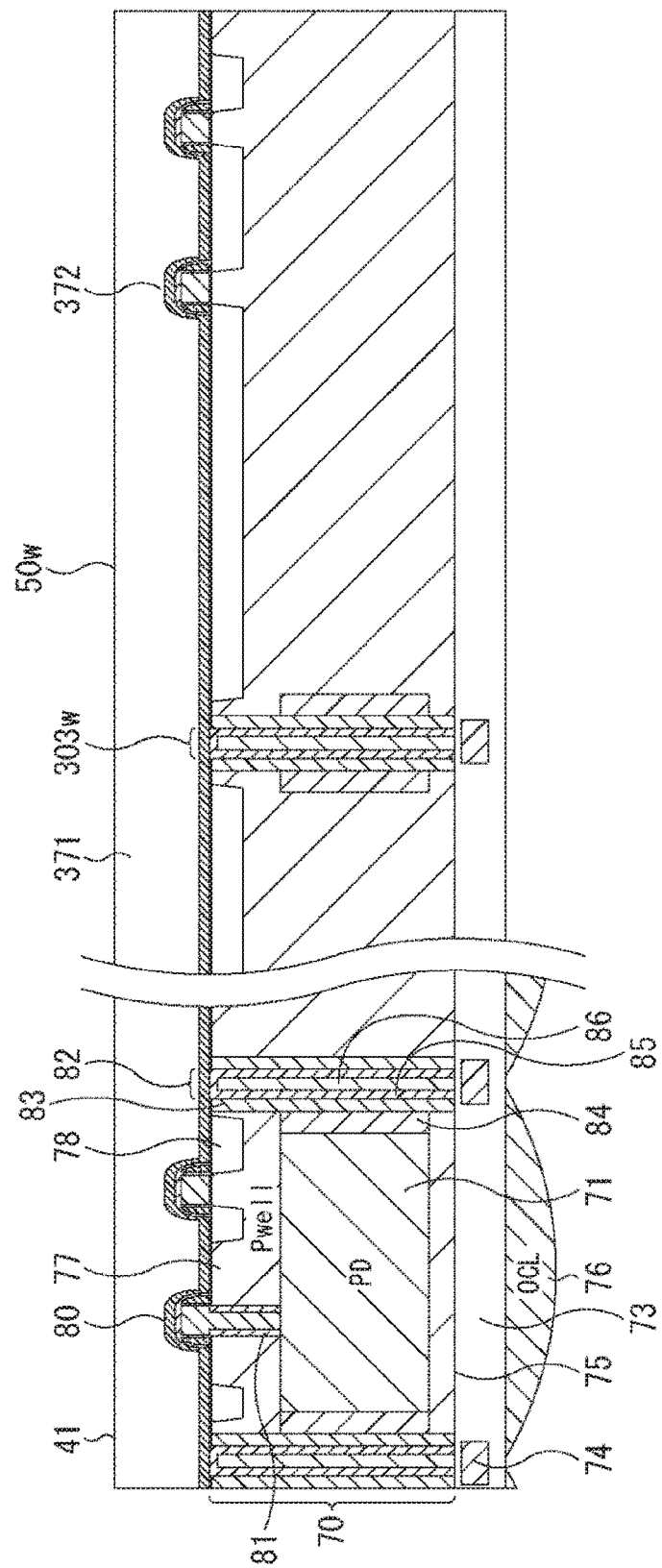
FIG. 32 is a vertical cross-sectional diagram illustrating a twenty first configuration example of the pixel to which the present technology is applied.

FIG. 32 is a vertical cross-sectional diagram of a pixel 50w in a twenty first embodiment to which the present technology is applied.

As the twenty first embodiment, same as the nineteenth embodiment, a configuration including the pixel 50 and a peripheral circuit portion, or the like, will be described. While FIG. 32 illustrates an example where a peripheral circuit is provided at the pixel 50a in the first embodiment illustrated in FIG. 3, it is also possible to employ a configuration where a peripheral circuit is provided at any pixel 50 of any pixel 50 among the pixels 50b to 50s in the second to the seventeenth embodiments, by combining the twenty first embodiment.

In the pixel 50w in the twenty first embodiment, as in the pixel 50t in the nineteenth embodiment, as illustrated in FIG. 32, the pixel array portion 41 is formed in a left part of the drawing, and the peripheral circuit portion 371 is provided in a right part of the drawing.

A solid-phase diffused trench 303 is formed at a boundary portion 372 located at a boundary between the pixel array portion 41 and the peripheral circuit portion 371.

Therefore, with the pixel 50w in the twenty-first embodiment, as well as effects similar to those of the pixel 50a in the first embodiment can be obtained, it is also possible to prevent light emission which can occur at the peripheral circuit portion 371 from intruding to the pixel array portion 41 side by the solid-phase diffused trench 303w.

Note that the above-described first to twenty-first embodiments can be combined as appropriate.

First Modified Example

While, in the above-described first to twenty-first embodiments, each pixel 50 has the FD 91 (FIG. 4) and the pixel transistor (such as, for example, the reset transistor 92 (FIG. 2)), the FD 91 and the pixel transistor can be shared among a plurality of pixels 50.

Figure 33:
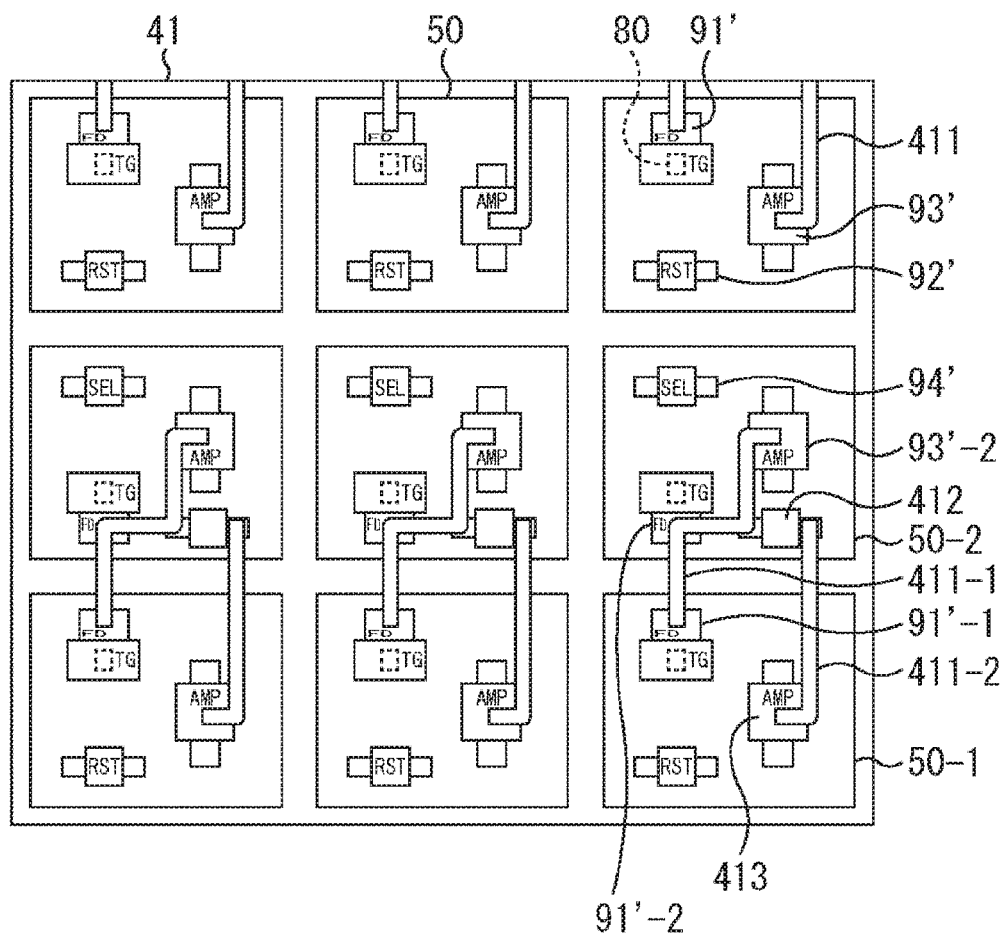
FIG. 33 is a plan view illustrating a configuration example in a case where an FD, or the like, is shared between two pixels.

FIG. 33 illustrates a plan view in a case where the FD 91 and the pixel transistor are shared between two pixels 50 adjacent in a vertical direction.

In the example illustrated in FIG. 33, for example, the FD 91 and the pixel transistor are shared between a pixel 50-1 located in a lower right part and a pixel 50-2 located above the pixel 50-1. An FD 91'-1 of the pixel 50-1, an FD 91'-2 of the pixel 50-2, a conversion efficiency switching transistor 412, and an amplifier transistors 93'-2 of the pixel 50-2 are connected with a wiring 411-1.

Further, a MOS capacitor 413 of the pixel 50-1 and the conversion efficiency switching transistor 412 of the pixel 50-2 are connected with a wiring 411-2.

According to such as sharing structure, because there is room for an occupation area of each pixel as a result of the number of elements per pixel being reduced, it is possible to provide the conversion efficiency switching transistor 412 and the MOS capacitor 413 to be added to the FD 91'.

The conversion efficiency switching transistor 412 can switch conversion efficiency to high conversion efficiency in use application for improving sensitivity output, and can switch conversion efficiency to low conversion efficiency in use application for improving the saturated charge amount Qs.

Because the MOS capacitor 413 added to the FD 91' can increase FD capacity, it is possible to realize low conversion efficiency, so that it is possible to improve the saturated charge amount Qs.

Other Modified Examples

The first to the twenty-first embodiments can be also applied to the pixel 50 which is constituted by, for example, laminating a plurality of substrates as will be described below.

<Configuration Example of Laminated Solid-State Imaging Device to Which Technology According to Present Disclosure can be Applied>

Figure 34A:
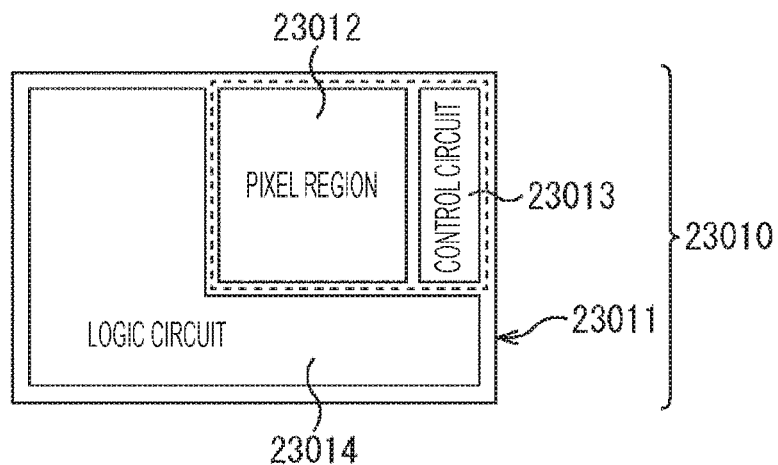
FIGS. 34A, 34B, and 34C are views illustrating outline of a configuration example of a laminated solid-state imaging device to which the technology according to the present disclosure can be applied.
Figure 34B:
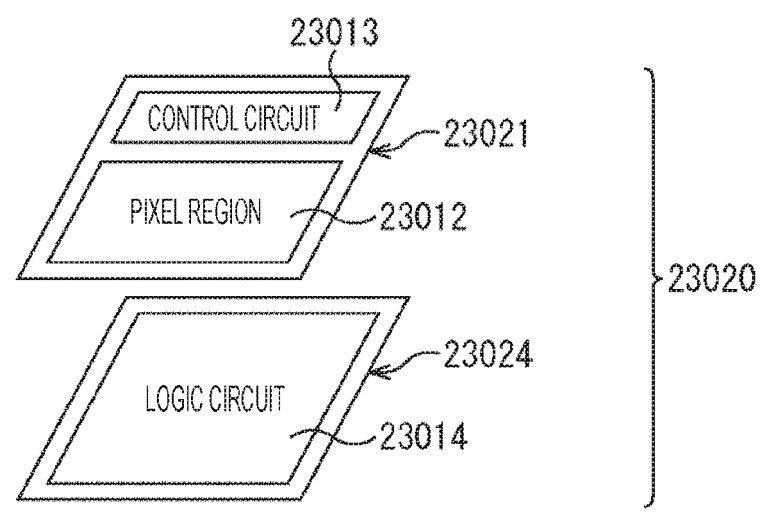

FIGS. 34A and 34B are views illustrating outline of a configuration example of a laminated solid-state imaging device to which the technology according to the present disclosure can be applied.

FIG. 34A illustrates a schematic configuration example of a non-laminated solid-state imaging device. As illustrated in FIG. 34A, a solid-state imaging device 23010 has one die (semiconductor substrate) 23011. On this die 23011, a pixel region 23012 in which pixels are arranged in an array, a control circuit 23013 which performs various kinds of control including driving of pixels, and a logic circuit 23014 for performing signal processing are mounted.

Figure 34C:
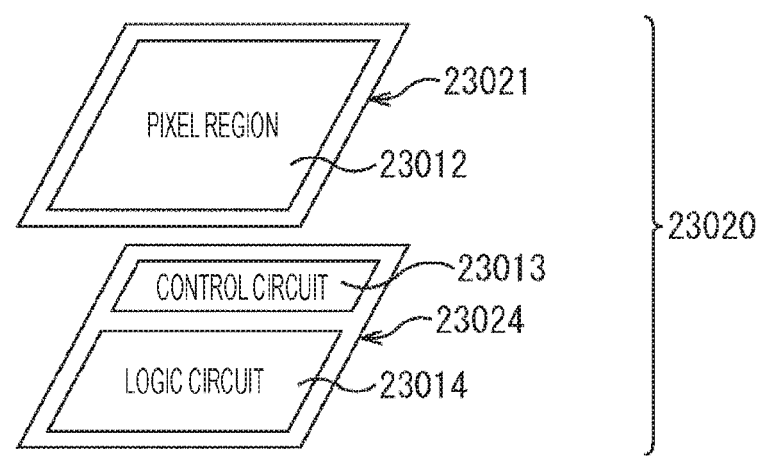

FIGS. 34B and 34C illustrate a schematic configuration example of a laminated solid-state imaging device. As illustrated in FIGS. 34B and 34C, in the solid-state imaging device 23020, two dies of a sensor die 23021 and a logic die 23024 are laminated and electrically connected to be constituted as one semiconductor chip.

In FIG. 34B, the pixel region 23012 and the control circuit 23013 are mounted on the sensor die 23021, and the logic circuit 23014 including a signal processing circuit which performs signal processing is mounted on the logic die 23024.

In FIG. 34C, the pixel region 23012 is mounted on the sensor die 23021, and the control circuit 23013 and the logic circuit 23014 are mounted on the logic die 23024.

Figure 35:
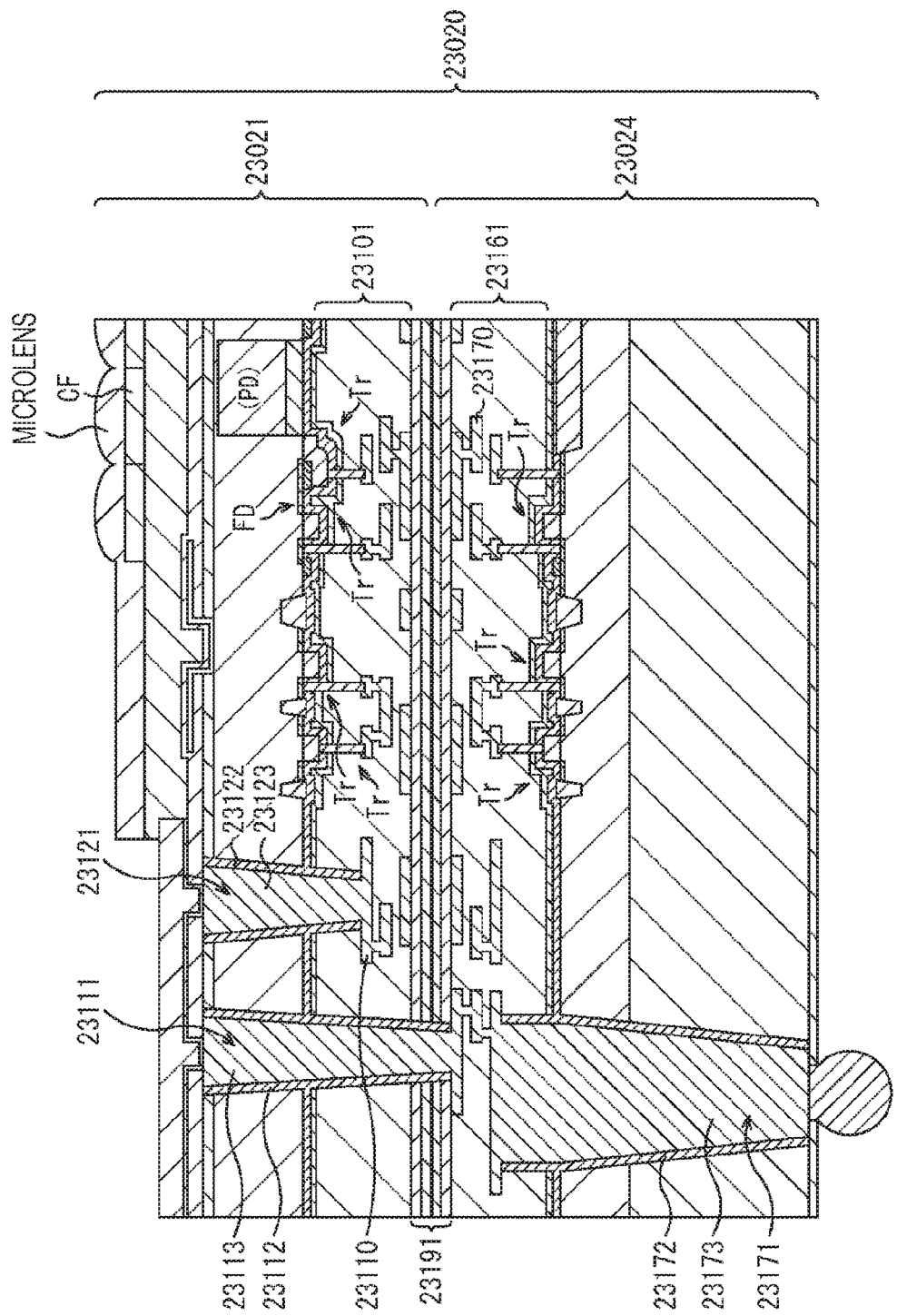
FIG. 35 is a cross-sectional diagram illustrating a first configuration example of a laminated solid-state imaging device 23020.

FIG. 35 is a cross-sectional diagram illustrating a first configuration example of a laminated solid-state imaging device 23020.

A photodiode (PD) which constitutes pixels which become the pixel region 23012, an floating diffusion (FD), a Tr (MOSFET), and a Tr which becomes the control circuit 23013, or the like, are formed at the sensor die 23021. Further, a wiring layer 23101 having wirings 23110 having a plurality of layers, in the present example, three layers, is formed at the sensor die 23021. Note that (a Tr which becomes) the control circuit 23013 can be constituted at the logic die 23024, not at the sensor die 23021.

At the logic die 23024, a Tr constituting the logic circuit 23014 is formed. Further, at the logic die 23024, a wiring layer 23161 having a wiring 23170 having a plurality of layers, in the present example, three layers, is formed. Further, at the logic die 23024, a connection hole 23171 in which an insulating film 23172 is formed on an inner wall surface is formed, and a connection conductor 23173 to be connected to a wiring 23170, or the like, is embedded in the connection hole 23171.

The sensor die 23021 is pasted to the logic die 23024 so that the wiring layers 23101 and 23161 face each other, and thereby the laminated solid-state imaging device 23020 in which the sensor die 23021 and the logic die 23024 are laminated is constituted. A film 23191 such as a protection film is formed on a surface at which the sensor die 23021 is pasted to the logic die 23024.

At the sensor die 23021, a connection hole 23111 which penetrates through the sensor die 23021 from a backside (side at which light is incident on the PD) (upper side) of the sensor die 23021 and reaches a wiring 23170 in the uppermost layer of the logic die 23024 is formed. Further, at the sensor die 23021, a connection hole 23121 which reaches a wiring 23110 in the first layer from the backside of the sensor die 23021 is formed in the vicinity of the connection hole 23111. On an inner wall surface of the connection hole 23111, an insulating film 23112 is formed, and, on an inner wall surface of the connection hole 23121, an insulating film 23122 is formed. Then, connection conductors 23113 and 23123 are respectively embedded into the connection holes 23111 and 23121. The connection conductor 23113 is electrically connected to the connection conductor 23123 on the backside of the sensor die 23021, and thereby, the sensor die 23021 is electrically connected to the logic die 23024 via the wiring layer 23101, the connection hole 23121, the connection hole 23111 and the wiring layer 23161.

Figure 36:
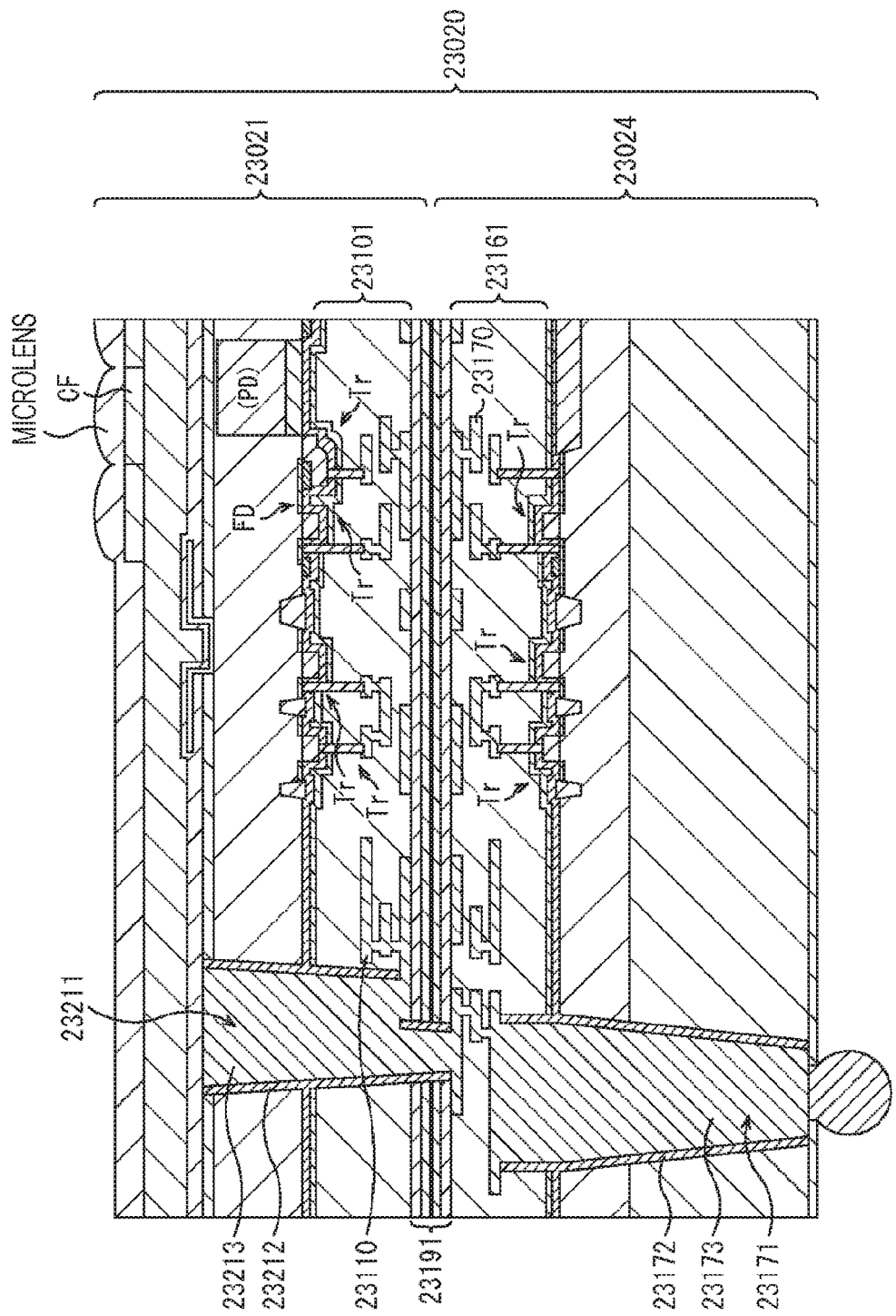
FIG. 36 is a cross-sectional diagram illustrating a second configuration example of a laminated solid-state imaging device 23020.

FIG. 36 is a cross-sectional diagram illustrating a second configuration example of a laminated solid-state imaging device 23020.

In the second configuration example of the solid-state imaging device 23020, ((the wiring 23110) of the wiring layer 23101 of) the sensor die 23021 is electrically connected to ((the wiring 23170 of) the wiring layer 23161 of) the logic die 23024 by one connection hole 23211 formed at the sensor die 23021.

That is, in FIG. 36, the connection hole 23211 is formed to penetrate through the sensor die 23021 from the backside of the sensor die 23021, reach the wiring 23170 in the uppermost layer of the logic die 23024, and reach the wiring 23110 in the uppermost layer of the sensor die 23021. On an inner wall surface of the connection hole 23211, an insulating film 23212 is formed, and a connection conductor 23213 is embedded into the connection hole 23211. While, in the above-described FIG. 35, the sensor die 23021 is electrically connected to the logic die 23024 by two connection holes 23111 and 23121, in FIG. 36, the sensor die 23021 is electrically connected to the logic die 23024 by one connection hole 23211.

Figure 37:
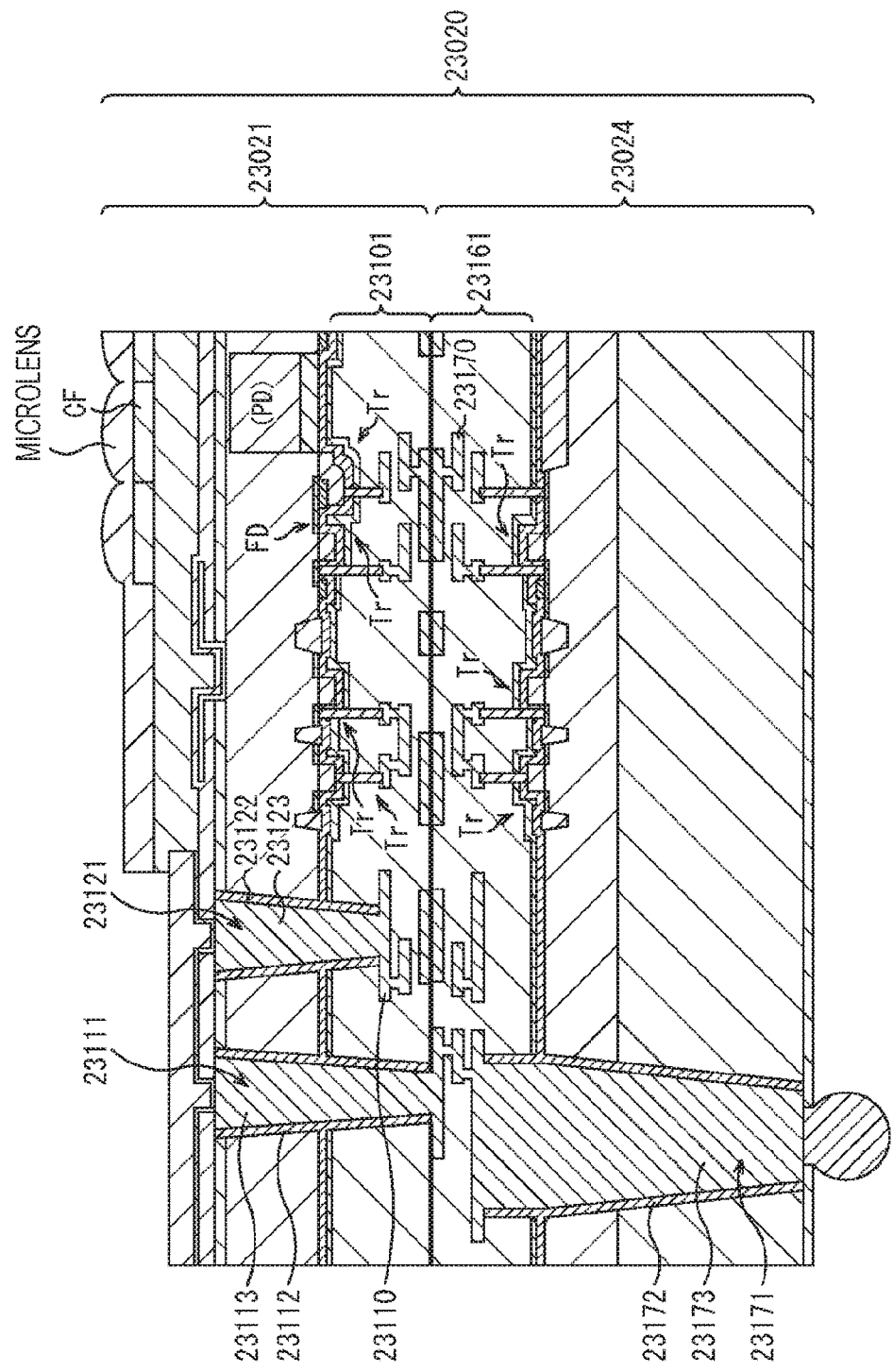
FIG. 37 is a cross-sectional diagram illustrating a third configuration example of a laminated solid-state imaging device 23020.

FIG. 37 is a cross-sectional diagram illustrating a third configuration example of a laminated solid-state imaging device 23020.

The solid-state imaging device 23020 in FIG. 37 is different from that in a case of FIG. 35 where the film 23191 such as a protection film is formed on a surface on which the sensor die 23021 is pasted to the logic die 23024, in that the film 23191 such as a protection film is not formed on a surface on which the sensor die 23021 is pasted to the logic die 23024.

The solid-state imaging device 23020 in FIG. 37 is constituted by superimposing the sensor die 23021 and the logic die 23024 so that the wiring 23110 directly contacts the wiring 23170, and applying heat while applying desired weight, to directly join the wirings 23110 and 23170.

Figure 38:
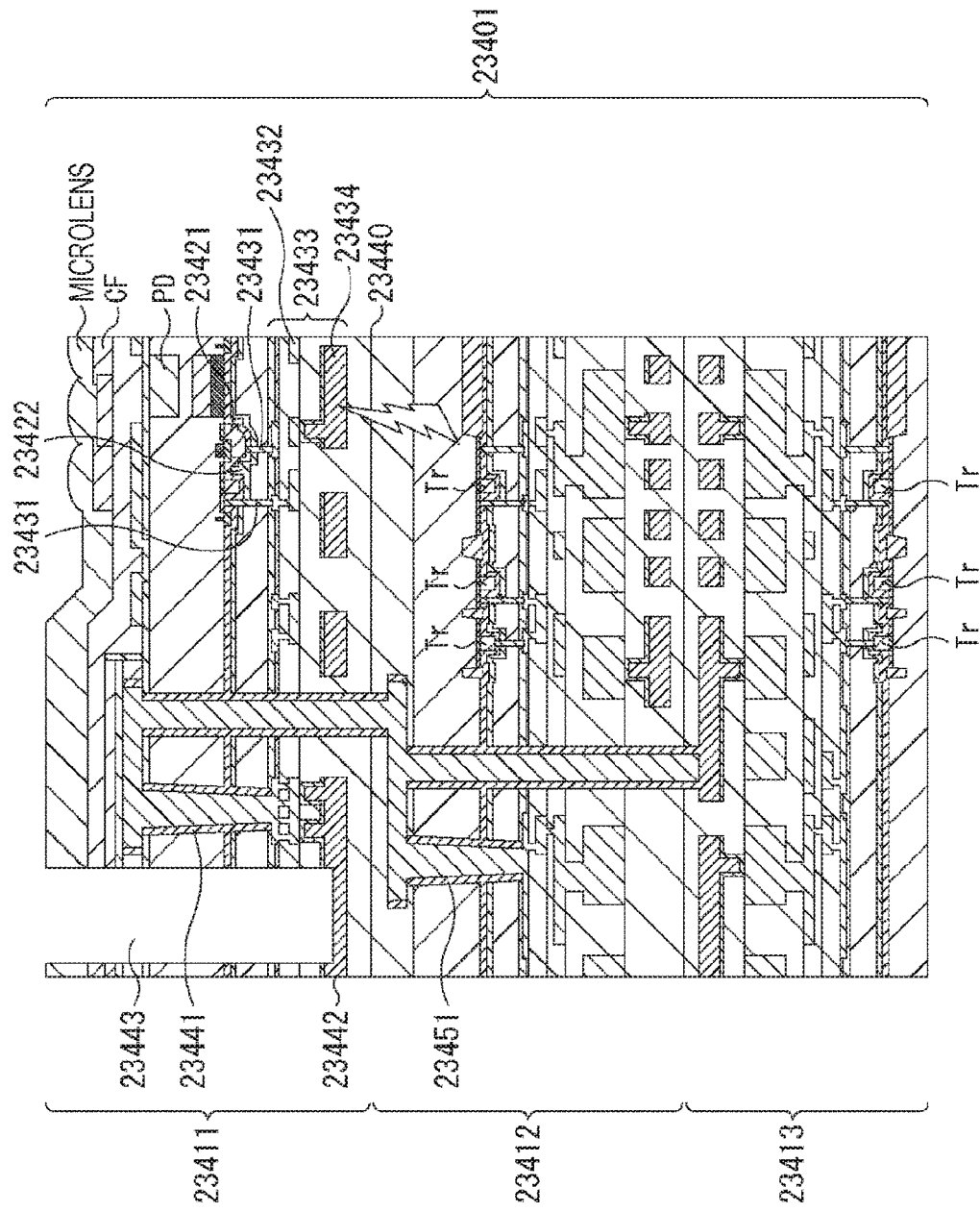
FIG. 38 is a cross-sectional diagram illustrating another configuration example of the laminated solid-state imaging device to which the technology according to the present disclosure can be applied.

FIG. 38 is a cross-sectional diagram illustrating another configuration example of the laminated solid-state imaging device to which the technology according to the present disclosure can be applied.

In FIG. 38, a solid-state imaging device 23401 has a three-layer structure in which three dies of a sensor die 23411, a logic die 23412 and a memory die 23413 are laminated.

The memory die 23413 includes, for example, a memory circuit which temporarily stores required data in signal processing to be performed at the logic die 23412.

While, in FIG. 38, the logic die 23412 and the memory die 23413 are laminated in this order under the sensor die 23411, the logic die 23412 and the memory die 23413 may be laminated in reverse order, that is, in order of the memory die 23413 and the logic die 23412, under the sensor die 23411.

Note that, in FIG. 38, at the sensor die 23411, a PD which becomes a photoelectric converting unit of pixels, and source/drain regions of the pixels Tr are formed.

A gate electrode is formed around the PD via a gate insulating film, and a pixel Tr 23421 and a pixel Tr 23422 are formed by the source/drain regions which are paired with the gate electrode.

The pixel Tr 23421 adjacent to the PD is a transfer Tr, and one of a pair of source/drain regions constituting the pixel Tr 23421 is an FD.

Further, at the sensor die 23411, an interlayer dielectric is formed, and a connection hole is formed at the interlayer dielectric. At the connection hole, a connection conductor 23431 to be connected to the pixel Tr 23421 and the pixel Tr 23422 is formed.

Further, at the sensor die 23411, a wiring layer 23433 having a wiring 23432 having a plurality of layers to be connected to respective connection conductors 23431 is formed.

Further, an aluminum pad 23434 which becomes an electrode for external connection is formed in the lowermost layer of the wiring layer 23433 of the sensor die 23411. That is, at the sensor die 23411, the aluminum pad 23434 is formed at a position closer to a joining surface 23440 to the logic die 23412 than to the wiring 23432. The aluminum pad 23434 is used as one end of a wiring relating to input and output of signals to and from outside.

Further, at the sensor die 23411, a contact 23441 to be used for electrical connection to the logic die 23412 is formed. The contact 23441 is connected to a contact 23451 of the logic die 23412, and is also connected to the aluminum pad 23442 of the sensor die 23411.

Then, a pad hole 23443 is formed at the sensor die 23411 so as to reach the aluminum pad 23442 from the backside (upper side) of the sensor die 23411.

The technology according to the present disclosure can be applied to the solid-state imaging device as described above.

<Application Example to In-Vivo Information Acquisition System>

A technology (present technology) according to an embodiment of the present disclosure can be applied to various products. For example, the technology according to an embodiment of the present disclosure may be applied to an endoscopic operation system.

Figure 39:
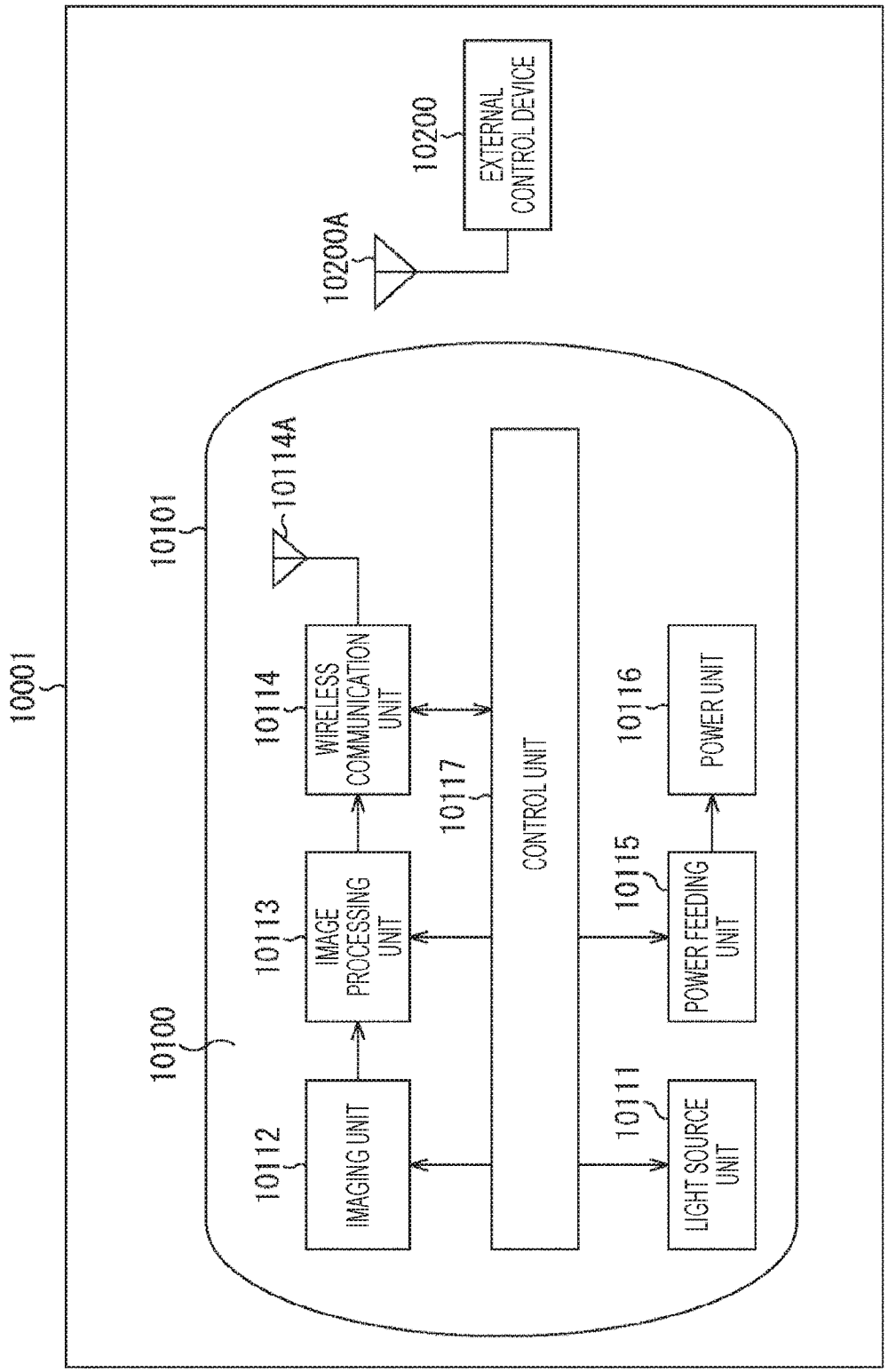
FIG. 39 is a block diagram depicting an example of schematic configuration of an in-vivo information acquisition system.

FIG. 39 is a block diagram illustrating an example of a schematic configuration of an in-vivo information acquisition system of a patient for which a capsular endoscope to which the technology (the present technology) according to an embodiment of the present technology is applicable.

An in-vivo information acquisition system 10001 includes a capsular endoscope 10100 and an external control device 10200.

The capsular endoscope 10100 is swallowed by a patient at the time of examination. The capsular endoscope 10100 has an imaging function and a wireless communication function. The capsular endoscope 10100 sequentially captures internal images (hereinafter also referred to as in-vivo images) of an organ such as a stomach or bowels at a predetermined interval and wirelessly transmit information regarding the in-vivo images in sequence to the external control device 10200 outside of the patient while moving inside the organ by peristaltic movement or the like until spontaneously excreted.

The external control device 10200 generally controls an operation of the in-vivo information acquisition system 10001. In addition, the external control device 10200 receives the information regarding the in-vivo images transmitted from the capsular endoscope 10100 and generates image data for displaying the in-vivo images on a display device (not illustrated) on the basis of the received information regarding the in-vivo image.

In the in-vivo information acquisition system 10001, an in-vivo image obtained by imaging an in-vivo form of a patient can be obtained at any time in this way until the capsular endoscope 10100 is swallowed and excreted.

Configurations and functions of the capsular endoscope 10100 and the external control device 10200 will be described in more detail.

The capsular endoscope 10100 includes a capsular casing 10101. The capsular casing 10101 accommodates a light source unit 10111, an imaging unit 10112, an image processing unit 10113, a wireless communication unit 10114, a power feeding unit 10115, a power unit 10116, and a control unit 10117.

The light source unit 10111 is configured of, for example, a light source such as light-emitting diode (LED) and radiates light for an imaging visual field of the imaging unit 10112.

The imaging unit 10112 includes an image sensor and an optical system that includes a plurality of lens installed on the front stage of the imaging element. Reflected light (hereinafter referred to observation light) of light emitted to a body tissue which is an observation target is condensed by the optical system to be incident on the imaging element. In the imaging unit 10112, the image sensor photoelectrically converts the observation light incident on the imaging element to generate an image signal corresponding to the observation light. The image signal generated by the imaging unit 10112 is supplied to the image processing unit 10113.

The image processing unit 10113 is configured of a processor such as a central processing unit (CPU) or a graphics processing unit (GPU) and performs various kinds of signal processing on the image signal generated by the imaging unit 10112. The image processing unit 10113 supplies the image signal subjected to the signal processing as RAW data to the wireless communication unit 10114.

The wireless communication unit 10114 performs a predetermined process such as a modulation process on the image signal subjected to the signal processing by the image processing unit 10113 and transmits the image signal to the external control device 10200 via an antenna 10114A. In addition, the wireless communication unit 10114 receives a control signal for driving control of the capsular endoscope 10100 from the external control device 10200 via the antenna 10114A. The wireless communication unit 10114 supplies the control signal received from the external control device 10200 to the control unit 10117.

The power feeding unit 10115 includes a power reception antenna coil, a power generation circuit that reproduces power from a current generated in the antenna coil, a voltage boosting circuit, or the like. The power feeding unit 10115 generates power using a so-called contactless charging principle.

The power unit 10116 is configured of a secondary cell and stores the power generated by the power feeding unit 10115. In FIG. 39, an arrow or the like indicating a supply source of power from the power unit 10116 is not illustrated to avoid complexity of the drawing. However, the power stored in the power unit 10116 is supplied to the light source unit 10111, the imaging unit 10112, the image processing unit 10113, the wireless communication unit 10114, and the control unit 10117, and thus can be used to drive these units.

The control unit 10117 is configured of a processor such as a CPU and appropriately controls driving of the light source unit 10111, the imaging unit 10112, the image processing unit 10113, the wireless communication unit 10114, and the power feeding unit 10115 in accordance with control signals transmitted from the external control device 10200.

The external control device 10200 is configured of a processor such as a CPU or a GPU, a microcomputer in which a processor and a storage element such as a memory are mixed, a control substrate, or the like. The external control device 10200 controls an operation of the capsular endoscope 10100 by transmitting a control signal to the control unit 10117 of the capsular endoscope 10100 via an antenna 10200A. In the capsular endoscope 10100, for example, a radiation condition of light for an observation target in the light source unit 10111 can be changed in accordance with a control signal from the external control device 10200. In addition, an imaging condition (for example, a frame rate or an exposure value in the imaging unit 10112, or the like) can be changed in accordance with a control signal from the external control device 10200. In addition, content of a process in the image processing unit 10113 or a condition (for example, a transmission interval or the number of transmitted images, or the like) in which an image signal is transmitted by the wireless communication unit 10114 may be changed in accordance with the control signal from the external control device 10200.

In addition, the external control device 10200 performs various kinds of image processing on the image signals transmitted from the capsular endoscope 10100 to generate image data for displaying the captured in-vivo images on the display device. As the image processing, for example, various kinds of signal processing such as a development process (demosaic processing), high-quality processing (a band enhancement process, superresolution processing, a noise reduction (NR) process, and/or a camera-shake correction process), and/or an expansion process (electronic zoom processing) can be performed. The external control device 10200 controls driving of the display device to display the captured in-vivo image on the basis of the generated image data. Alternatively, the external control device 10200 may cause a recording device (not illustrated) to record the generated image data or may cause a printing device (not illustrated) to print and output the generated image data.

An example of the in-vivo information acquisition system to which the technology according to the present disclosure may be applied has been described above. The technology according to the present disclosure may be applied to the imaging unit 10112 among the configurations described above.

<Application Example to Mobile Body>

A technology (present technology) according to an embodiment of the present disclosure can be applied to various products. For example, the technology according to the present disclosure may also be realized as a device mounted in a mobile body of any type such as automobile, electric vehicle, hybrid electric vehicle, motorcycle, bicycle, personal mobility, airplane, drone, ship, or robot.

Figure 40:
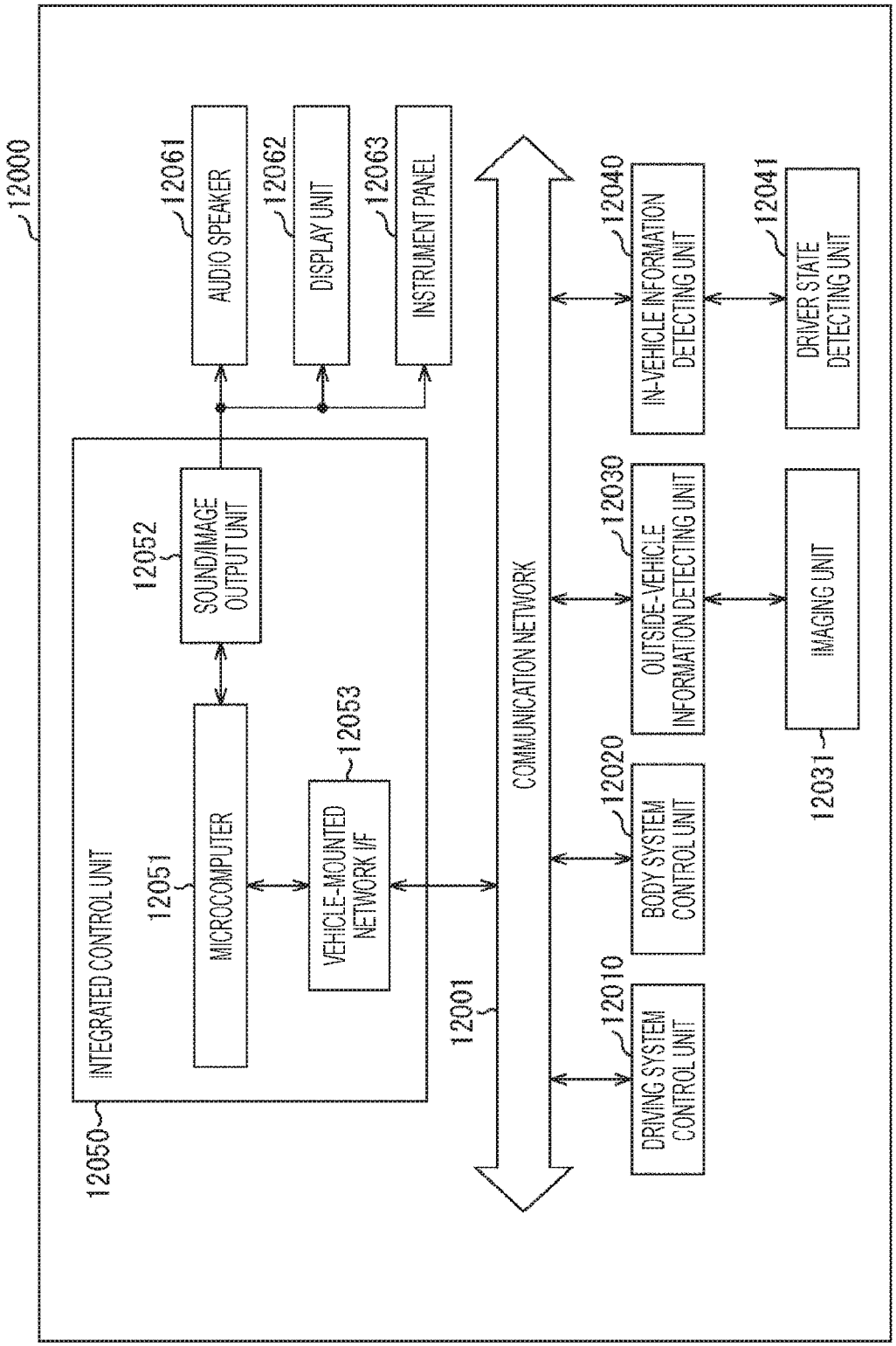
FIG. 40 is a block diagram depicting an example of schematic configuration of a vehicle control system.

FIG. 40 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 40, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output unit 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging unit 12031. The outside-vehicle information detecting unit 12030 makes the imaging unit 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. In addition, the light received by the imaging unit 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting unit 12041 that detects the state of a driver. The driver state detecting unit 12041, for example, includes a camera that images the driver. On the basis of detection information input from the driver state detecting unit 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the surroundings of the vehicle which is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which is obtained by the outside-vehicle information detecting unit 12030. For example, the microcomputer 12051 can perform cooperative control intended to prevent a glare by controlling the headlamp so as to change from a high beam to a low beam, or the like, in accordance with the position of a preceding vehicle or an oncoming vehicle detected by the outside-vehicle information detecting unit 12030.

The sound/image output unit 12052 transmits an output signal of at least one of a sound or an image to an output device capable of visually or auditorily notifying an occupant of the vehicle or the outside of the vehicle of information. In the example of FIG. 40, an audio speaker 12061, a display unit 12062, and an instrument panel 12063 are illustrated as the output device. The display unit 12062 may, for example, include at least one of an on-board display or a head-up display.

Figure 41:
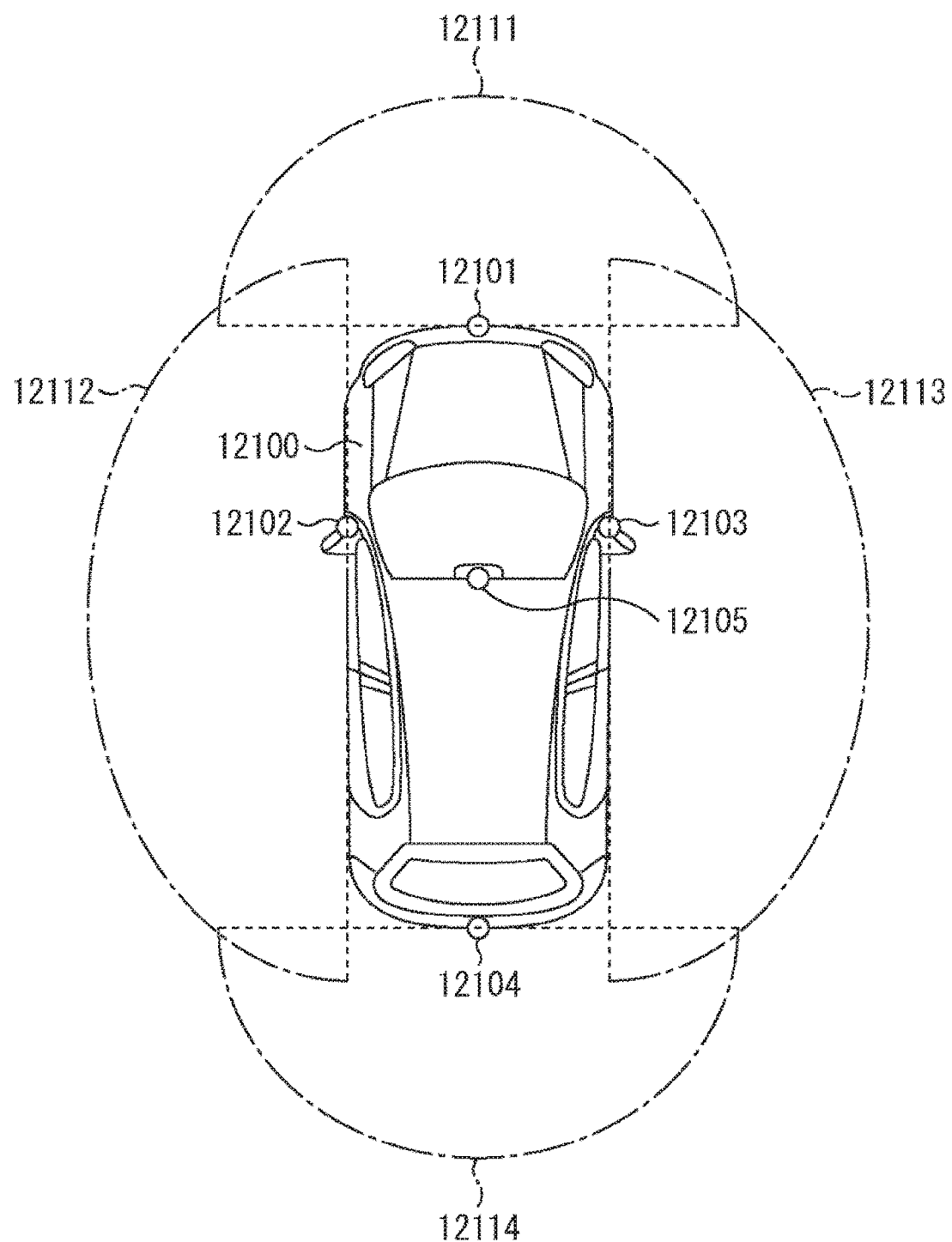
FIG. 41 is a diagram of assistance in explaining an example of installation positions of an outside-vehicle information detecting section and an imaging section.

FIG. 41 is a diagram depicting an example of the installation position of the imaging unit 12031.

In FIG. 41, the vehicle 12100 includes imaging units 12101, 12102, 12103, 12104, and 12105 as the imaging unit 12031.

The imaging units 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging unit 12101 provided to the front nose and the imaging unit 12105 provided to the upper portion of the windshield within the interior of the vehicle obtain mainly an image of the front of the vehicle 12100. The imaging units 12102 and 12103 provided to the sideview mirrors obtain mainly an image of the sides of the vehicle 12100. The imaging unit 12104 provided to the rear bumper or the back door obtains mainly an image of the rear of the vehicle 12100. The images of the front obtained by the imaging units 12101 and 12105 are used mainly to detect a preceding vehicle, a pedestrian, an obstacle, a signal, a traffic sign, a lane, or the like.

Incidentally, FIG. 41 depicts an example of imaging ranges of the imaging units 12101 to 12104. An imaging range 12111 represents the imaging range of the imaging unit 12101 provided to the front nose. Imaging ranges 12112 and 12113 respectively represent the imaging ranges of the imaging units 12102 and 12103 provided to the sideview mirrors. An imaging range 12114 represents the imaging range of the imaging unit 12104 provided to the rear bumper or the back door. A bird's-eye image of the vehicle 12100 as viewed from above is obtained by superimposing image data imaged by the imaging units 12101 to 12104, for example.

At least one of the imaging units 12101 to 12104 may have a function of obtaining distance information. For example, at least one of the imaging units 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in imaged images of the imaging units 12101 to 12104. Such recognition of a pedestrian is, for example, performed by a procedure of extracting characteristic points in the imaged images of the imaging units 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging units 12101 to 12104, and thus recognizes the pedestrian, the sound/image output unit 12052 controls the display unit 12062 so that a square contour line for emphasis is displayed so as to be superimposed on the recognized pedestrian. In addition, the sound/image output unit 12052 may also control the display unit 12062 so that an icon or the like representing the pedestrian is displayed at a desired position.

The above description describes an example of a vehicle control system to which the technology according to the present disclosure can be applied. The technology according to the present disclosure may be applied to the imaging unit 12031 or the like among the configurations described above.

Note that the embodiments of the present technology are not limited to the above-described embodiments, and various changes can be made within a scope not deviating from the gist of the present technology.

Additionally, the present technology may also be configured as below.

(1)

A solid-state imaging device including:

a photoelectric converting unit configured to perform photoelectric conversion; and a PN junction region including a P-type region and an N-type region on a side of a light incident surface of the photoelectric converting unit.

(2)

The solid-state imaging device according to (1), in which, on a vertical cross-section, the PN junction region is formed at three sides including a side of the light incident surface among four sides enclosing the photoelectric converting unit.

(3)

The solid-state imaging device according to (1), further including:

a trench that penetrates through a semiconductor substrate in a depth direction and is formed between the photoelectric converting units each formed at adjacent pixels, in which the PN junction region is also provided on a side wall of the trench.

(4)

The solid-state imaging device according to (3), in which the PN junction region formed on the side wall of the trench and the PN junction region formed on the side of the light incident surface of the photoelectric converting unit are made a continuous region.

(5)

The solid-state imaging device according to any one of (1) to (4), in which the photoelectric converting unit is an N-type region, and concentration of N-type impurities in the N-type region of the PN junction region is a same level or higher than concentration of N-type impurities of the photoelectric converting unit.

(6)

The solid-state imaging device according to any one of (1) to (5), in which an active region adjacent to the photoelectric converting unit is a P-type region, and concentration of P-type impurities in the P-type region of the PN junction region is higher than concentration of P-type impurities of the active region.

(7)

The solid-state imaging device according to any one of (1) to (6), in which concentration of N-type impurities of the N-type region is between 1e15 cm-3 and 1e17 cm-3.

(8)

The solid-state imaging device according to any one of (1) to (7), in which concentration of P-type impurities of the P-type region is between 1e16 cm-3 and 1e17 cm-3.

(9)

The solid-state imaging device according to any one of (1) to (8), in which a plurality of vertical transistor trenches is provided at a transfer transistor, and lengths of the plurality of vertical transistor trenches are different.

(10)

The solid-state imaging device according to (9), in which at least one vertical transistor trench among the plurality of vertical transistor trenches is in contact with the PN junction region.

(11)

The solid-state imaging device according to (9), in which at least one vertical transistor trench among the plurality of vertical transistor trenches is formed to a position deeper than equal to or greater than ½ of the photoelectric converting unit.

(12)

The solid-state imaging device according to any one of (1) to (11), in which the P-type region and the N-type region are solid-phase diffused layers.

(13)

The solid-state imaging device according to any one of (1) to (12), in which the PN junction region is formed so as to cover a backside of the photoelectric converting unit except part of the backside.

(14)

The solid-state imaging device according to any one of (1) to (12), in which the PN junction region is discontinuously formed on a backside of the photoelectric converting unit.

(15)

The solid-state imaging device according to any one of (1) to (14), in which the P-type region and the N-type region are regions formed by solid-phase diffusion being performed at a cavity formed using a silicon on nothing (SON) technology.

(16)

Electronic equipment on which a solid-state imaging device is mounted, in which the solid-state imaging device includes a photoelectric converting unit configured to perform photoelectric conversion, and a PN junction region including a P-type region and an N-type region on a side of a light incident surface of the photoelectric converting unit.

REFERENCE SIGNS LIST

10 Imaging device
12 Imaging element
41 Pixel array portion
50 Pixel
70 Si substrate
71 PD
72 P-type region
74 Light shielding film
76 OCL
77 Active region
75 Backside Si interface
78 STI
81 Vertical transistor trench
82 DTI
83 P-type solid-phase diffused layer
84 N-type solid-phase diffused layer
85 Side wall film
86 Filling material
101 Layer
121 P-type region
122 N-type region
131 MOS capacitor
151 Well contact portion
152 Contact
153 Cu wiring
211 N-type region
231 Separation prevention region
301 AL pad take-out portion
302 AL pad
303 Solid-phase diffused trench
311 Peripheral circuit portion
312 P+ diffused layer
313 Pwell region
314 Backside contact
315 Hole layer
321 Peripheral circuit portion
332 Pwell region
371 Peripheral circuit portion
372 Boundary portion
411 FD wiring
412 Conversion efficiency switching transistor
413 MOS capacitor

The invention claimed is:

1. A solid-state imaging device, comprising:
a photoelectric converting unit configured to perform photoelectric conversion;

a PN junction region including a first P-type region and a first N-type region, wherein the PN junction region is on a side of a light incident surface of the photoelectric converting unit; and a transfer transistor that includes a plurality of vertical transistor trenches, wherein a length of a first vertical transistor trench of the plurality of vertical transistor trenches is different from a length of a second vertical transistor trench of the plurality of vertical transistor trenches.

2. The solid-state imaging device according to claim 1, wherein, in a vertical cross-section, the PN junction region is at three sides including the side of the light incident surface among four sides enclosing the photoelectric converting unit.

3. The solid-state imaging device according to claim 1, further comprising a trench that penetrates through a semiconductor substrate in a depth direction, wherein the trench is between photoelectric converting units of adjacent pixels, and the PN junction region is on a side wall of the trench.

4. The solid-state imaging device according to claim 3, wherein the PN junction region on the side wall of the trench and the PN junction region on the side of the light incident surface of the photoelectric converting unit form a continuous region.

5. The solid-state imaging device according to claim 1, wherein the photoelectric converting unit comprises a second N-type region, and concentration of N-type impurities in the first N-type region of the PN junction region is a same level or higher than concentration of N-type impurities of the photoelectric converting unit.

6. The solid-state imaging device according to claim 1, further comprising an active region adjacent to the photoelectric converting unit, wherein the active region comprises a second P-type region, and concentration of P-type impurities in the first P-type region of the PN junction region is higher than concentration of P-type impurities of the active region.

7. The solid-state imaging device according to claim 1, wherein concentration of N-type impurities of the first N-type region is between 1e15 cm-3 and 1e17 cm-3.

8. The solid-state imaging device according to claim 1, wherein concentration of P-type impurities of the first P-type region is between 1 el 6 cm-3 and 1e17 cm-3.

9. The solid-state imaging device according to claim 1, wherein at least one vertical transistor trench among the plurality of vertical transistor trenches is in contact with the PN junction region.

10. The solid-state imaging device according to claim 1, wherein at least one vertical transistor trench among the plurality of vertical transistor trenches is deeper than equal to or greater than ½ of the photoelectric converting unit.

11. The solid-state imaging device according to claim 1, wherein the first P-type region and the first N-type region comprise solid-phase diffused layers.

12. The solid-state imaging device according to claim 1, wherein the PN junction region covers a backside of the photoelectric converting unit except a part of the backside.

13. The solid-state imaging device according to claim 1, wherein the PN junction region is a discontinuous region on a backside of the photoelectric converting unit.

14. The solid-state imaging device according to claim 1, wherein the first P-type region and the first N-type region are regions of solid-phase diffusion at a cavity formed using a silicon on nothing (SON) technology.

15. Electronic equipment comprising:

a solid-state imaging device, wherein the solid-state imaging device includes:

a photoelectric converting unit configured to perform photoelectric conversion;

a PN junction region including a P-type region and an N-type region, wherein the PN junction region is on a side of a light incident surface of the photoelectric converting unit; and a transfer transistor that includes a plurality of vertical transistor trenches, wherein a length of a first vertical transistor trench of the plurality of vertical transistor trenches is different from a length of a second vertical transistor trench of the plurality of vertical transistor trenches.

\* \* \* \* \*